United States Patent
Masunaga et al.

(10) Patent No.: US 8,546,060 B2
(45) Date of Patent: Oct. 1, 2013

(54) CHEMICALLY AMPLIFIED POSITIVE RESIST COMPOSITION AND PATTERN FORMING PROCESS

(75) Inventors: Keiichi Masunaga, Joetsu (JP); Satoshi Watanabe, Joetsu (JP); Akinobu Tanaka, Joetsu (JP); Daisuke Domon, Joetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 217 days.

(21) Appl. No.: 13/027,362

(22) Filed: Feb. 15, 2011

(65) Prior Publication Data

US 2011/0200919 A1    Aug. 18, 2011

(30) Foreign Application Priority Data

Feb. 16, 2010 (JP) ................. 2010-031034

(51) Int. Cl.
G03F 7/039 (2006.01)
G03F 7/20 (2006.01)
G03F 7/30 (2006.01)

(52) U.S. Cl.
USPC ........ 430/270.1; 430/311; 430/326; 430/905; 430/910; 430/921; 430/942

(58) Field of Classification Search
None
See application file for complete search history.

(56) References Cited

U.S. PATENT DOCUMENTS

| | | |
|---|---|---|
| 5,945,250 A | 8/1999 | Aoai et al. |
| 6,284,863 B1 | 9/2001 | Ohta et al. |
| 7,569,326 B2 | 8/2009 | Ohsawa et al. |
| 2004/0260031 A1 | 12/2004 | Takeda et al. |
| 2008/0096128 A1 | 4/2008 | Takeda et al. |
| 2009/0087789 A1 | 4/2009 | Hirano et al. |
| 2009/0269696 A1* | 10/2009 | Ohsawa et al. ............ 430/270.1 |

FOREIGN PATENT DOCUMENTS

| | | |
|---|---|---|
| EP | 2 042 925 A2 | 4/2009 |
| EP | 2 042 925 A3 | 6/2009 |
| EP | 2112554 A2 | 10/2009 |
| JP | 9-106073 * | 4/1997 |
| JP | 9-325497 A | 12/1997 |
| JP | 2004-115630 A | 4/2004 |
| JP | 2005-8766 A | 1/2005 |
| JP | 2007-197718 A | 8/2007 |
| JP | 2008-102383 A | 5/2008 |
| JP | 2008-133312 A | 6/2008 |
| JP | 2008-133448 A | 6/2008 |
| JP | 2009-86310 A | 4/2009 |

OTHER PUBLICATIONS

Derwent English abstract for JP 9-106073 (1997).*
Machine-assisted English translation for JP 9-106073, provided by JPO (1997).*
Extended Search Report for European Application No. 11001081.6 mailed Jul. 6, 2011.

* cited by examiner

Primary Examiner — Sin J. Lee
(74) Attorney, Agent, or Firm — Birch, Stewart, Kolasch & Birch, LLP

(57) ABSTRACT

A chemically amplified positive resist composition is provided comprising a polymer PB having an amine structure bound thereto and a polymer PA comprising recurring units having an acidic side chain protected with an acid labile protective group and recurring units having an acid generating moiety on a side chain.

5 Claims, No Drawings

US 8,546,060 B2

CHEMICALLY AMPLIFIED POSITIVE RESIST COMPOSITION AND PATTERN FORMING PROCESS

CROSS-REFERENCE TO RELATED APPLICATION

This non-provisional application claims priority under 35 U.S.C. §119(a) on Patent Application No. 2010-031034 filed in Japan on Feb. 16, 2010, the entire contents of which are hereby incorporated by reference.

TECHNICAL FIELD

This invention relates to a chemically amplified positive resist composition and a pattern forming process. The chemically amplified positive resist composition is sensitive to high-energy radiation such as UV, deep-UV, EUV, X-ray, γ-ray, synchrotron radiation, and electron beam (EB), and especially suited for use in the exposure step of irradiating high-energy radiation, typically EB, EUV or deep-UV, and adapted for microfabrication of semiconductor devices and photomasks.

BACKGROUND ART

To meet the recent demand for higher integration in integrated circuits, pattern formation to a finer feature size is required. Acid-catalyzed chemically amplified resist compositions are most often used in forming resist patterns with a feature size of 0.2 µm or less. High-energy radiation such as UV, deep UV or electron beam (EB) is used as the light source for exposure of these resist compositions. In particular, while EB lithography is utilized as the ultra-fine microfabrication technique, it is also indispensable in processing a photomask blank to form a photomask for use in semiconductor device fabrication.

In general, the EB lithography is by writing an image with EB, without using a mask. In the case of positive resist, those regions of a resist film other than the regions to be retained are successively irradiated with EB having a minute area. The operation of successively scanning all finely divided regions on the work surface takes a long time as compared with full wafer exposure through a photomask. In order to avoid any decline of throughput, the resist film must be highly sensitive. Because of the long image-writing time, there is a likelihood of a difference arising between the initially written portion and the later written portion. Thus the stability with time of exposed regions in vacuum is one of important performance requirements. One of the important applications of chemically amplified resist material resides in processing of mask blanks. Some mask blanks have a surface material that can have an impact on the pattern profile of the overlying chemically amplified resist film, such as a layer of a chromium compound, typically chromium oxide deposited on a photomask substrate. For high resolution and profile retention after etching, it is one important performance factor to maintain the pattern profile of resist film rectangular independent of the type of substrate.

The control of resist sensitivity and pattern profile as mentioned above has been improved by a proper selection and combination of resist material-constituting components and processing conditions. One outstanding problem is the diffusion of acid that largely affects the resolution of a chemically amplified resist film. In processing of photomasks, it is required that the profile of a resist pattern formed as above do not change with a lapse of time from the end of exposure to post-exposure baking. The major cause of such a change with time is diffusion of an acid generated upon exposure. The problem of acid diffusion has been widely studied not only in the field of photomask processing, but also in the field of general resist films because it has a significant impact on sensitivity and resolution.

In particular, JP-A H09-325497 discloses that a sulfonic acid to be generated upon exposure is incorporated into a resin for use in resist material for inhibiting acid diffusion. This control method is attractive since it relies on a mechanism different from the control method using a base. Various improvements have been made on this method to comply with the demand of forming finer size patterns. JP-A 2008-133448 is a useful example of achieving an improvement in acid strength.

Another important material for inhibiting acid diffusion is a basic compound. Many modifications of the basic compound have been reported. For example, in conjunction with the resist composition for use in the ArF immersion lithography involving exposure of a resist film to ArF excimer laser light in a setup that a water layer is formed on the resist film, JP-A 2008-133312 proposes to use a polymer having a basic compound bound thereto in order to prevent the basic compound from migrating and diffusing into the water phase in contact with the resist film to alter the resolution of the resist surface region.

As an exemplary polymer endowed with a nitrogen-containing partial structure, a resist composition using a heterocycle-bearing polymer is disclosed in JP-A 2009-86310 although this is not for the purpose of restraining acid diffusion.

CITATION LIST

Patent Document 1: JP-A H09-325497
Patent Document 2: JP-A 2008-133448 (U.S. Pat. No. 7,569,326)
Patent Document 3: JP-A 2008-133312
Patent Document 4: JP-A 2009-86310 (US 2009087789, EP 2042925)
Patent Document 5: JP-A 2008-102383 (US 2008096128)
Patent Document 6: JP-A 2004-115630
Patent Document 7: JP-A 2005-008766 (US 2004260031)

DISCLOSURE OF INVENTION

Since the development of the chemically amplified positive resist technology, the control of resist sensitivity and pattern profile has been improved not only by modifying polymers and acid generators as mentioned above, but also by properly selecting and combining resist components and process conditions. For example, early approaches toward the problems of standing waves and line edge roughness (LER) include controlling the solvent remaining in a resist film after coating for rather increasing the distance of acid diffusion and controlling the temperature of post-exposure bake. Since acid diffusion can cause a decline of resolution against the goal of attaining a higher resolution, the approach of adjusting process conditions is applicable in a limited range. In particular, because the tasks of reducing LER and a variation of line width with changing temperature as required in photomask processing are in a tradeoff relationship with the pursuit of a high resolution, highlight is drawn on the technology of controlling acid diffusion as mentioned above. None of the approaches have fully solved the problems.

An object of the invention is to provide a chemically amplified positive resist composition featuring a high resolution, reduced LER, and a minimized variation of line width with changing temperature, and a patterning process using the same.

Based on the knowledge that even when a means for controlling acid diffusion is taken, a basic compound must be added as described in Patent Document 2, the inventors attempted to control the diffusion of the basic compound at the same time. The inventors have found that when a basic polymer comprising recurring units having the general formulae (1) and (2) is used in a chemically amplified positive resist composition, it contributes to reductions of LER and temperature dependence as well as an improvement in resolution.

In one aspect, the invention provides a chemically amplified positive resist composition comprising a polymer PB and a polymer PA. The polymer PB comprises recurring units of the general formulae (1) and (2):

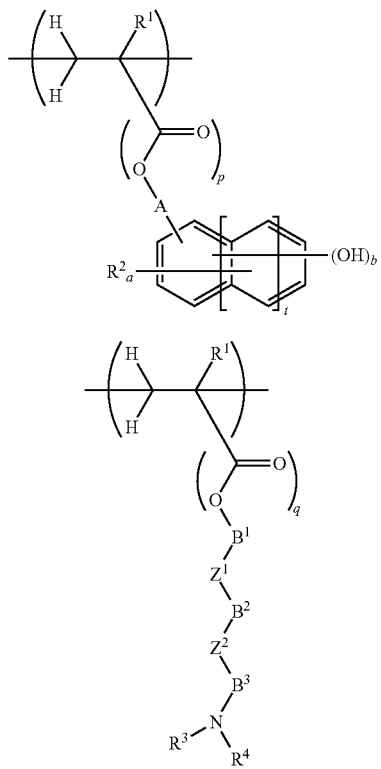

wherein A is a single bond or a $C_1$-$C_{10}$ alkylene group which may be separated by an ethereal oxygen atom; $R^1$ is each independently hydrogen or methyl; $R^2$ is each independently a $C_1$-$C_6$ alkyl group; $B^1$, $B^2$, and $B^3$ are each independently a single bond, or a linkage selected from the group consisting of a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing; $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—; $R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring; $B^3$ may bond with $R^3$ or $R^4$ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring; a is an integer of 0 to 4, b is a positive integer of 1 to 5, p and q are each independently 0 or 1, t is an integer of 0 to 2, with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group.

The polymer PA comprises recurring units having an acidic side chain protected with an acid labile protective group and recurring units of the general formula (3):

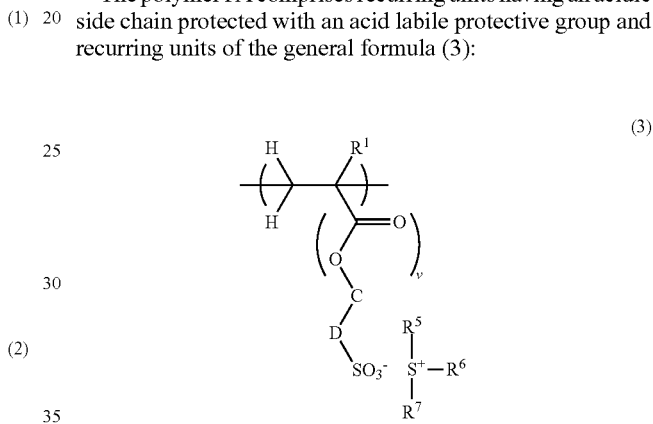

wherein C is a single bond or a substituted or unsubstituted $C_6$-$C_{18}$ arylene group; D is a single bond or a divalent $C_1$-$C_{15}$ hydrocarbon group in which some or all hydrogen atoms may be substituted by fluorine atoms or any methylene moiety may be substituted by an ethereal oxygen atom or carbonyloxy radical; $R^1$ is as defined above; $R^5$, $R^6$ and $R^7$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, any two of $R^5$, $R^6$ and $R^7$ may bond together to form a ring with the sulfur atom; and v is 0 or 1, with the proviso that when v=0, C and D are not single bonds at the same time.

In a preferred embodiment, the polymer PB further comprises units having the general formula (4):

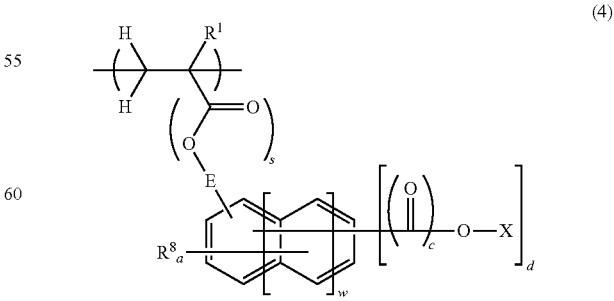

wherein E is a single bond or a $C_1$-$C_{10}$ alkylene group which may contain an ethereal oxygen atom, $R^1$ is hydrogen or methyl, $R^8$ is each independently a $C_1$-$C_6$ alkyl group, X is an acid labile group when d is 1, and X is hydrogen or an acid labile group when d is 2 or 3, with at least one X being an acid labile group, a is an integer of 0 to 4, c is 0 or 1, d is an integer of 1 to 3, s is 0 or 1, and w is an integer of 0 to 2.

In a preferred embodiment, the polymer PB further comprises units of at least one type selected from the general formulae (5) and (6):

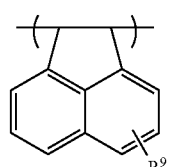

(5)

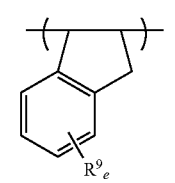

(6)

wherein e is an integer of 0 to 4, and $R^9$ is each independently a hydroxyl group, a hydroxyl group protected with an acid labile group, halogen atom, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group.

In another aspect, the invention provides a pattern forming process comprising the steps of applying the positive resist composition defined above onto a processable substrate to form a resist film, exposing the film patternwise to high-energy radiation, and developing the exposed film with an alkaline developer to form a resist pattern.

In a preferred embodiment, the high-energy radiation is EUV or electron beam (EB). The invention is effective particularly when the processable substrate comprises a chromium compound at the outermost surface because the processable substrate having a chromium compound surface layer makes it difficult to control the profile of a resist pattern formed thereon. In a preferred embodiment, the processable substrate is a photomask blank. EB exposure is preferably used in the processing of a photomask blank.

Advantageous Effects of Invention

When a chemically amplified positive resist composition comprising a basic polymer defined herein is used in a lithography process of forming a resist pattern which is required to have a ultrafine size, the distribution of the base in the resist film is more uniform and the diffusion thereof is controlled. The resist composition is expected to exhibit a high resolution and improved LER and be less temperature dependent.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The terminology "($C_x$-$C_y$)", as applied to a particular unit, such as, for example, a chemical compound or a chemical substituent group, means having a carbon atom content of from "x" carbon atoms to "y" carbon atoms per such unit.

The acronym EB stands for electron beam, LER for line edge roughness, PEB for post-exposure bake, and PAG for photoacid generator.

Briefly stated, a positive resist composition according to one embodiment of the invention comprises a polymer component which contains a polymer PB having an amine structure bound thereto for controlling the diffusion of a basic compound to be added to the composition and a polymer PA having a sulfonic acid sulfonium salt structure bound thereto for controlling the diffusion of an acid generated upon exposure to high-energy radiation.

Polymer PB

The polymer PB comprises units having polarity in the molecule for imparting adhesion to the polymer and units having basicity, that is, recurring units having the general formulae (1) and (2).

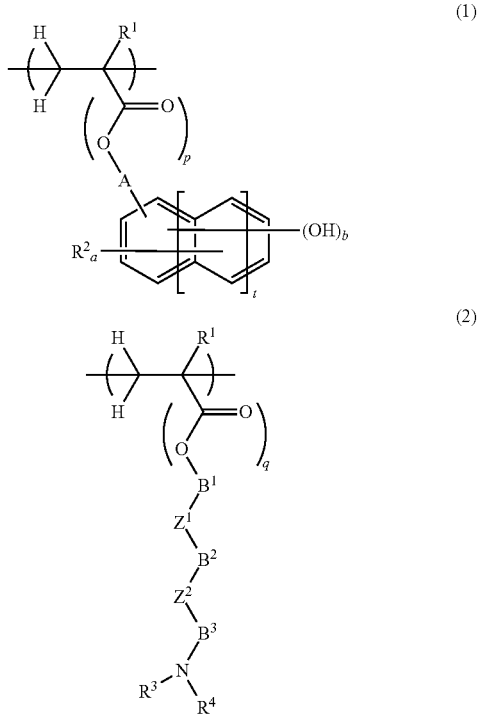

Herein A is a single bond or a $C_1$-$C_{10}$ alkylene group which may be separated by an ethereal oxygen atom. $R^1$ is each independently hydrogen or methyl. $R^2$ is each independently a $C_1$-$C_6$ alkyl group. $B^1$, $B^2$, and $B^3$ are each independently a single bond, or a linkage selected from among a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing. $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—. $R^3$ and $R^4$ are each independently hydrogen or a monovalent $C_1$-$C_{10}$ hydrocarbon group which may contain a heteroatom, with the proviso that R³ and R⁴ are not hydrogen at the same time. R³ and R⁴ may bond together to form a ring with the nitrogen atom to which they are attached, and R³ and R⁴ are a divalent $C_2$-$C_{12}$ hydrocarbon group which may contain a heteroatom when they form a ring. B³ may bond with R³ or R⁴ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring. The subscript "a" is an integer of 0 to 4, "b" is a positive integer of 1 to 5, p and q are each independently 0 or 1, t is an integer of 0 to 2, with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group. Understandably, the phrase that an alkylene group may be separated by an ethereal oxygen atom, for example, means that an ethereal oxygen atom may intervene at any intermediate position of the alkylene chain.

The recurring units of formula (1) contribute to etch resistance and adhesion to a substrate. These recurring units are already found in many resist compositions for the KrF excimer laser lithography and EB lithography including the patent documents cited above.

In formula (1), A is a single bond or a $C_1$-$C_{10}$ alkylene group which may be separated by an ethereal oxygen atom (or ether bond). Preferred examples of the alkylene group include methylene, ethylene, propylene, butylene, pentylene, hexylene, and structural isomers of a carbon skeleton having branched or cyclic structure. For the alkylene group containing an ethereal oxygen atom, where p in formula (1) is 1, the ethereal oxygen atom may be incorporated at any position excluding the position between the α- and β-carbons relative to the ester oxygen. Where p is 0, the atom in A that bonds with the main chain becomes an ethereal oxygen atom, and a second ethereal oxygen atom may be incorporated at any position excluding the position between the α- and β-carbons relative to that ethereal oxygen atom. Alkylene groups having more than 10 carbon atoms are undesirable because of a low solubility in alkaline developer.

$R^2$ is each independently a $C_1$-$C_6$ alkyl group. Preferred examples of the alkyl group include methyl, ethyl, propyl, isopropyl, butyl, pentyl, hexyl, and structural isomers of a carbon skeleton having branched or cyclic structure. Alkyl groups having more than 6 carbon atoms are undesirable because of a low solubility in alkaline developer.

The subscript "a" is an integer of 0 to 4, and "b" is a positive integer of 1 to 5. Preferably, a is an integer of 0 to 3 and b is an integer of 1 to 3 when t is 0. Also preferably, a is an integer of 0 to 4 and b is an integer of 1 to 5 when t is 1 or 2. The subscript t is an integer of 0 to 2. The structure represents a benzene skeleton when t=0, a naphthalene skeleton when t=1, and an anthracene skeleton when t=2.

Of the recurring units of formula (1), those recurring units wherein p is 0 and A is a single bond (meaning that the aromatic ring is directly bonded to the main chain of the polymer), that is, linker-free recurring units are units derived from monomers in which an α-substituted or unsubstituted vinyl group is attached to a hydroxyl-substituted aromatic ring, as typified by hydroxystyrene units. Preferred examples include 3-hydroxystyrene, 4-hydroxystyrene, 5-hydroxy-2-vinylnaphthalene, and 6-hydroxy-2-vinylnaphthalene.

Those recurring units wherein p is 1, that is, recurring units having an ester structure as the linker are units of carbonyl-substituted vinyl monomers as typified by (meth)acrylates.

Preferred examples of the units of formula (1) having a linker (—CO—O-A-) derived from (meth)acrylates are shown below.

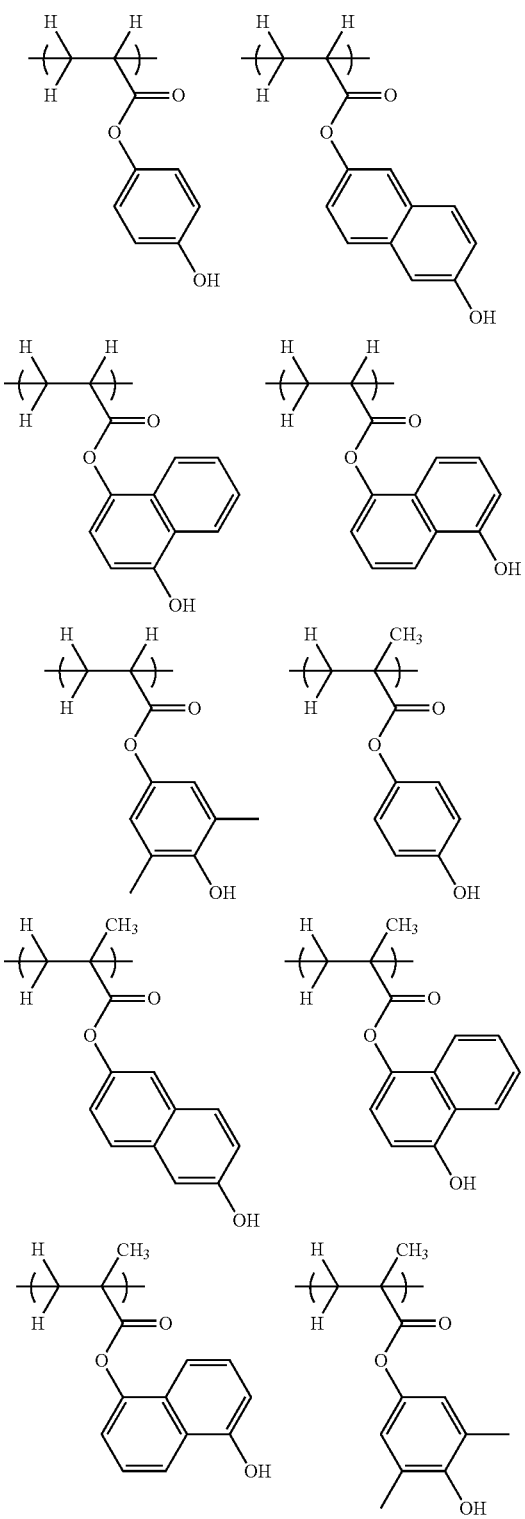

-continued

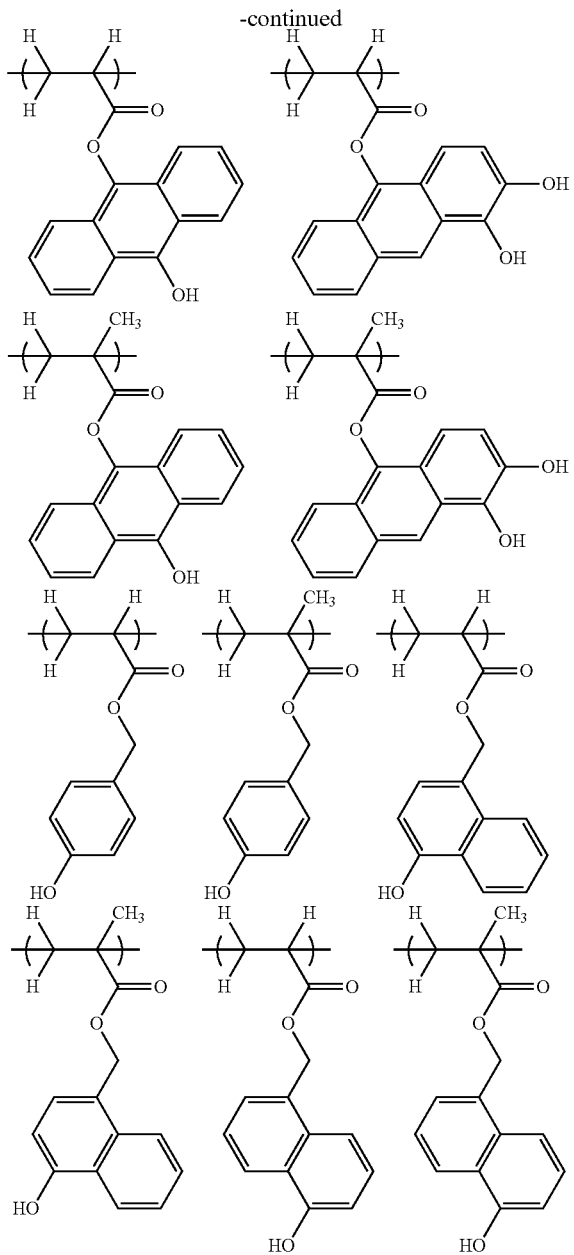

The recurring units of formula (2) are recurring units having a side chain containing a secondary amino group having two different carbons bonded thereto or a tertiary amino group having three different carbons bonded thereto as the basic active site. Now that $B^3$ is not a single bond when $Z^2$ is —O—CO—, the nitrogen atom represented by N in formula (2) does not become amidic nitrogen, and it has a strong proton-capture ability unlike nitrogen contained in pyridine or pyrrole ring. Whether or not the side chain of the recurring unit of formula (2) has an ester structure, the group represented by $B^1$, $B^2$ or $B^3$ in formula (2) contains as a partial structure a linkage having at least two single bonds (capable of free rotation) originating from an alkylene group of at least 2 carbon atoms or aromatic group, and therefore, the nitrogen atom has a sufficient thermal motion ability to capture a proton. Particularly when the side chain has an ester structure, or when the group represented by $B^1$, $B^2$ or $B^3$ in formula (2) contains as a partial structure at least 2 consecutive carbon atoms originating from an alkylene group, the nitrogen atom represented by N in formula (2) has a high thermal motion ability and hence, an advantageous acid capture ability. That is, the nitrogen atom represented by N in formula (2) has a sufficient thermal motion ability and an advantageous acid capture ability.

It is noted that Patent Document 4 describes a polymer possessing a heterocycle having a nitrogen atom originating from a pyrrole or pyridine ring or a nitrogen atom with a low degree of freedom at a relative position to the main chain. A basic compound is separately added to the resist composition according to Patent Document 4. The data in Examples do not demonstrate the tendency that a nitrogen-containing polymer has a lower sensitivity than a nitrogen-free polymer. It is understood that the nitrogen in the polymer described in Patent Document 4 has a low proton capture ability and serves a different function from the recurring units of formula (2) according to the invention.

In formula (2), $B^1$, $B^2$, and $B^3$ are each independently a single bond, or a linkage selected from among a $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising one or more of the foregoing. $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—.

Preferred examples of the alkylene group represented by $B^1$, $B^2$ and $B^3$ include methylene, ethylene, propylene, butylene, pentylene, hexylene, and structural isomers thereof having branched structure. The alkylene group may contain an ethereal oxygen atom at an intermediate, and preferred examples thereof include, when expressed from the ester oxygen side, ethyleneoxymethylene, ethyleneoxyethylene, ethyleneoxy-1,2-propylene, ethyleneoxy-1,3-propylene, 1,2-propyleneoxymethylene, 1,2-propyleneoxyethylene, 1,2-propyleneoxy-1,2-propylene, 1,2-propyleneoxy-1,3-propylene, 1,3-propyleneoxymethylene, 1,3-propyleneoxyethylene, 1,3-propyleneoxy-1,2-propylene, and 1,3-propyleneoxy-1,3-propylene. Preferred examples of the alicyclic group include 1,3-cyclopentylene, 1,4-cyclohexylene, 2,3-norbornylene, 2,5-norbornylene, 2,6-norbornylene, and 1,3-adamantylene. Preferred examples of the aromatic group include 1,3-phenylene, 1,4-phenylene, 1,4-naphthylene, 1,5-naphthylene, and 2,6-naphthylene.

$B^1$, $B^2$ and $B^3$ may be selected from the foregoing groups, alone or in combination of two or more such that the number of carbon atoms does not exceed 14, preferably 10. A carbon count in excess of 14 is undesirable because of a low solubility in alkaline developer.

In formula (2), q is 0 or 1. In case of q=0, the atom in $B^1$ that bonds with a main chain carbon is an ethereal oxygen atom or a carbon atom forming an aromatic ring. Then, upon polymerization, a monomer from which recurring units (2) are derived is readily copolymerizable with a monomer from which other recurring units are derived. In case of q=1, the units of formula (2) are recurring units derived from (meth) acrylate. Where q=0 and $Z^1$ and $Z^2$ are single bonds, one or more of $B^1$, $B^2$, and $B^3$ should contain at least two consecutive carbon atoms originating from an alkylene group, or an aromatic group.

$R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time. Alternatively, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring. Suitable hydrocarbon groups include methyl, ethyl, propyl, isopropyl, butyl and isobutyl. Suitable hydrocarbon groups containing an ether bond include 2-methoxyethyl, 2-ethoxyethyl, 2-propoxyethyl, 2-isopropoxyethyl, 2-methoxypropyl, 2-ethoxypropyl, 2-propoxypropyl, 2-isopropoxypropyl, 3-methoxypropyl, 3-ethoxypropyl, and 3-propoxypropyl. When $R^3$ and $R^4$ taken together form a ring, a 5 or 6-membered ring is preferred. Suitable heteroatoms include oxygen, nitrogen and sulfur, with oxygen being preferred.

$B^3$ may bond with $R^3$ or $R^4$ to form a ring with the nitrogen atom to which they are attached. In this case, the nitrogen-containing ring is a 5 to 7-membered ring, preferably 5 or 6-membered ring. Where $B^3$ bonds with $R^3$ or $R^4$ to form a ring with the nitrogen atom to which they are attached, the nitrogen-containing ring is not a ring of the structure that a lone pair of the nitrogen atom represented by N in formula (2) renders the nitrogen-containing ring aromatic, and the nitrogen-containing ring is not an aromatic ring. Exemplary rings of the structure to be excluded herein are pyrrole and pyridine rings.

Preferred examples of the recurring units derived from (meth)acrylates, that is, recurring units of formula (2) wherein q is 1, $B^1$ and $B^2$ are single bonds, $Z^2$ and $Z^2$ are single bonds, and $B^3$ is alkylene are given below. Note that $R^1$ is as defined above, and Me stands for methyl.

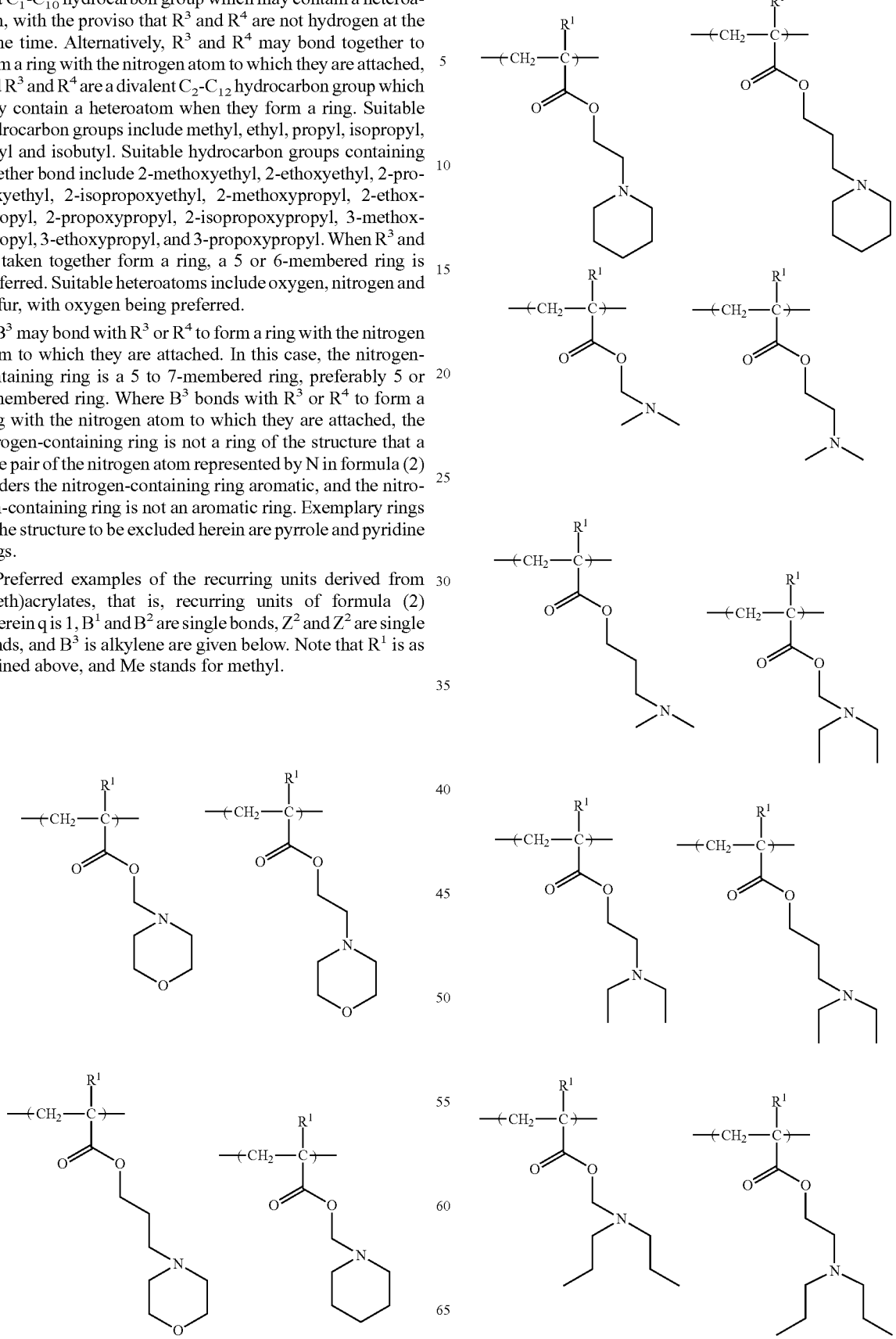

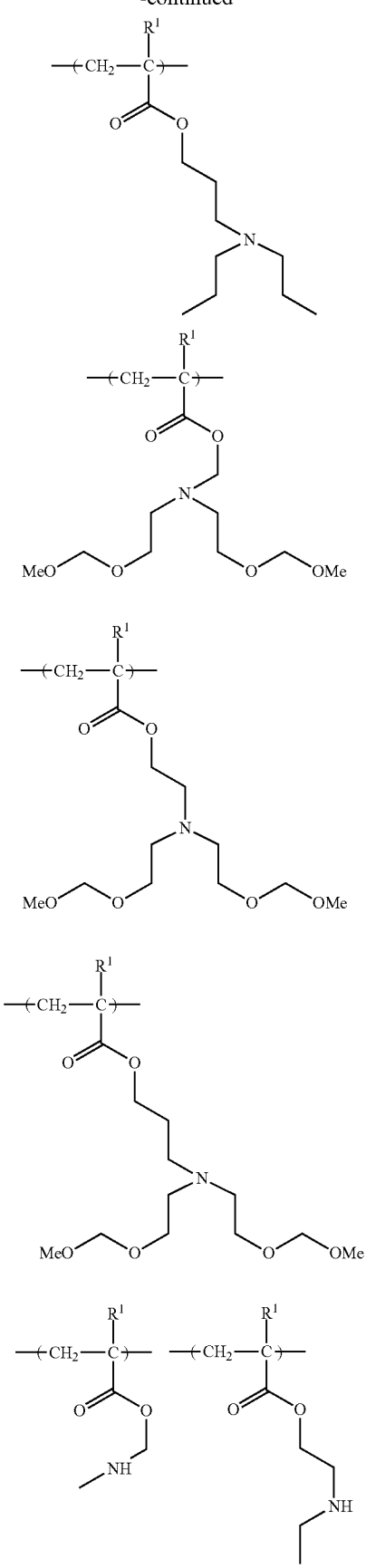
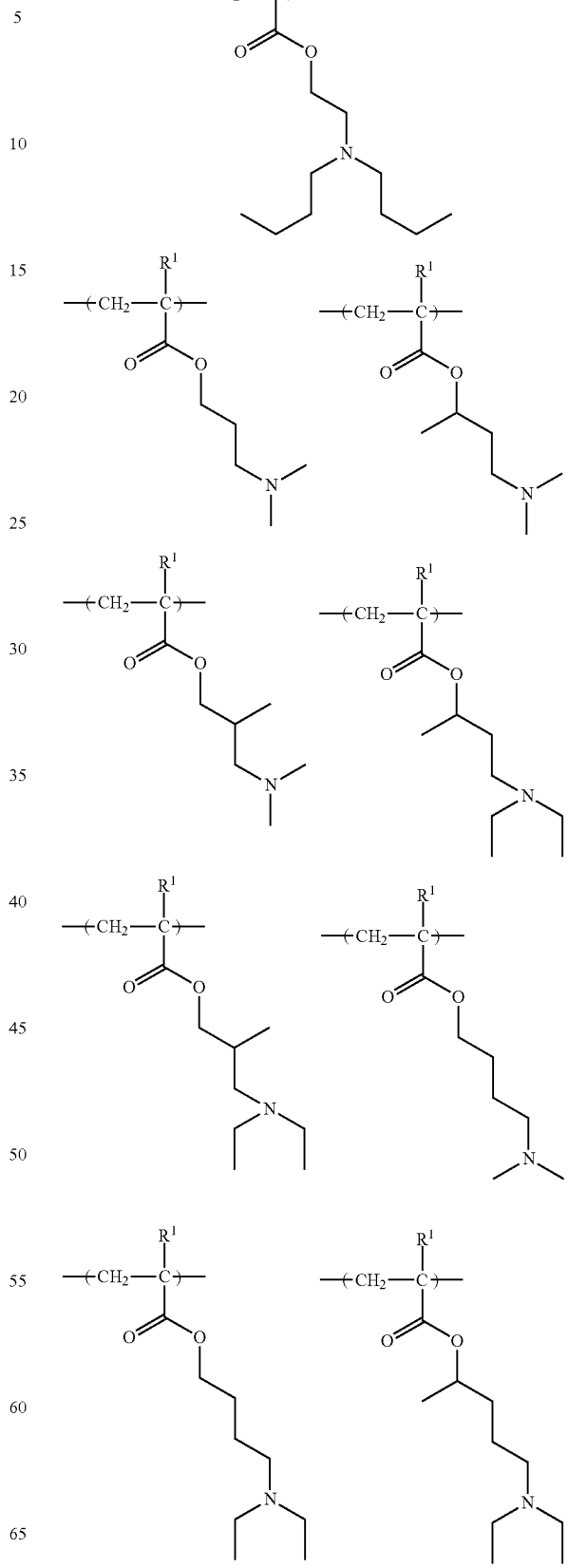

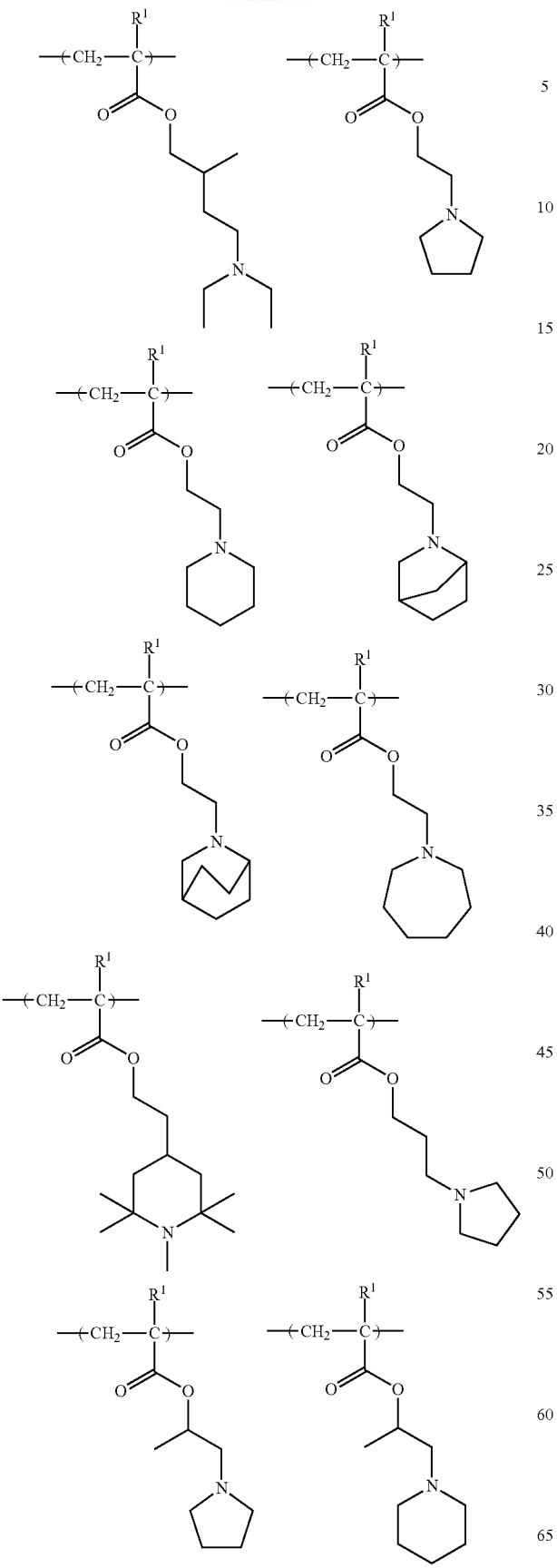
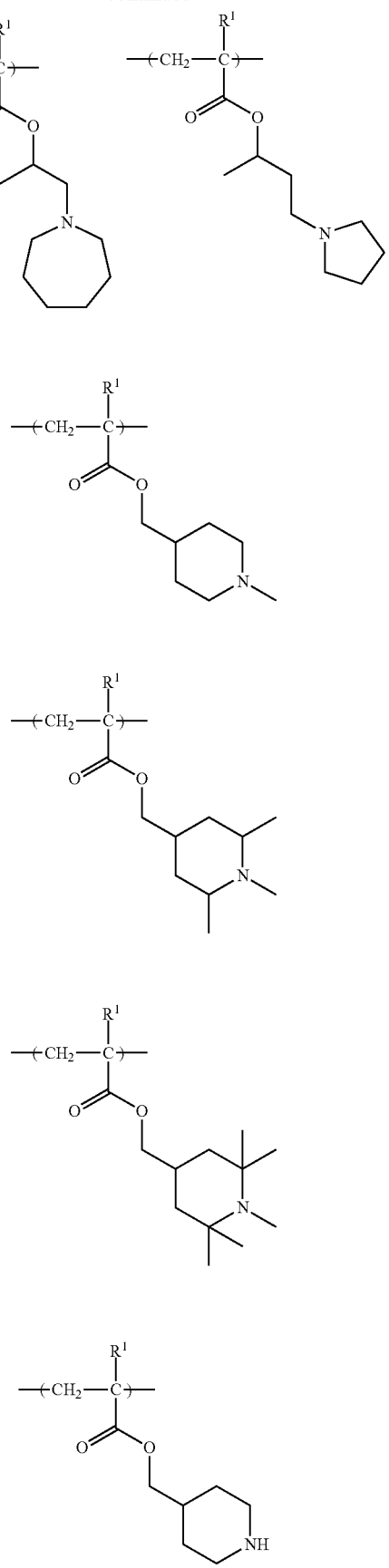

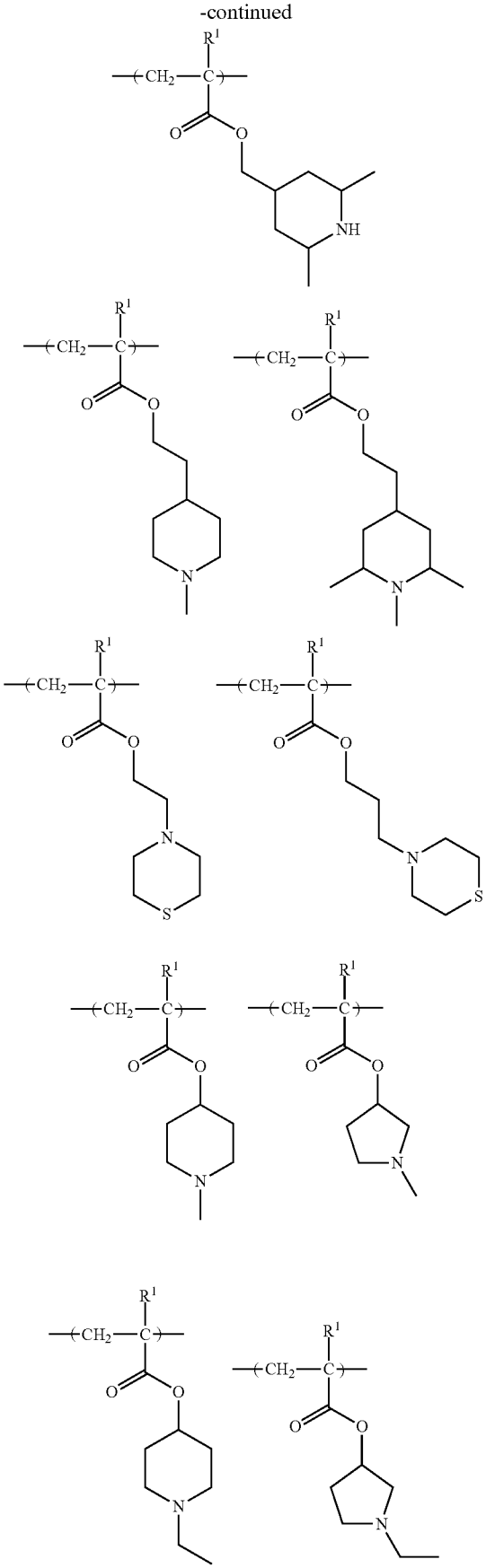
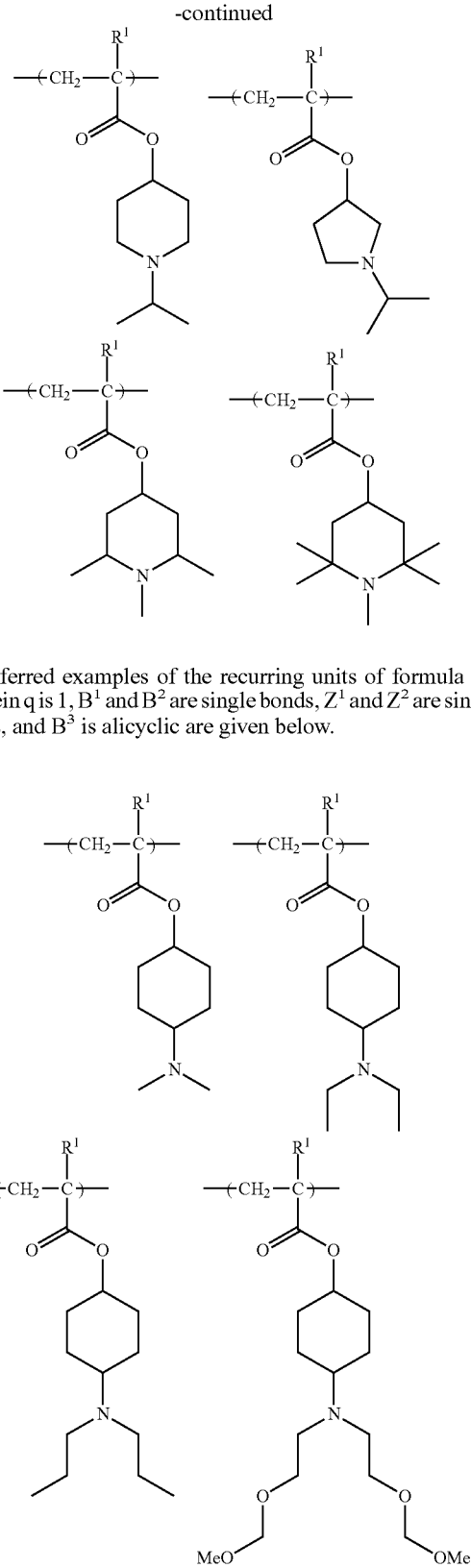
Preferred examples of the recurring units of formula (2) wherein q is 1, $B^1$ and $B^2$ are single bonds, $Z^1$ and $Z^2$ are single bonds, and $B^3$ is alicyclic are given below.
Preferred examples of the recurring units of formula (2) wherein q is 1, $B^1$ and $B^2$ are single bonds, $Z^1$ and $Z^2$ are single bonds, and $B^3$ is ethereal oxygen-containing alkylene are given below.

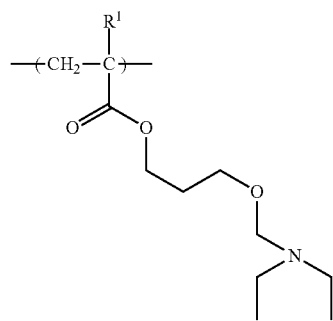
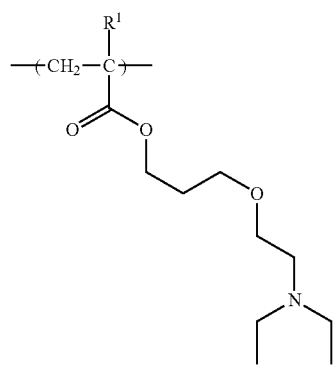
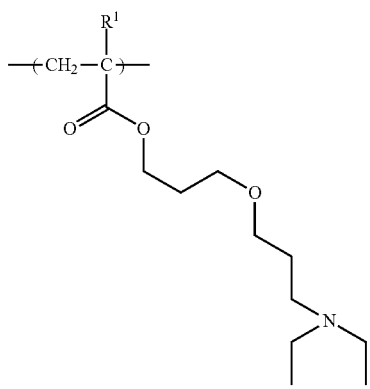
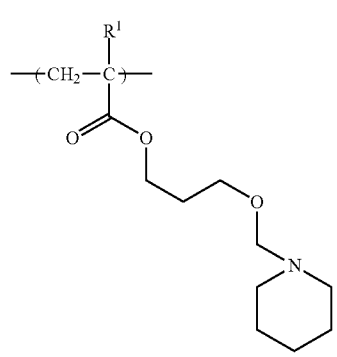
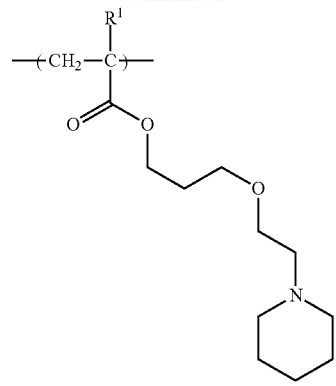
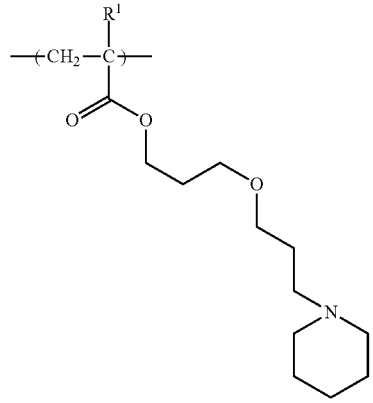
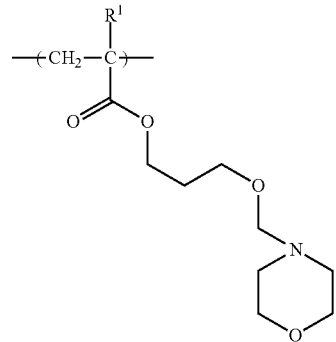
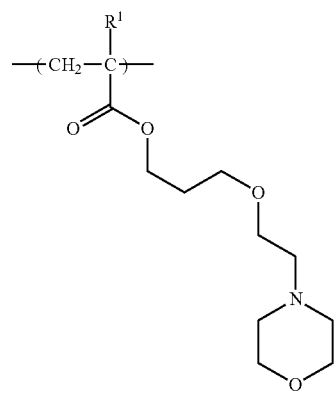

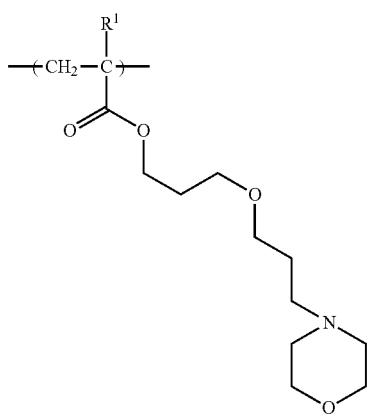
Preferred examples of the recurring units of formula (2) wherein q is 1, $B^1$ and $B^2$ are single bonds, $Z^1$ and $Z^2$ are single bonds, and $B^3$ is aromatic are given below.
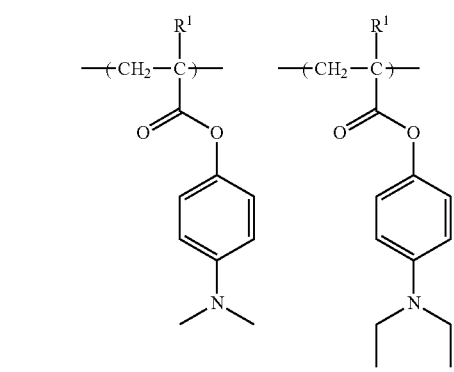
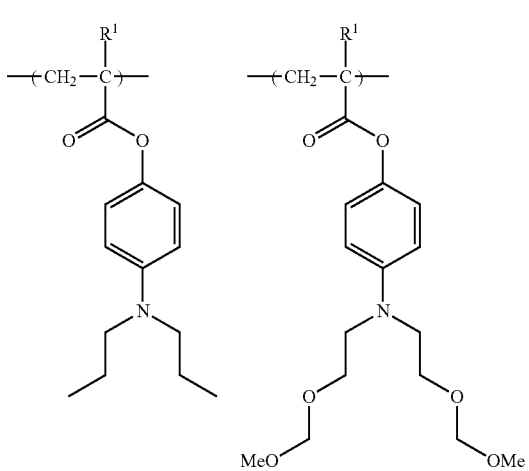
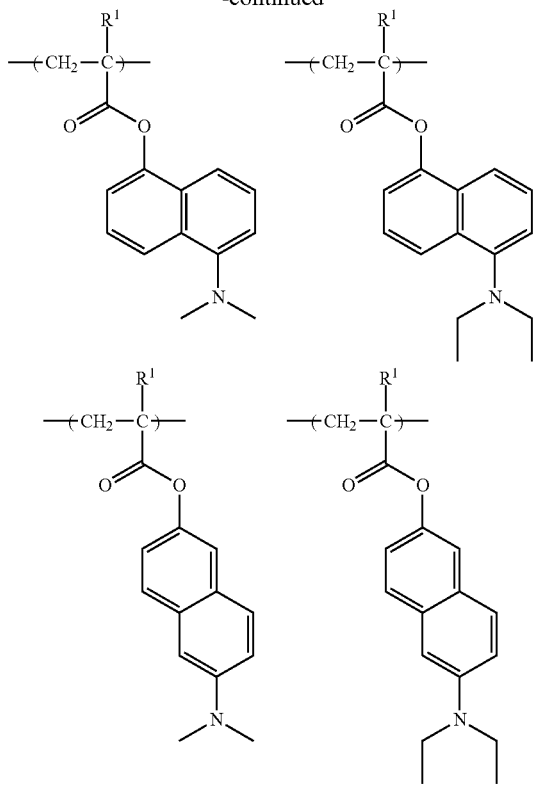
Preferred examples of the recurring units of formula (2) wherein q is 1, $B^1$ is a single bond, $Z^1$ is a single bond, $B^2$ is alicyclic, $Z^2$ is —O—CO— or —CO—O—, and $B^3$ is alkylene are given below.
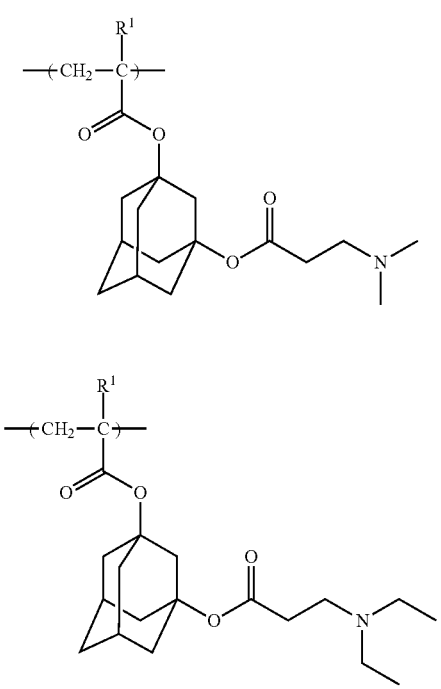

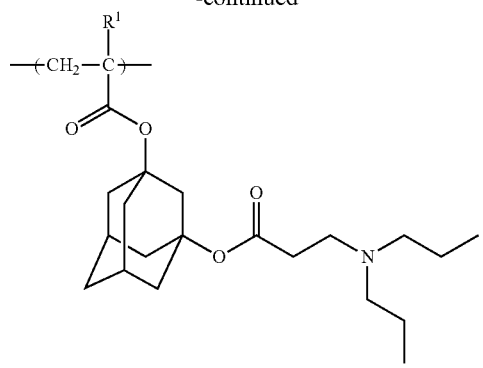
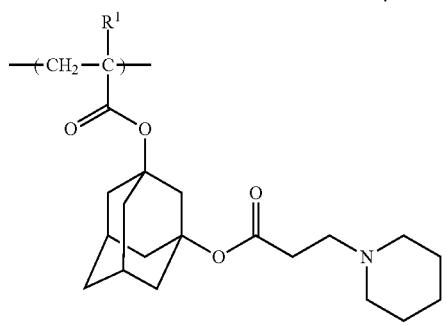
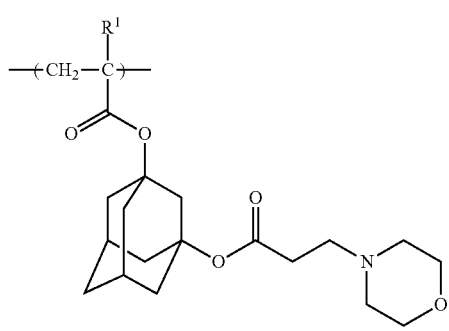
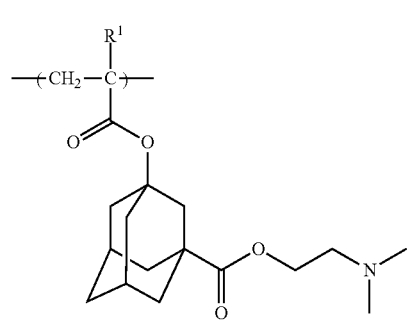
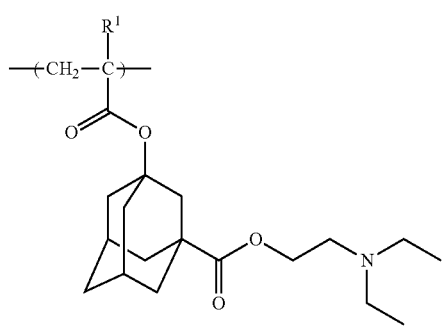
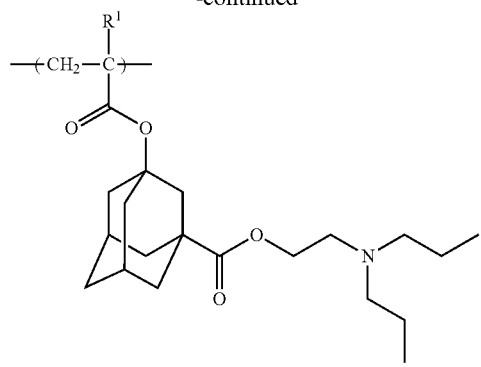
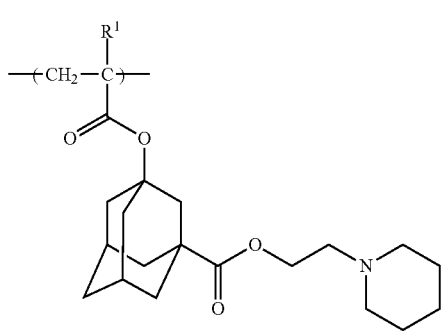
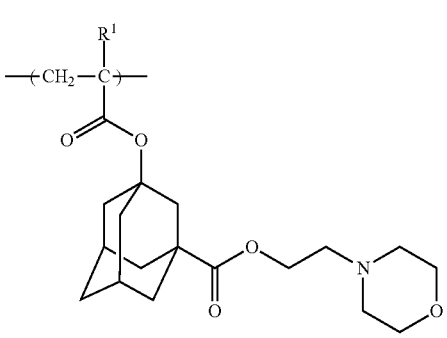
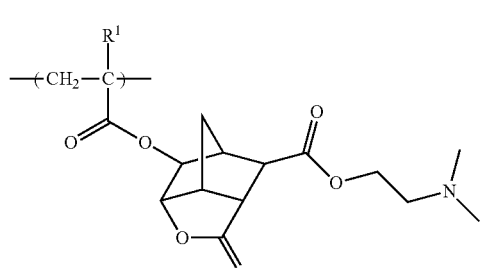
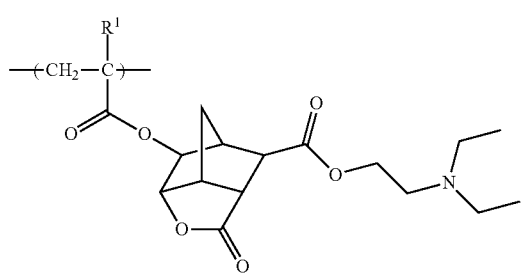

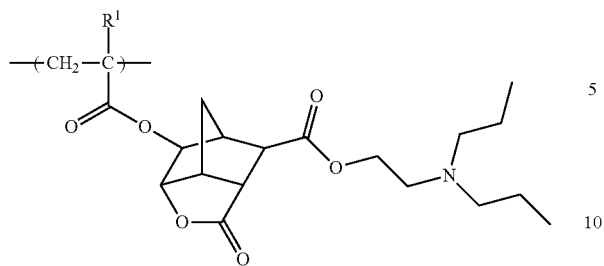
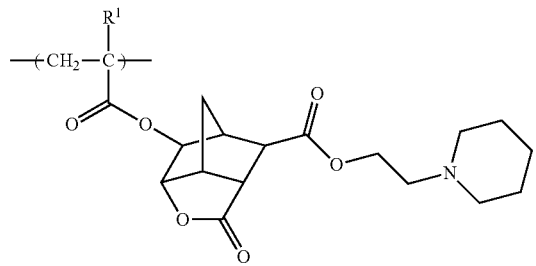
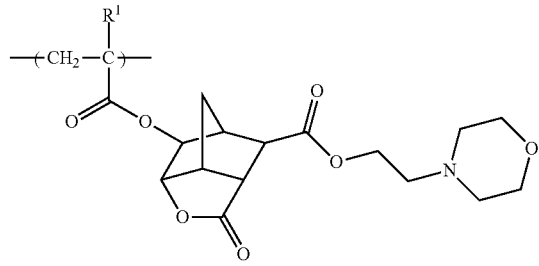

Preferred examples of the recurring units of formula (2) wherein q is 1, $B^1$ is a single bond, $Z^1$ is a single bond, $B^2$ is alkylene, $Z^2$ is —CO—O—, and $B^3$ is alkylene are given below.

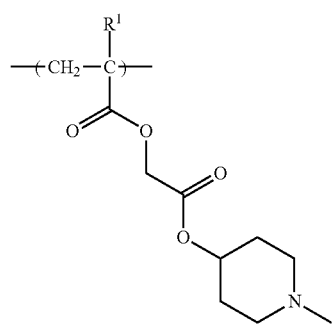
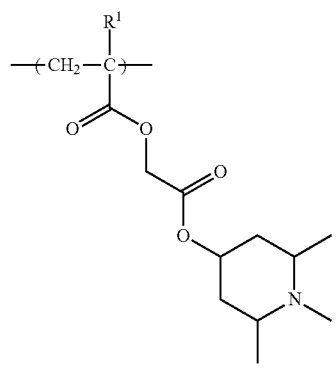
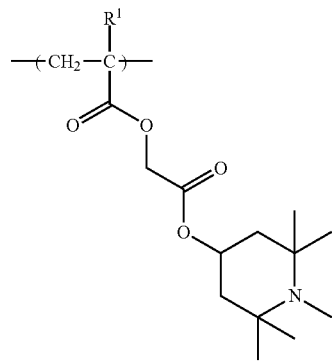

Preferred examples of the recurring units of formula (2) wherein q is 0, $B^1$ is a single bond, $Z^1$ is a single bond, $B^2$ is aromatic, $Z^2$ is a single bond, and $B^3$ is a single bond, alkylene or ethereal oxygen-containing alkylene are given below.

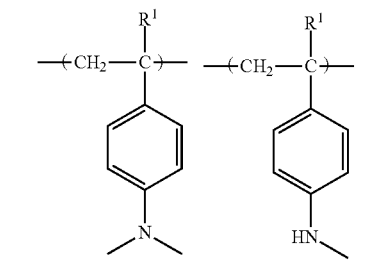
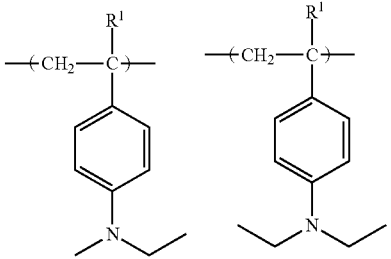
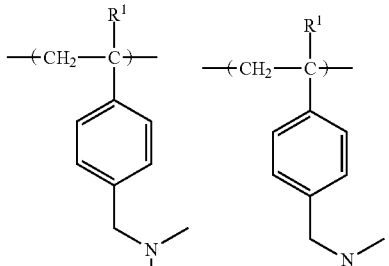
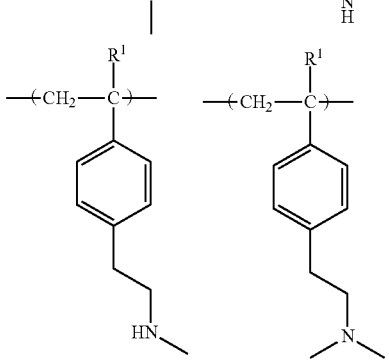

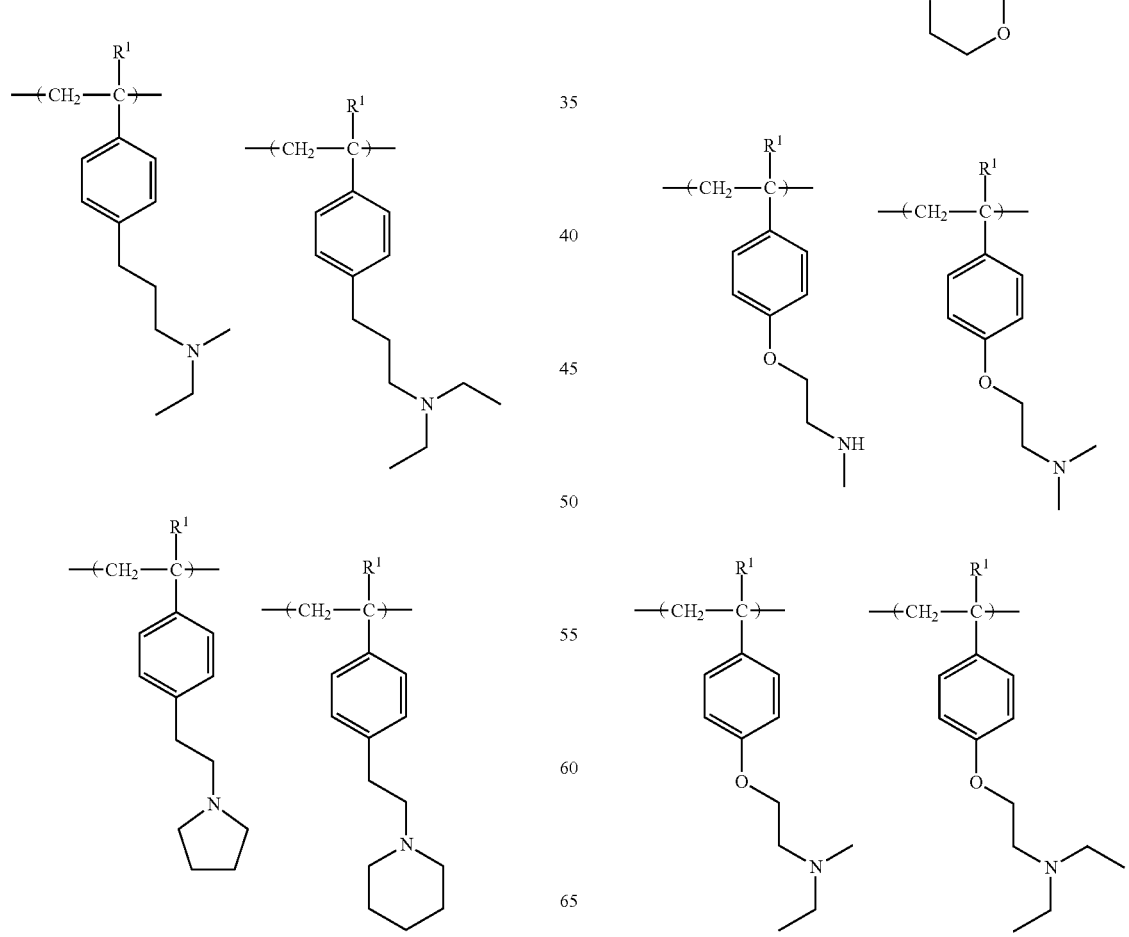

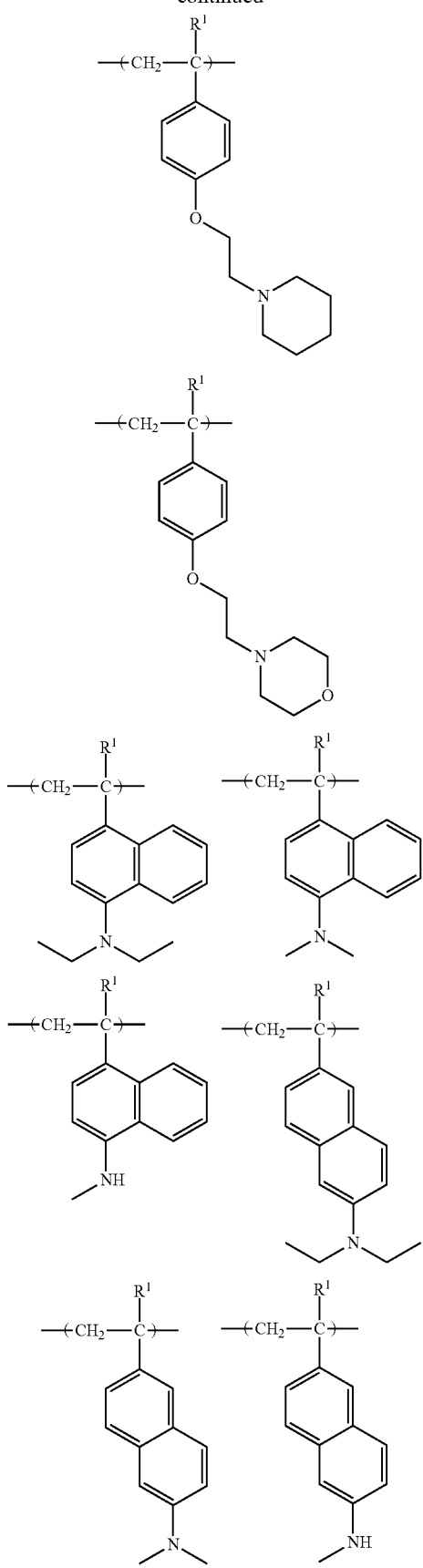
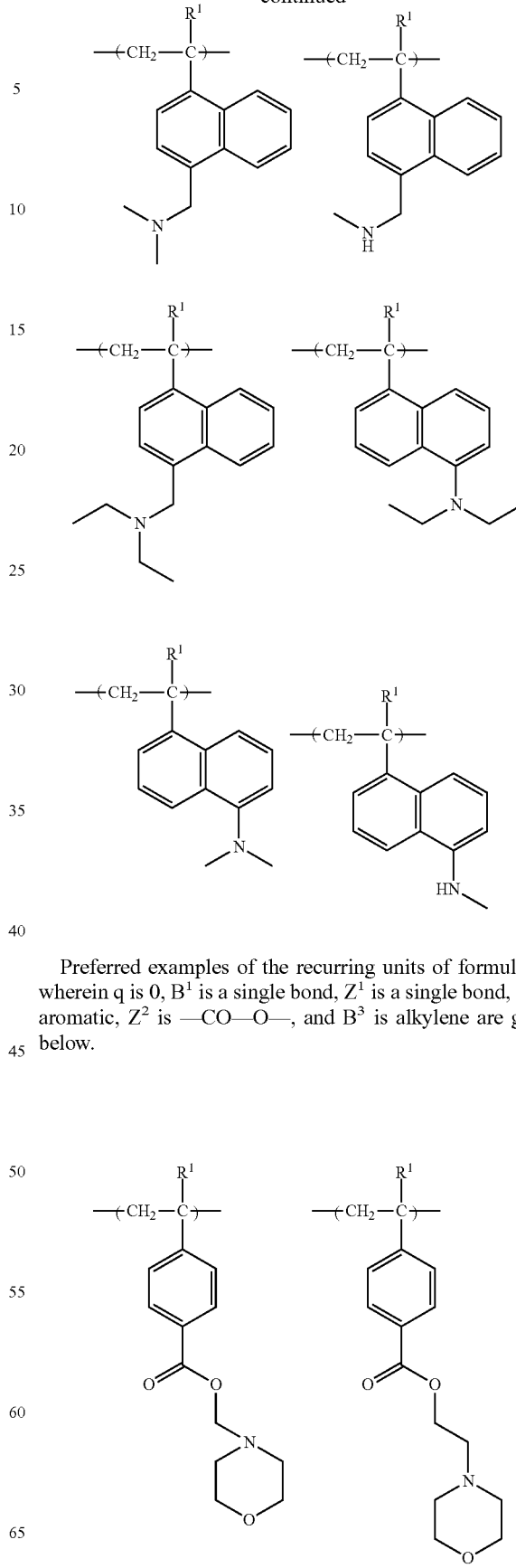
Preferred examples of the recurring units of formula (2) wherein q is 0, $B^1$ is a single bond, $Z^1$ is a single bond, $B^2$ is aromatic, $Z^2$ is —CO—O—, and $B^3$ is alkylene are given below.

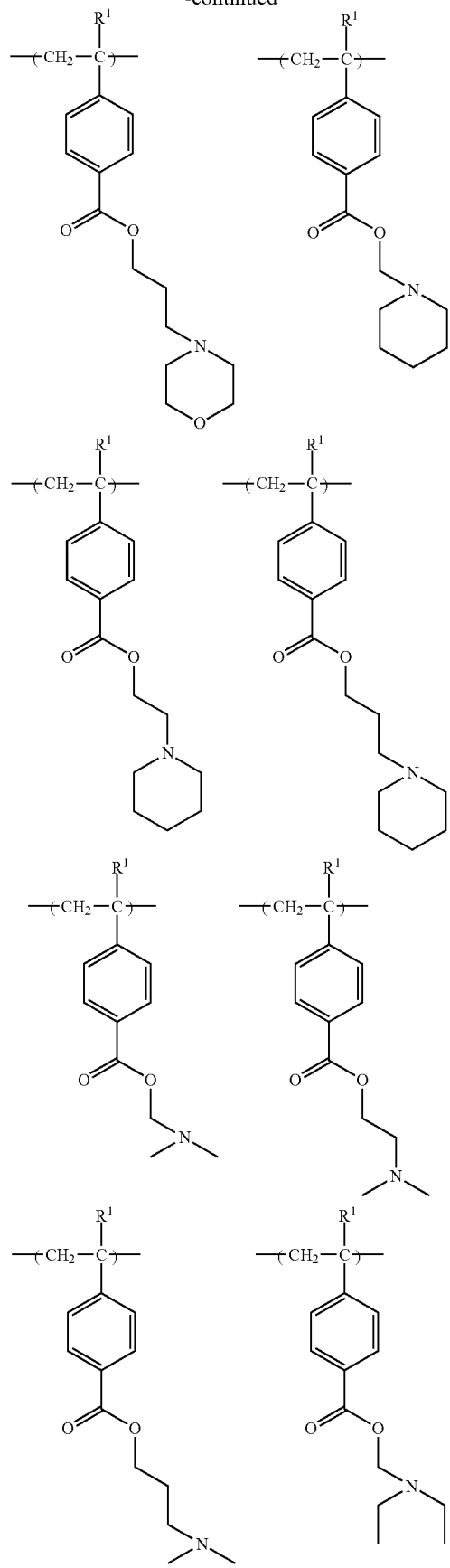
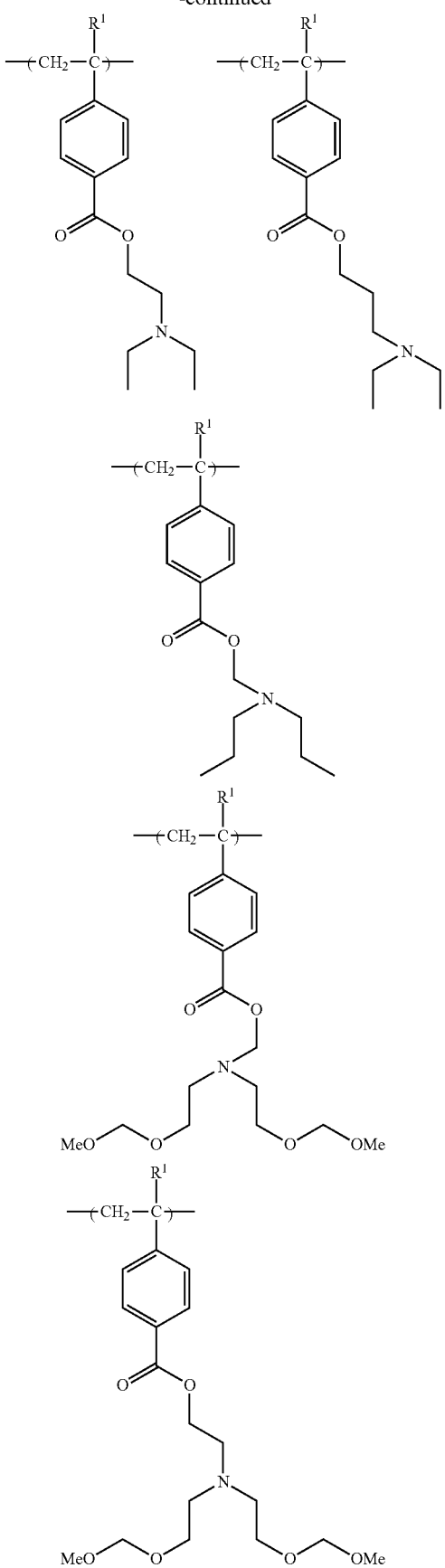

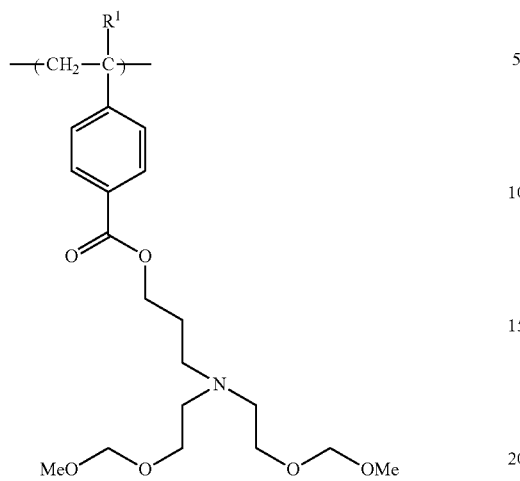
Preferred examples of the recurring units of formula (2) wherein q is 0, $B^1$ is aromatic, $Z^1$ is —CO—O—, $B^2$ is alicyclic, $Z^2$ is —CO—O— or —O—CO—, and $B^3$ is alkylene are given below.
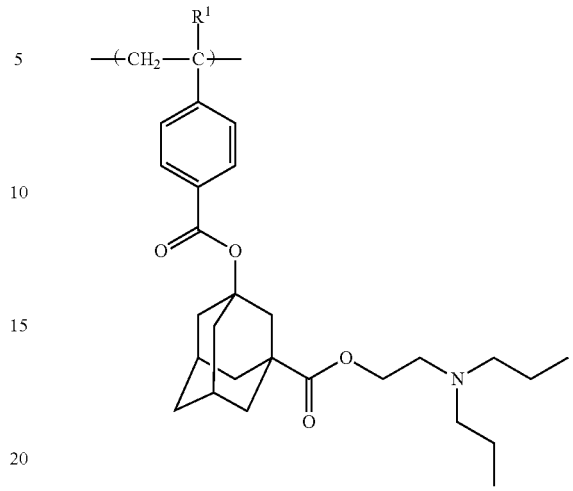
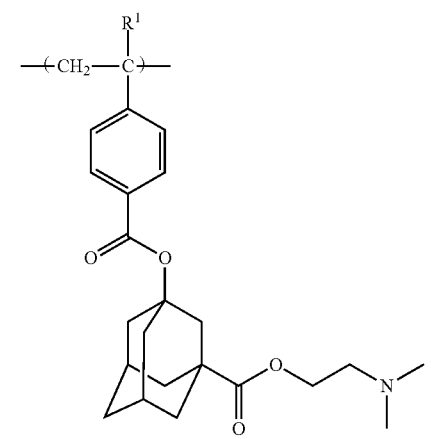
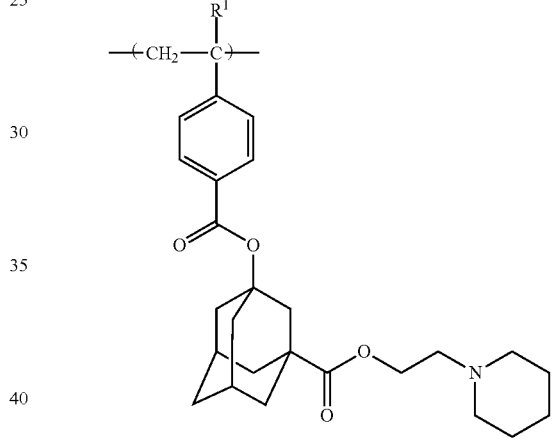
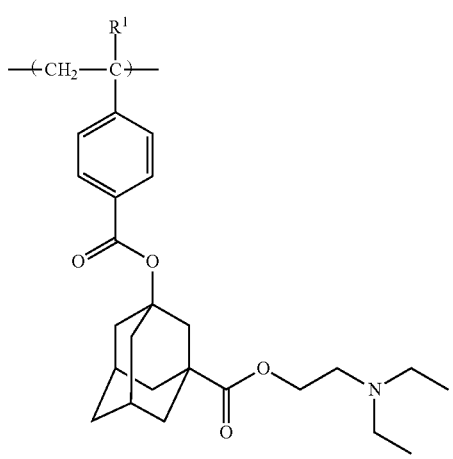
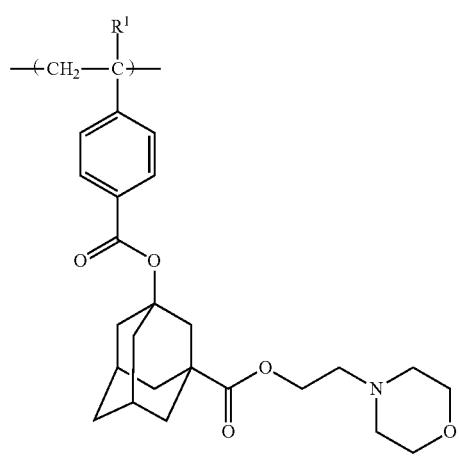

35
-continued
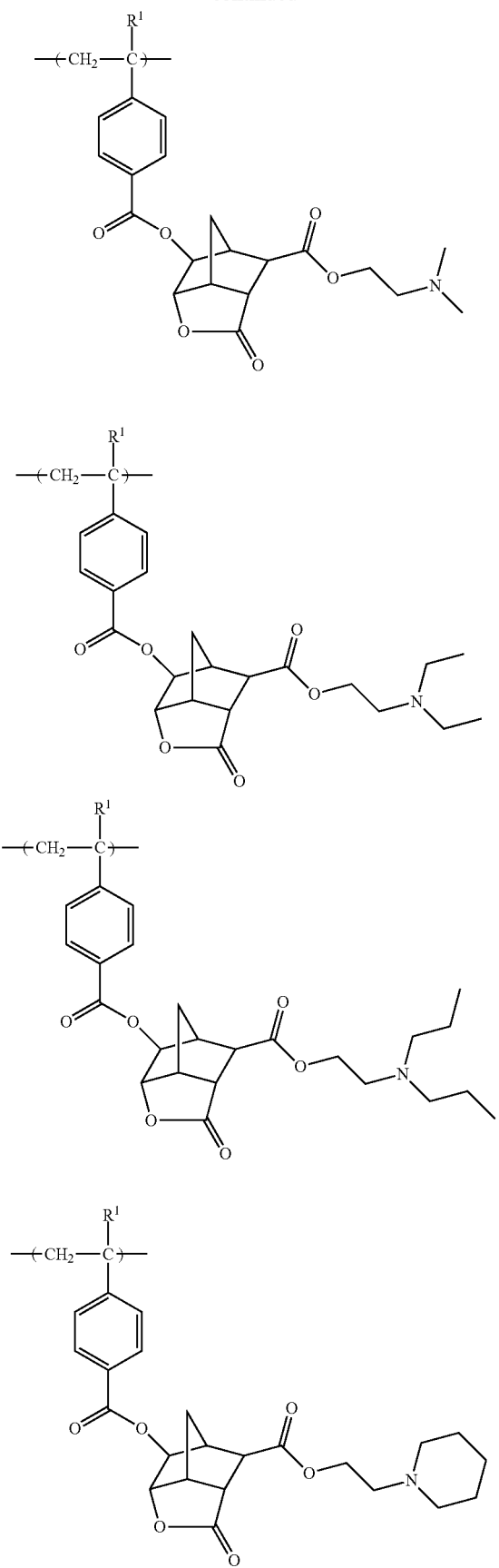
36
-continued
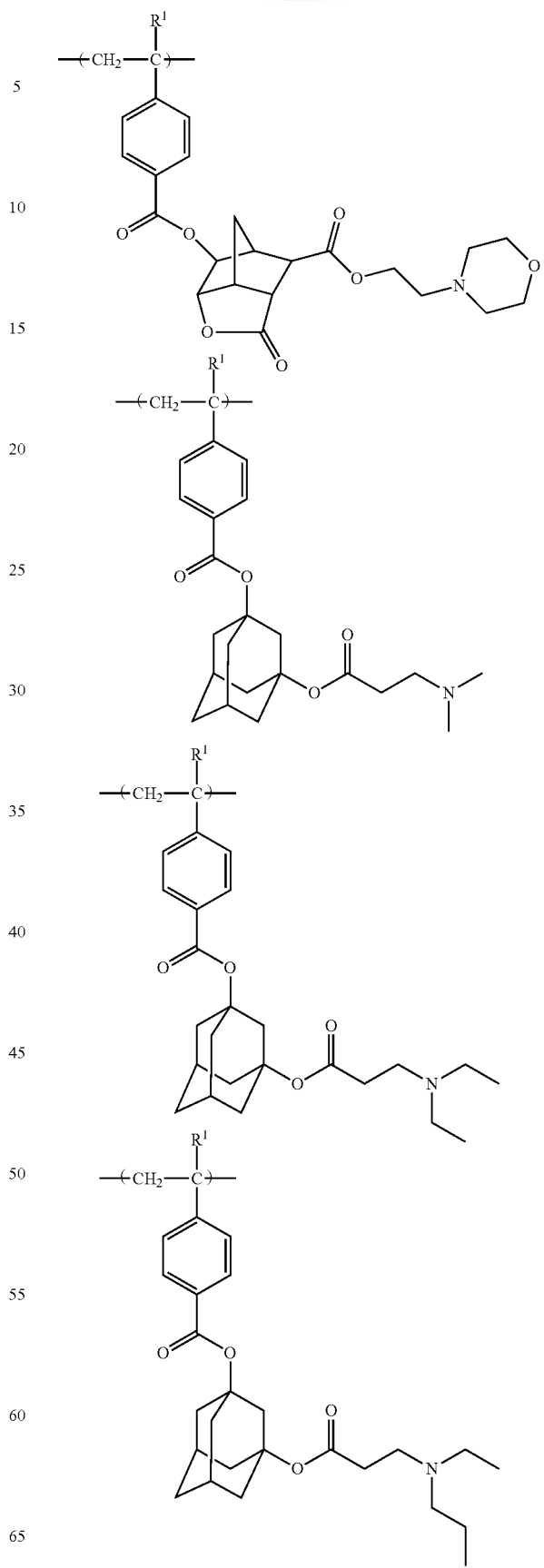

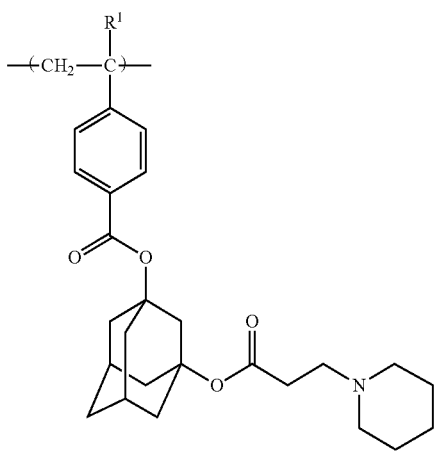

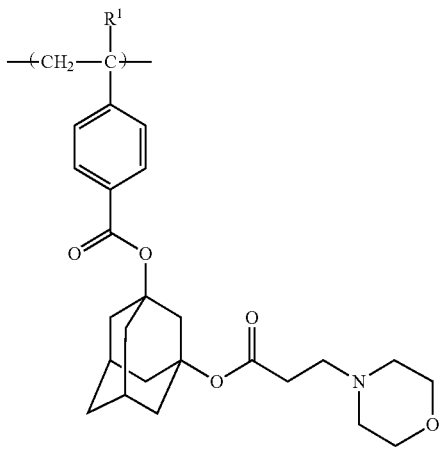

Preferred examples of the recurring units of formula (2) wherein q is 0, $B^1$ and $B^2$ are single bonds, $Z^1$ and $Z^2$ are single bonds, and $B^3$ is ethereal oxygen-containing alkylene are given below.

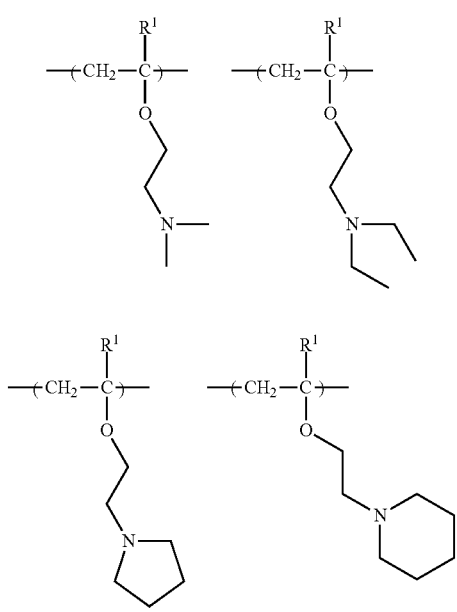

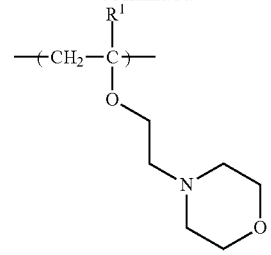

In order that the resist polymer serve the mechanical structure function and solubility changing function of a positive resist film, the polymer as a whole must be insoluble in alkaline developer, but turn soluble therein under the action of acid. When a blend of polymers is used, there can be a situation that one or more polymers in individual form are soluble in alkaline developer in the absence of acid, or one or more polymers in individual form are insoluble in alkaline developer even under the action of acid. When a resist film is formed of such a polymer blend, it suffices that the polymer blend is insoluble in alkaline developer prior to the action of acid, whereas under the action of acid, the acid labile protective group that one or more or all polymers possess is eliminated whereby the polymer blend becomes soluble in alkaline developer. Then, the polymer PB itself may be soluble in alkaline developer or the polymer PB itself may be insoluble in alkaline developer even under the action of acid. In the latter case, however, the polymer which can otherwise be a cause of scum following development is preferably designed so as to avoid alkali insolubilization even after acid treatment. In the former case, since stricter limits are imposed on the other polymer to be combined therewith, the polymer PB is preferably a polymer further comprising recurring units having an acidic functional group protected with an acid labile protective group.

As the recurring units having an acidic functional group protected with an acid labile protective group, a number of units are well known including units having a phenolic hydroxyl group protected, and units in which a carboxyl group derived from vinyl benzoic acid or (meth)acrylic acid is protected. All these units are generally applicable.

Useful recurring units which are protected with an acid labile group, but turn alkali soluble under the action of acid and which are incorporated in the polymer PB include recurring units of the general formula (4).

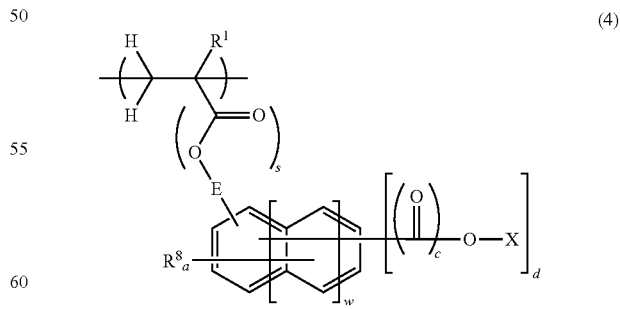

(4)

Herein E is a single bond or a $C_1$-$C_{10}$ alkylene group which may contain an ethereal oxygen atom. $R^1$ is hydrogen or methyl. $R^8$ is each independently a $C_1$-$C_6$ alkyl group. X is an acid labile group when d is 1. X is hydrogen or an acid labile group when d is 2 or 3, with at least one X being an acid labile group. The subscript "a" is an integer of 0 to 4, c is 0 or 1, d is an integer of 1 to 3, s is 0 or 1, and w is an integer of 0 to 2.

In formula (4), E stands for a single bond or a $C_1$-$C_{10}$ alkylene group which may contain an ethereal oxygen atom. Preferred alkylene groups are as exemplified for "A" in formula (1). $R^8$ is each independently a $C_1$-$C_6$ alkyl group. Preferred alkyl groups are as exemplified for $R^2$ in formula (1).

In formula (4), X is an acid labile group when d is 1, and is hydrogen or an acid labile group when d is 2 or 3, with at least one X being an acid labile group. The unit of formula (4) corresponds to the unit of formula (1) wherein at least one of phenolic hydroxyl groups substituting on an aromatic ring in the unit is replaced by an acid labile group, or at least one phenolic hydroxyl group is replaced by a carboxyl group which is in turn protected with an acid labile group. The acid labile group used herein may be any of acid labile groups which are eliminated with an acid to provide acidic groups, as commonly used in many well-known chemically amplified resist compositions.

Whether the phenolic hydroxyl group or the carboxyl group is to be protected, a choice of a tertiary alkyl group as the acid labile group for protection is preferred. The choice ensures that when a thin resist film which is as thin as 10 to 100 nm is processed to form a fine size pattern having a line width of up to 45 nm, the edge roughness of the pattern (a phenomenon that the edge of a pattern feature takes an irregular shape) is low. The tertiary alkyl group used herein is preferably selected from those of 4 to 18 carbon atoms because a corresponding monomer for polymerization can be isolated by distillation. The alkyl substituents on tertiary carbon of the tertiary alkyl group include straight, branched or cyclic alkyl groups of 1 to 15 carbon atoms which may partially contain an ether bond or an oxygen-containing functional group such as carbonyl while the substituents may bond together to form a ring.

The substituents on tertiary carbon of the tertiary alkyl group are preferably straight, branched or cyclic alkyl groups which may have an oxygen-containing functional group while the alkyl substituent groups on tertiary carbon may bond together to form a ring. Examples of the preferred substituents include, but are not limited to, methyl, ethyl, propyl, adamantyl, norbornyl, tetrahydrofuran-2-yl, 7-oxanorbornan-2-yl, cyclopentyl, 2-tetrahydrofuryl, tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, tetracyclo[4.4.0.1$^{2,5}$.1$^{7,10}$]dodecyl, and 3-oxo-1-cyclohexyl. Examples of the tertiary alkyl group include t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

Also an acetal group of the general formula (J):

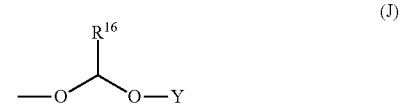

wherein $R^{16}$ is hydrogen or a straight, branched or cyclic $C_1$-$C_{10}$ alkyl group, and Y is a straight, branched or cyclic $C_1$-$C_{30}$ alkyl group (inclusive of polycyclic one) is often utilized. It is a good choice as the acid labile group that ensures consistent formation of a pattern which is relatively rectangular at the interface between the pattern and the substrate. In particular, a polycyclic alkyl group of 7 to 30 carbon atoms is preferably included to gain a higher resolution. When Y is a polycyclic alkyl group, preferably a bond forms between secondary carbon of the polycyclic ring structure and acetal oxygen. This is because if a bond forms on tertiary carbon of the ring structure, the polymer becomes an unstable compound, and as a result, the resulting resist composition may lack storage stability and have poor resolution. Inversely, if Y bonds on primary carbon via a straight alkyl group of at least 1 carbon, the polymer may have a low glass transition temperature (Tg), and as a result, the resist pattern as developed may suffer a profile failure by baking.

Examples of the acetal group of formula (J) are given below.

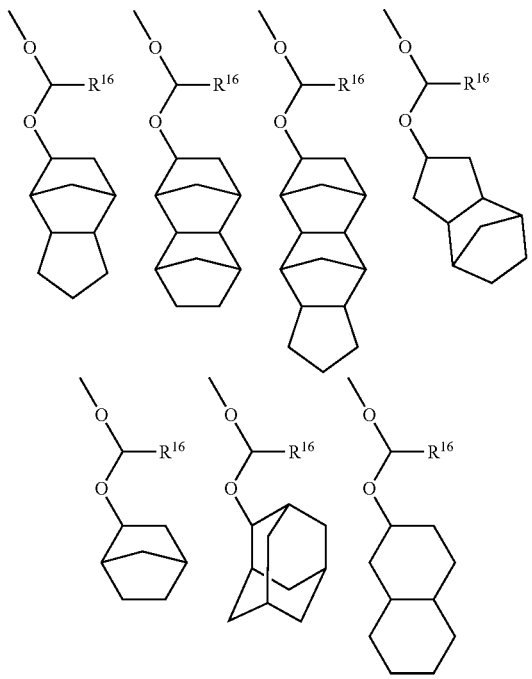

While $R^{16}$ is hydrogen or a straight, branched or cyclic $C_1$-$C_{10}$ alkyl group, a suitable group $R^{16}$ may be selected in accordance with the design of acid sensitivity of acid labile group. In one exemplary design that the acid labile group has a relatively high stability and is decomposable with a strong acid, hydrogen is selected as $R^{16}$. In another exemplary design that a higher sensitivity to pH changes is available due to relatively high reactivity, a straight alkyl group is selected as $R^{16}$. Partly depending on a combination of an acid generator and a basic compound compounded in a resist composition, in a further exemplary design that decomposition entails a large change of solubility due to terminal substitution with a relatively large alkyl group, $R^{16}$ is preferably a group in which the carbon bonding with the acetal carbon is secondary. Examples of $R^{16}$ which bonds with the acetal carbon via secondary carbon include isopropyl, sec-butyl, cyclopentyl, and cyclohexyl.

An alternative choice of acid labile group is bonding —$CH_2COO$— (tertiary alkyl group) to a phenolic hydroxyl group. This is an exceptional structure of acid labile group in that it is not a protective group for hydroxyl. The tertiary alkyl group used herein may be the same as the above-mentioned tertiary alkyl group used for the protection of a phenolic hydroxyl group.

In a preferred embodiment, the polymer PB may further comprise units of the general formulae (5) and/or (6) as main constituent units.

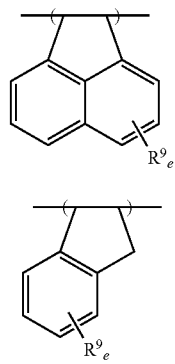

(5)

(6)

Herein e is an integer of 0 to 4, and $R^9$ is each independently a halogen atom, a hydroxyl group, a hydroxyl group protected with an acid labile group, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group.

For group $R^9$, exemplary halogen atoms include fluorine, chlorine and bromine. The alkoxy group and alkoxy moiety of alkoxycarbonyl group are preferably of 1 to 6 carbon atoms, more preferably 1 to 4 carbon atoms, and examples include methoxy, ethoxy, n-propoxy, isopropoxy, n-butoxy, isobutoxy, with methoxy and isopropoxy being preferred. Optionally substituted alkyl groups include straight, branched or cyclic alkyl groups such as methyl, ethyl, propyl, isopropyl, butyl, tert-butyl, pentyl, cyclopentyl, hexyl, cyclohexyl, and octyl, and substituted form of the foregoing alkyl groups in which one or more hydrogen atoms are substituted by halogen atoms or the like. Suitable acyloxy groups include methylcarbonyloxy, ethylcarbonyloxy, propylcarbonyloxy, butylcarbonyloxy, pentylcarbonyloxy, hexylcarbonyloxy and structural isomers thereof, cyclopentylcarbonyloxy, cyclohexylcarbonyloxy, benzoyloxy, and substituted form of the foregoing groups in which some hydrogen atoms are substituted by halogen atoms. When these groups are halo-substituted, chlorine or fluorine is preferred for substitution. Also $R^9$ is a hydroxyl group protected with an acid labile group, and in this case, the acid labile group may be selected from the examples enumerated for X in formula (4).

When units of formulae (5) and/or (6) are used as constituent units in the polymer, there are obtained the advantages that the aromatic ring provides etch resistance and the addition of cyclic structure to the main chain enhances resistance to EB irradiation during etching or pattern inspection.

The polymer PB comprises recurring units of formulae (1) and (2) as essential constituent units. Preferably the polymer PB comprises at least 50 mol %, more preferably at least 70 mol %, and even more preferably at least 85 mol % of recurring units selected from formulae (1), (2), (4), (5), and (6), based on the overall recurring units of polymer PB.

The recurring units (1) for endowing the molecule with polarity are preferably incorporated in a content of at least 30 mol %, more preferably at least 40 mol %, although the content varies depending on the strength of polarity. A unit (1) content within the range ensures tight adhesion to the substrate and a good pattern profile upon development. A unit (1) content of less than 30 mol % may lead to pattern collapse and pattern profile failure. The upper limit of the content of recurring units (1) is based on the polymer design that takes into account a dissolution rate in alkaline developer of a combination of polymers used in the resist composition, and largely varies depending on a particular polymer or polymers to be combined. With respect to the upper limit of the content of recurring units (1) in the polymer PB, the content of recurring units (1) may be quite high, and specifically, recurring units (1) may be all constituent units of the polymer PB excluding recurring units (2) when the polymer PB is blended with a large proportion of another polymer.

With respect to the content of basic recurring units (2), the polymer design must be made between a proportion of these units in overall polymers in the resist composition (of which a resist film is made) and a proportion of these units in a single polymer PB. To attain the benefits of the invention, design is made such that the content of recurring units (2) is preferably 0.005 to 10 mol %, more preferably 0.01 to 3 mol %, and even more preferably 0.1 to 1.5 mol % based on the total recurring units in overall polymers in the resist composition. In an embodiment wherein the polymer PB comprises recurring units of formula (3) as well so that polymer PB is also a polymer PA and the polymer PB is a single one, the content of basic recurring units (2) is preferably 0.005 to 10 mol %, more preferably 0.01 to 3 mol %, and even more preferably 0.1 to 1.5 mol % of the polymer PB.

When a blend of plural polymers is used, a polymer having a compositional ratio deviating from the above range may be compounded so that the content of units (2) may fall in the range based on the overall polymers of the blend. To maximize the content of recurring units (2) in polymer PB, all recurring units excluding the necessary content of recurring units (1) may be recurring units (2). In this case, a polymer PB having a content of recurring units (2) which is preferably up to 60 mol %, more preferably up to 50 mol % may be compounded, thereby achieving a satisfactory quench effect on resist pattern formation. The recurring units (2) may be of one type or a mixture of two or more types.

The recurring units (4) serve to make the resist film alkali insoluble and turn it alkali soluble under the action of acid. The recurring units (4) are not essential for polymer PB when a certain polymer different from polymer PB is used as one component for controlling the solubility of the resist film in developer. However, the inclusion of recurring units (4) is preferred to ensure a degree of freedom in designing a blend of polymers. When included, the recurring units (4) are preferably incorporated in a content of more than 0 to 65 mol %, more preferably 5 to 50 mol %, and even more preferably 10 to 45 mol % based on the overall recurring units of the polymer. The recurring units (4) may be of one type or a mixture of two or more types.

The recurring units (5) and (6) serve to improve etch resistance by imparting a cyclic structure to the main chain. The recurring units (5) and (6) each may be of one type or a mixture of two or more types. For the purpose of improving etch resistance, recurring units (5) and (6) are preferably incorporated in a content of at least 5 mol % based on the overall recurring units of the polymer. Where the functional group in recurring units (5) and (6) is polar so that the units serve to impart substrate adhesion or where the substituent group is protected with an acid labile group as mentioned above so that the units become alkali soluble under the action of acid, the content of recurring units (5) and (6) incorporated is added to the content of the relevant units so that the sum may fall in the above-defined range of the relevant units. Where recurring units (5) and (6) have no functional group or where the functional group is otherwise, the content of recurring units (5) and (6) incorporated is preferably up to 30 mol %. Where recurring units (5) and (6) have no functional group or the functional group is otherwise, a content of recurring units (5) and (6) in excess of 30 mol % may cause development defects.

If desired, recurring units of formula (3) may be incorporated in the polymer PB containing a basic component according to the invention. The resulting polymer PB has the function of polymer PA at the same time. That is, when units having a sulfonic acid side chain are incorporated into polymer PB, not only the diffusion of base, but also the diffusion of acid generated upon light exposure take place at the same time, indicating a possibility that any decline in pattern fidelity, especially LER upon exposure to high-energy radiation for the future further miniaturization is significantly improved. When the content of units (3) is preferably controlled to or below 10 mol %, more preferably to or below 5 mol %, it becomes possible, even on a substrate which is likely to cause resist pattern stripping, to form a resist pattern with minimized stripping and a high reliability.

While the polymer PB comprises the foregoing recurring units (1) to (6), it may further comprise any additional commonly used recurring units such as (meth)acrylate units protected with an acid labile group and (meth)acrylate units having an adhesive group such as lactone structure. The properties of the resist film may be finely adjusted by controlling the content of the additional recurring units although the additional recurring units may be omitted.

The polymer PB comprising the foregoing recurring units may be prepared by effecting copolymerization of monomers by any well-known techniques with an optional combination of protection and deprotection reactions, as described in Patent Documents 1 and 2. The copolymerization reaction is not particularly limited although radical polymerization is preferred in that different recurring units are randomly arrayed.

The polymer PB preferably has a weight average molecular weight (Mw) of 1,000 to 50,000, and more preferably 2,000 to 20,000, as measured by gel permeation chromatography (GPC) using polystyrene standards. A polymer with a Mw of less than 1,000 may lead to a pattern having a rounded top, reduced resolution, and degraded LER as is well known in the art. If Mw is higher than the necessity, the pattern tends to have increased LER, depending on the pattern size to be resolved. The Mw is preferably controlled to 20,000 or less particularly when a pattern having a line width of up to 100 nm is formed.

The polymer PB preferably has a narrow dispersity as demonstrated by a molecular weight distribution Mw/Mn in the range of 1.0 to 2.0, more preferably 1.0 to 1.8. A broader dispersity may cause drawbacks to the pattern such as foreign matter after development and degraded profile.

Polymer PA

The polymer PA having an acid generator on a side chain used herein is a polymer comprising recurring units of the general formula (3) and recurring units having an acidic side chain protected with an acid labile protective group. This polymer PA is alkali insoluble, has a function of generating a sulfonic acid bound to the main chain of polymer PA upon exposure to high-energy radiation, becomes alkali soluble due to the thus generated sulfonic acid, and has a function of effecting deprotection of the acid labile protective group with which the acidic side chain of the coexisting recurring units is protected.

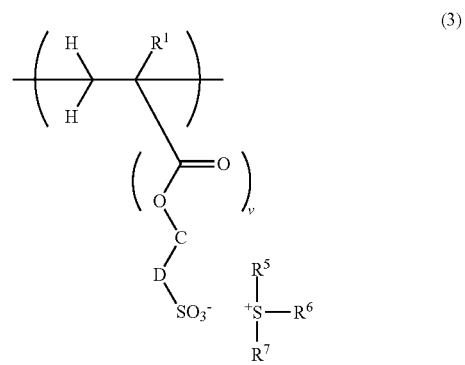

Herein C is a single bond or a substituted or unsubstituted $C_6$-$C_{18}$ arylene group, D is a single bond or a divalent $C_1$-$C_{15}$ hydrocarbon group in which some or all hydrogen atoms may be substituted by fluorine atoms or any methylene moiety may be substituted by an ethereal oxygen atom or carbonyloxy radical, $R^1$ is as defined above, $R^5$, $R^6$ and $R^7$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, any two of $R^5$, $R^6$ and $R^7$ may bond together to form a ring with the sulfur atom in the formula, and v is 0 or 1, with the proviso that when v=0, C and D are not single bonds at the same time.

In formula (3), C is a single bond or a substituted or unsubstituted $C_6$-$C_{18}$ arylene group. Examples of the arylene group include phenylene, naphthylene, anthracenyl, and phenanthrenyl, in which some or all hydrogen atoms may be substituted by halogen, methyl, ethyl, propyl, butyl, methoxy, ethoxy, propoxy, butoxy or the like.

In formula (3), D is a single bond or a divalent $C_1$-$C_{15}$ hydrocarbon group in which some or all hydrogen atoms may be substituted by fluorine atoms or any methylene moiety may be substituted by an ethereal oxygen atom or carbonyloxy radical. When v=0, C and D are not single bonds at the same time. When D is a divalent hydrocarbon group in which any methylene moiety may be substituted by an ethereal oxygen atom or carbonyloxy radical, it is preferred that the carbon atom in D that directly bonds with the sulfur atom of the sulfo group have a fluorine atom as a substituent, because the sulfonic acid generated upon exposure to high-energy radiation has a high acid strength which is advantageous in achieving a high contrast.

Preferred examples of recurring units (3) are illustrated below. In the formulae, M stands for hydrogen or methyl, while the sulfonium counter ion is not depicted. First illustrated are examples of recurring units (3) wherein C is not a single bond. Specifically C is a substituted or unsubstituted aromatic ring structure.
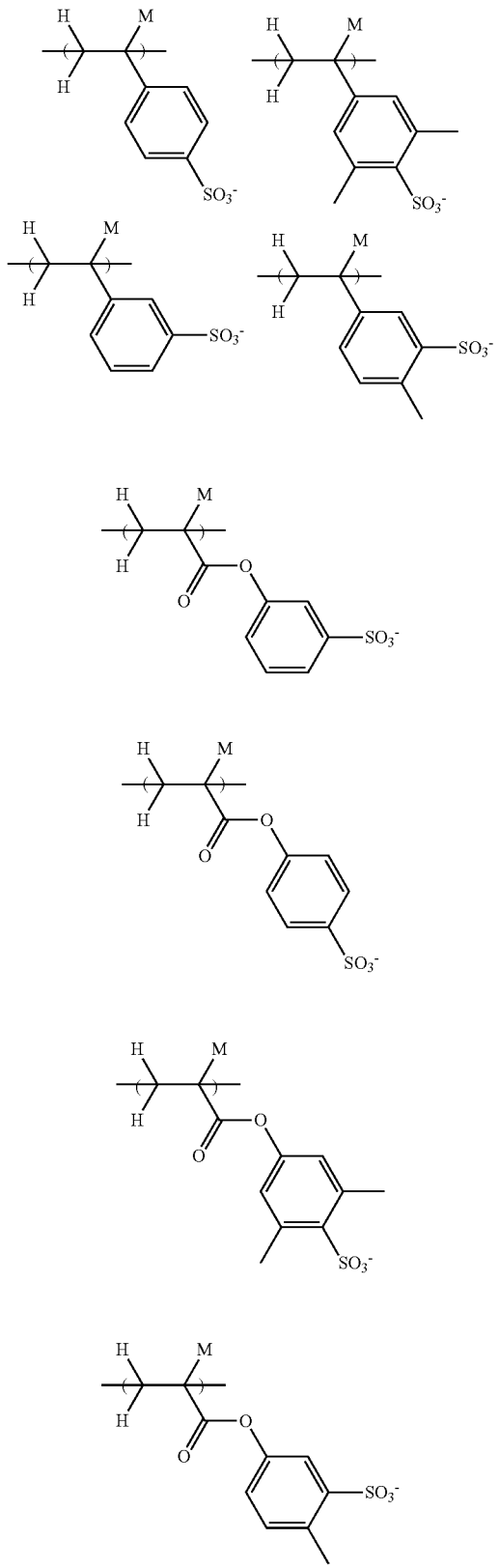
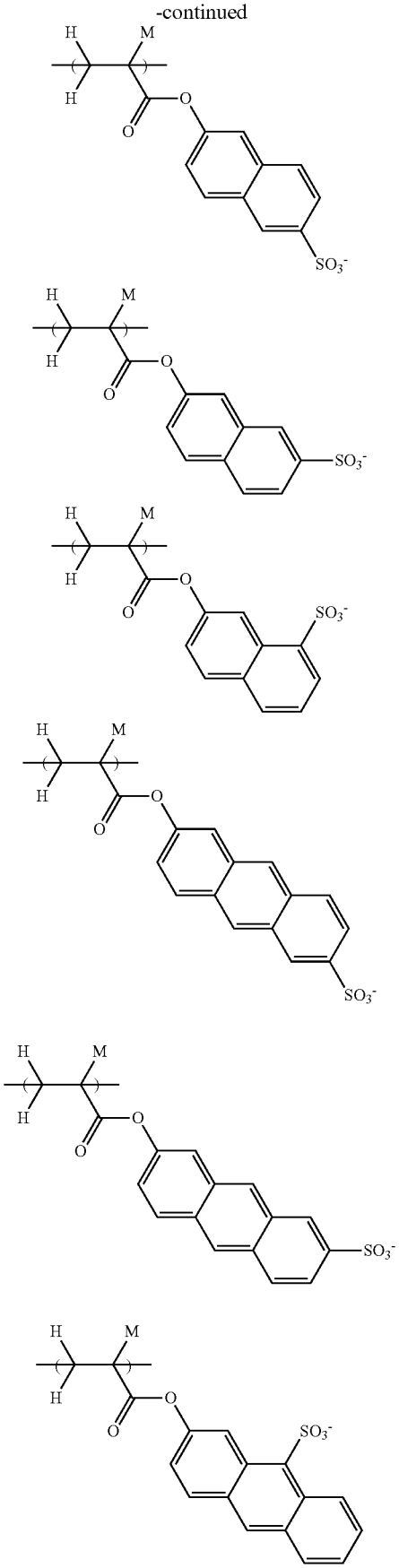

-continued
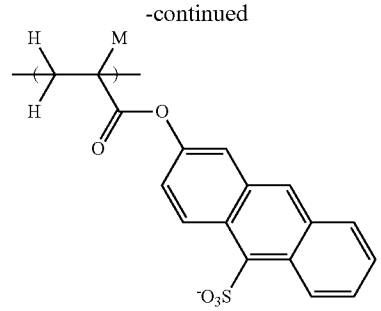
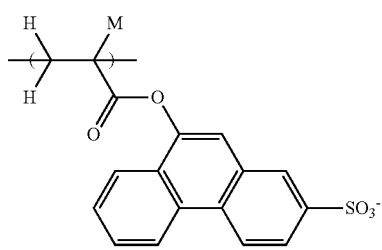
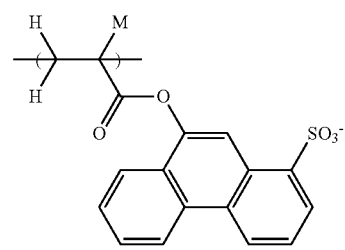
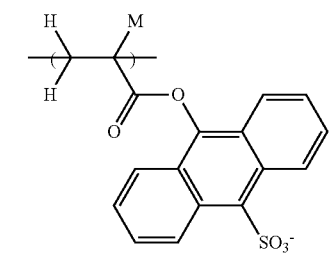
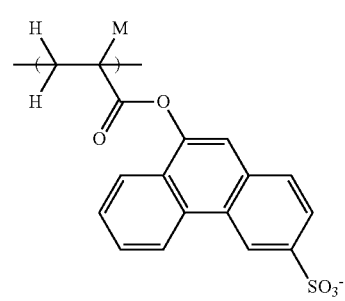
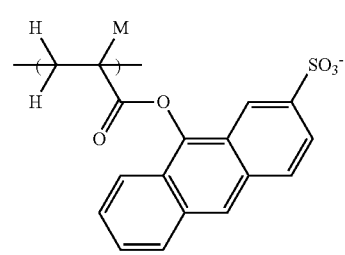
-continued
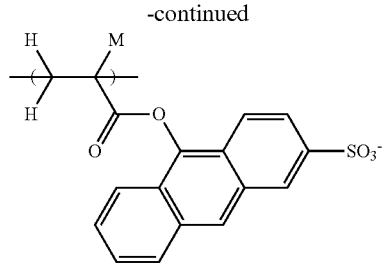
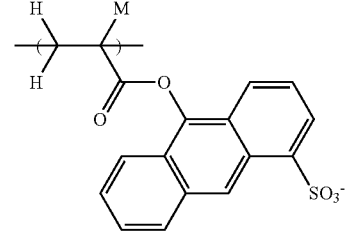
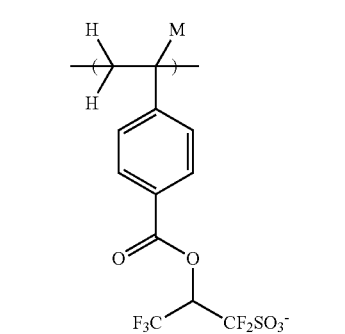
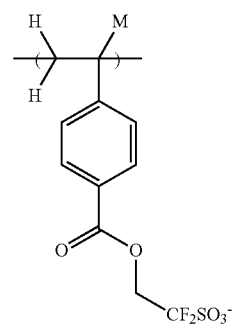
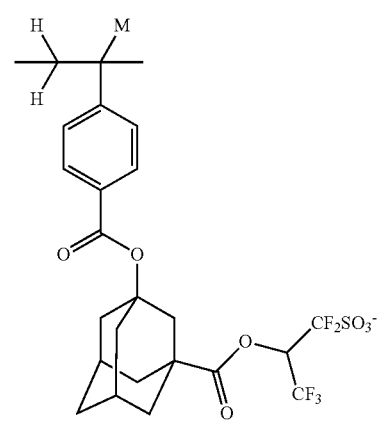

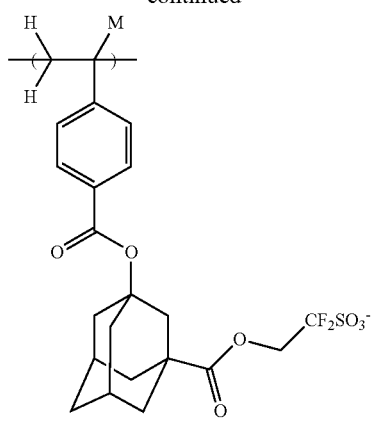

Next illustrated are examples of recurring units (3) wherein C is a single bond, D is a divalent $C_1$-$C_{15}$ alkylene group in which some or all hydrogen atoms may be substituted by fluorine atoms or any methylene moiety may be substituted by an ethereal oxygen atom or carbonyloxy radical.

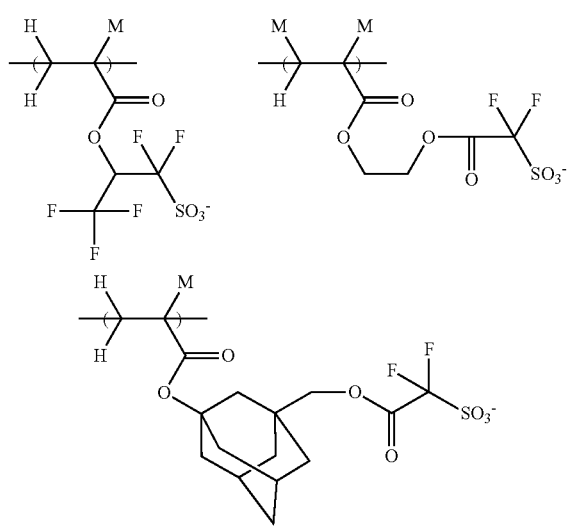

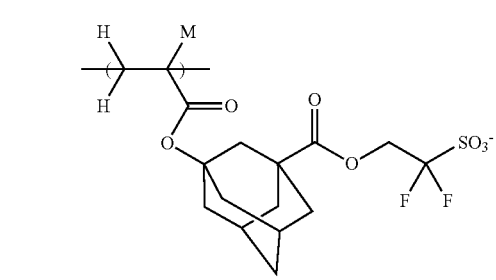

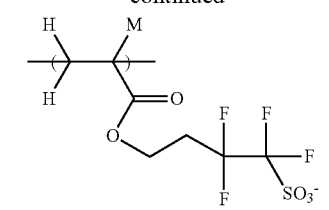

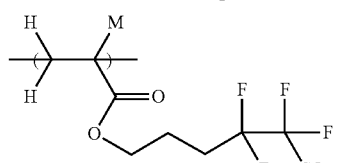

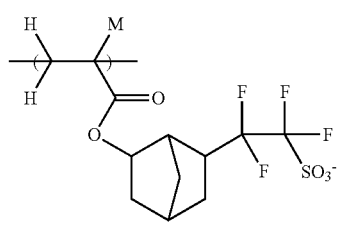

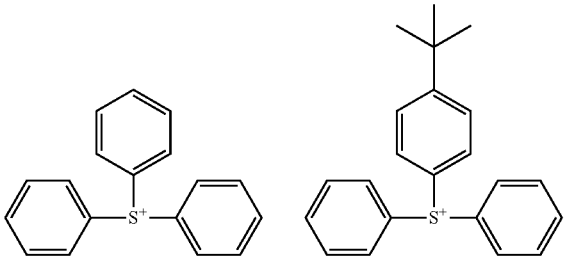

Preferred examples of the sulfonium cation as the counter ion to the foregoing sulfonic acid anion are given below.

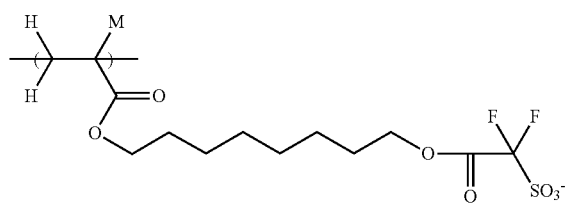

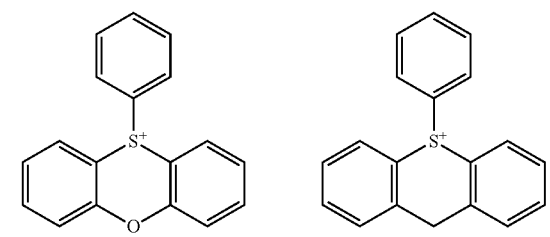

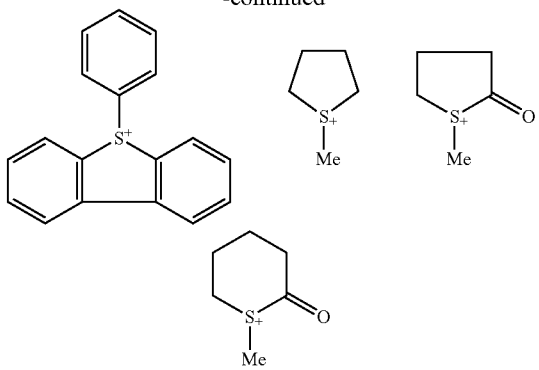

Among other cations, those polymers comprising recurring units having a cation derived from phenoxathiin dissolve well in solvents and are advantageously used.

With respect to the content of recurring units (3), the polymer design must be made between a proportion of these units in overall polymers in the resist composition (of which a resist film is made) and a proportion of these units in a single polymer PA. To attain the benefits of the invention, design is made such that the content of recurring units (3) is preferably 0.5 to 10 mol %, more preferably 1 to 5 mol %, based on the total recurring units in overall polymers in the resist composition. In an embodiment wherein the polymer PA comprises recurring units of formulae (1) and (2) as well so that polymer PA is also a polymer PB and the polymer PA is a single one, the content of recurring units (3) is preferably 0.5 to 10 mol %, more preferably 1 to 5 mol % of the polymer PA.

When a blend of plural polymers is used, a polymer having a compositional ratio deviating from the above range may be compounded so that the content of units (3) may fall in the range based on the overall polymers of the blend. To maximize the content of recurring units (3) in polymer PA, all recurring units excluding the necessary content of recurring units, for example, recurring units (1) to provide solubility in developer and substrate adhesion may be recurring units (3). In this case, a polymer PA having a content of recurring units (3) which is preferably up to 60 mol %, more preferably up to 50 mol % may be compounded, thereby achieving a satisfactory acid diffusion effect on resist pattern formation. The recurring units (3) may be of one type or a mixture of two or more types.

Preferred recurring units which can be incorporated in polymer PA comprising an acid generating unit on side chain include adhesive units. The adhesive units in polymer PA may be recurring units of formula (1) as in polymer PB. With respect to the content of recurring units (1) in polymer PA, the same design concept as in polymer PB is applicable. In general, the content of recurring units (1) is preferably at least 35 mol %, and more preferably at least 40 mol % of polymer PA whereby a pattern having improved adhesion to the substrate and a satisfactory profile after development can be formed. A unit (1) content of less than 35 mol % may lead to pattern collapse or an undesired pattern profile. As in the case of polymer PB, the upper limit of the content of recurring units (1) is based on the polymer design that takes into account a dissolution rate in alkaline developer of a combination of polymers used in the resist composition, and largely varies depending on a particular polymer or polymers to be combined. With respect to the upper limit of the content of recurring units (1) in polymer PA, the content of recurring units (1) may be quite high, and specifically, recurring units (1) may be all constituent units of the polymer PA excluding recurring units (3) when the polymer PA is blended with a large proportion of another polymer.

When polymer PA also functions as polymer PB, a single polymer may be used or a polymer blend may be used. Herein, units which are protected with an acid labile group and become alkali soluble under the action of acid are preferably incorporated in polymer PA to insure a degree of freedom in designing a blend of polymers. Such units are preferably units having the above formula (4) and units having the general formula (7):

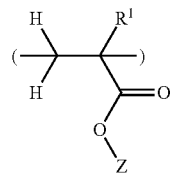

(7)

wherein $R^1$ is hydrogen or methyl, and Z is an acid leaving group having a structure of any of the general formulae (8-1) to (8-8).

(8-1)

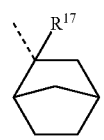

(8-2)

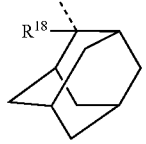

(8-3)

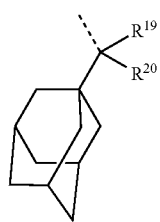

(8-4)

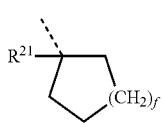

(8-5)

(8-6)

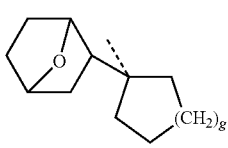

(8-7)

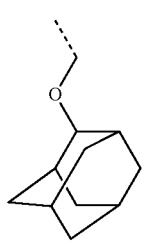

(8-8)

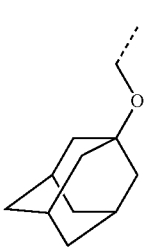

Herein, the broken line designates a valence bond, $R^{17}$, $R^{18}$, $R^{19}$, and $R^{20}$ are each independently a straight or branched $C_1$-$C_4$ alkyl group, $R^{21}$ is a straight or branched $C_1$-$C_4$ alkyl group, cyclopentyl, or cyclohexyl, f is 1 or 2, and g is 1 or 2.

The units which are protected with an acid labile group and become alkali soluble under the action of acid may be of one type or a mixture of two or more types. The content of acid eliminatable units is preferably 5 to 70 mol %, more preferably 10 to 50 mol % whereby a pattern profile having a fine line width and reduced LER may be obtained.

Like polymer PB, units for improving etch resistance by imparting a cyclic structure to the main chain, typically recurring units (5) and/or (6) may be incorporated in polymer PA. The recurring units (5) and (6) each may be of one type or a mixture of two or more types. For the purpose of improving etch resistance, recurring units (5) and (6) are preferably incorporated in a content of at least 5 mol % based on the overall recurring units of the polymer. Where the functional group in recurring units (5) and (6) is polar so that the units serve to impart substrate adhesion or where the substituent group is protected with an acid labile group as mentioned above so that the units become alkali soluble under the action of acid, the content of recurring units (5) and (6) incorporated is added to the content of the relevant units so that the sum may fall in the above-defined range of the relevant units. Where recurring units (5) and (6) have no functional group or where the functional group is otherwise, the content of recurring units (5) and (6) incorporated is preferably up to 30 mol %. Where recurring units (5) and (6) have no functional group or the functional group is otherwise, a content of recurring units (5) and (6) in excess of 30 mol % may cause development defects.

The polymer PA comprises recurring units of formula (3) as essential constituent units. Preferably the polymer PA comprises at least 50 mol %, more preferably at least 70 mol %, and even more preferably at least 85 mol % of recurring units selected from formulae (1) to (7), based on the overall recurring units of polymer PA. While the polymer PA comprises the foregoing recurring units (1) to (7), it may further comprise any additional commonly used recurring units such as (meth)acrylate units protected with an acid labile group and (meth)acrylate units having an adhesive group such as lactone structure. The properties of the resist film may be finely adjusted by controlling the content of the additional recurring units although the additional recurring units may be omitted.

Preferred examples of polymer PA are given below, but not limited thereto. The polymer PA having an acid generating moiety on a side chain may be used alone or in admixture of two or more.

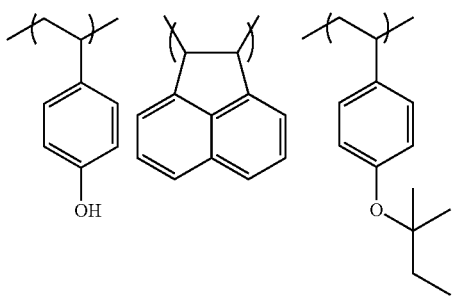

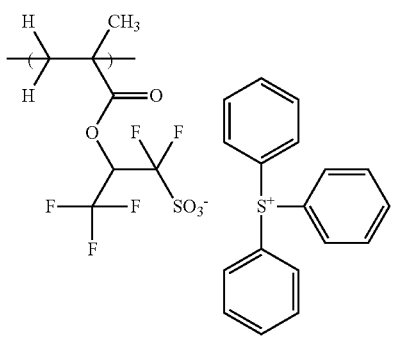

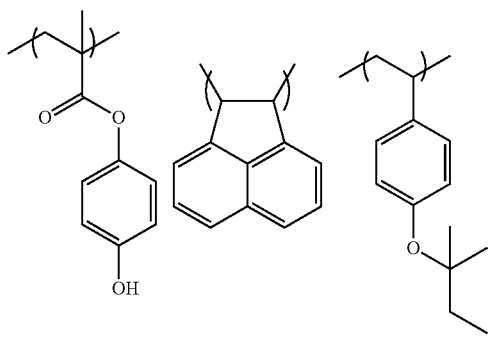

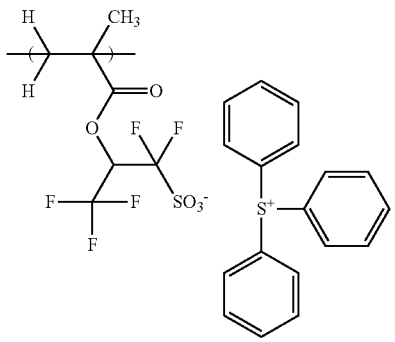

55
-continued
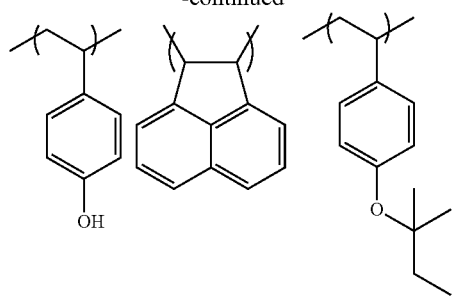
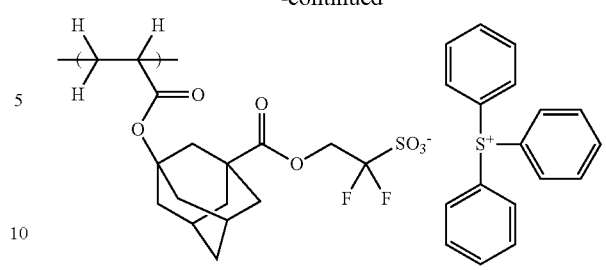
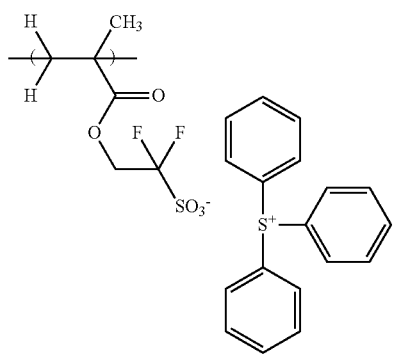
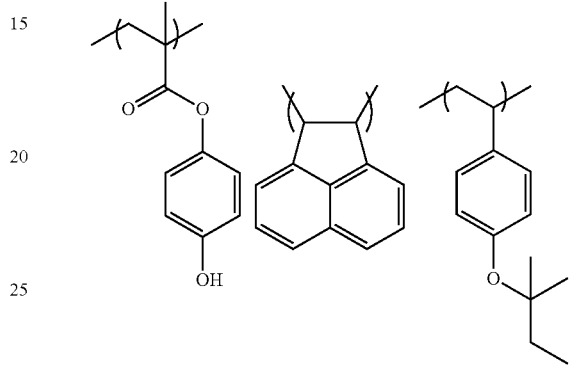
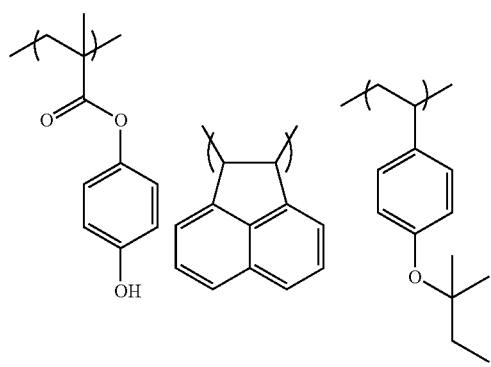
56
-continued
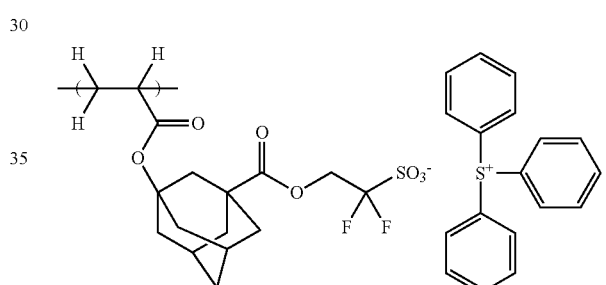
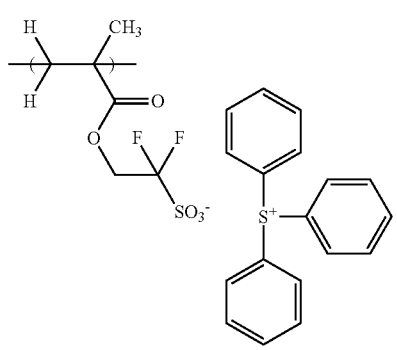
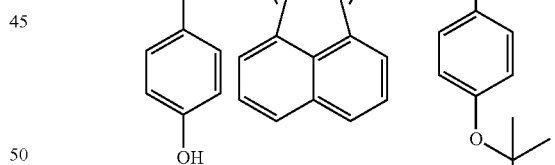
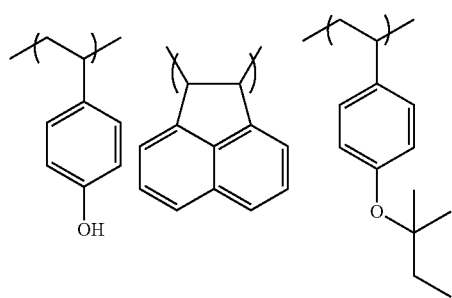
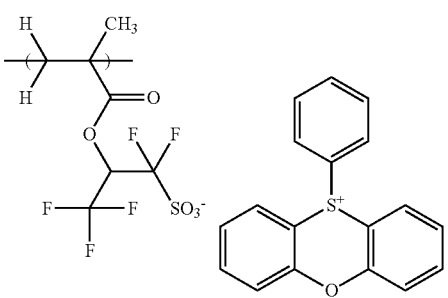

57
-continued
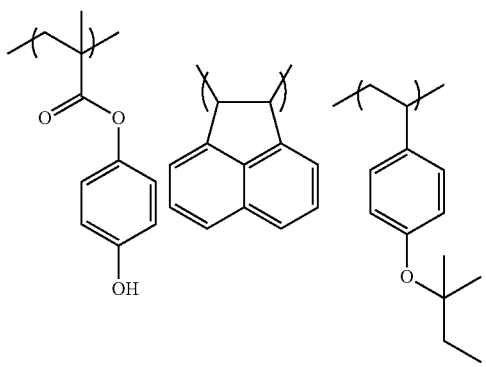
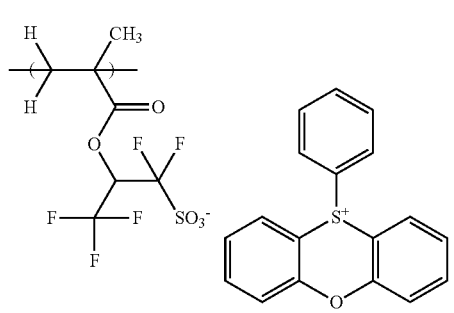
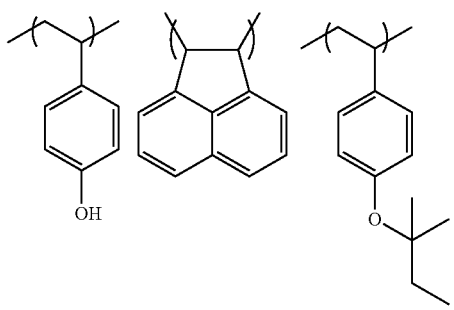
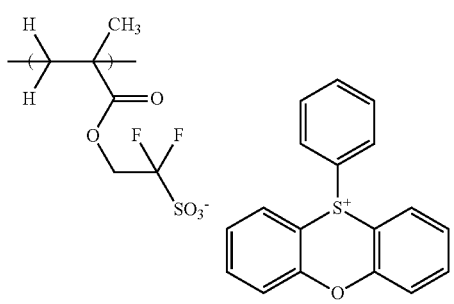
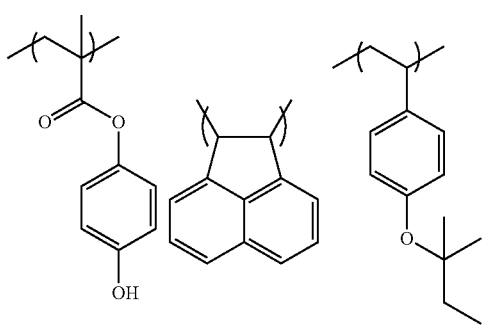
58
-continued
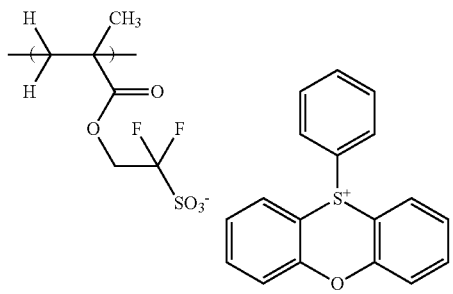
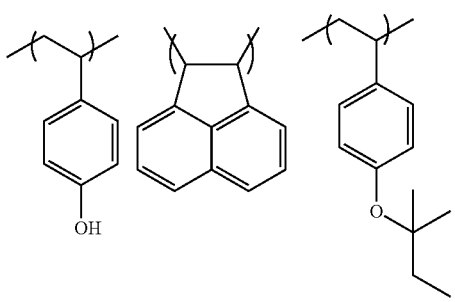
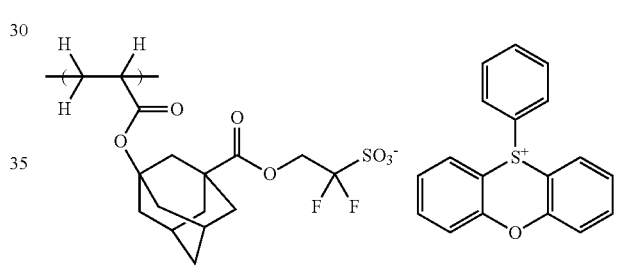
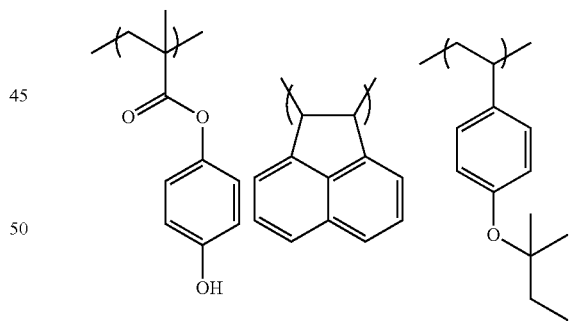
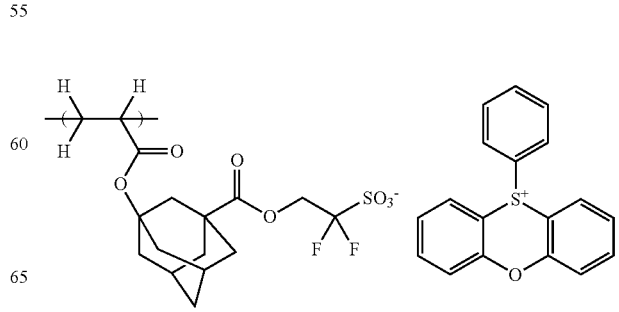

59
-continued
60
-continued
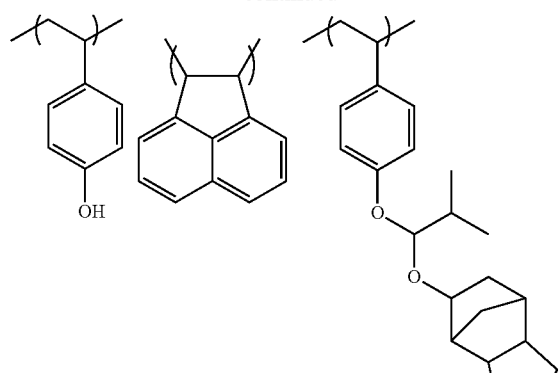
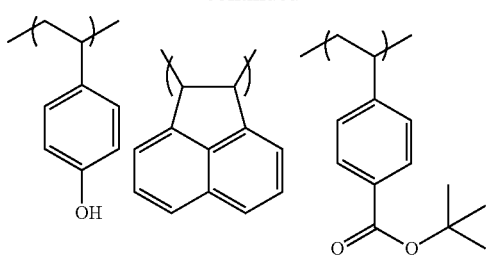
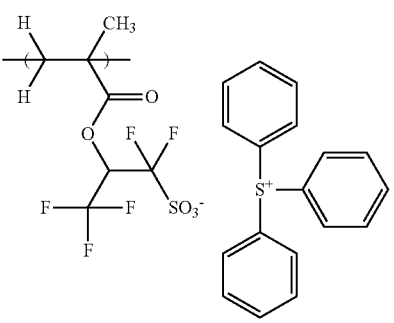
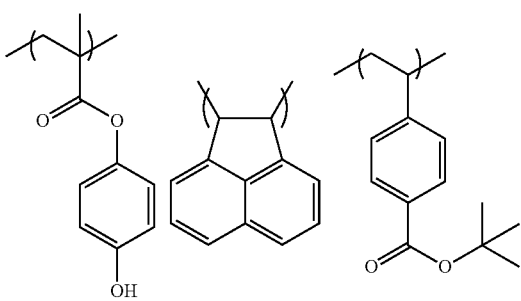
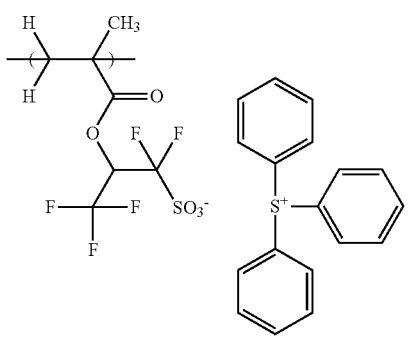
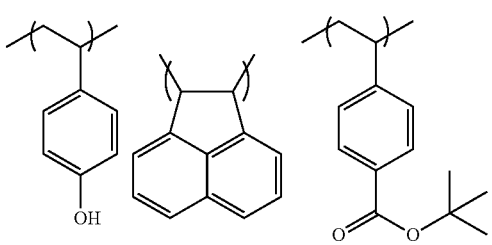

61
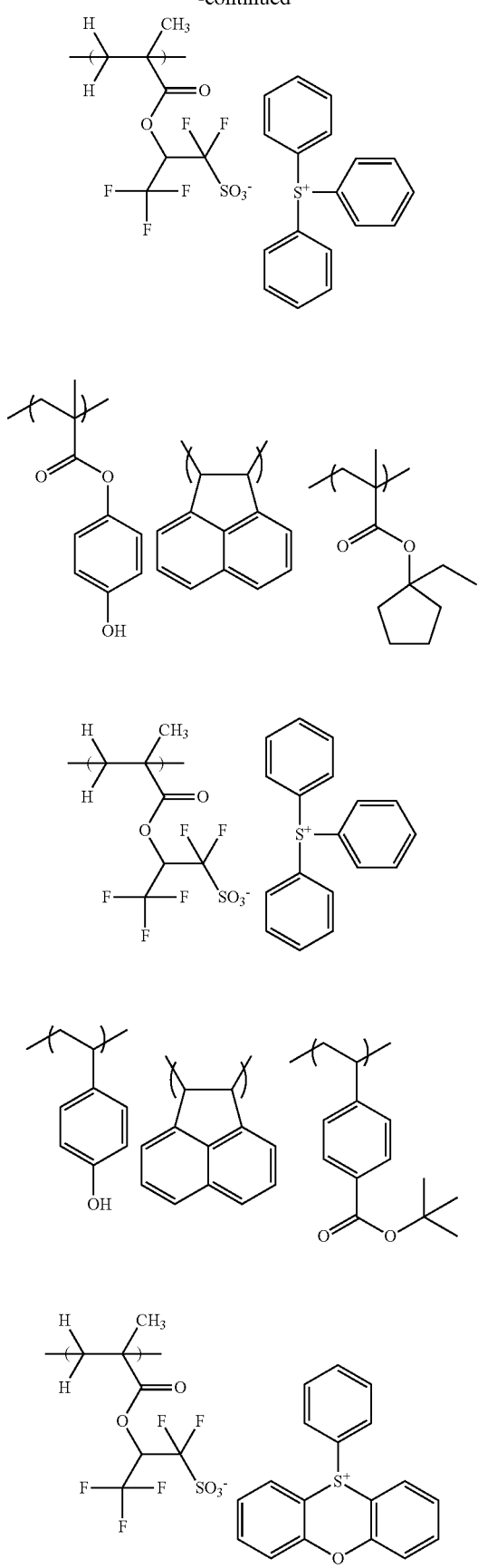
62
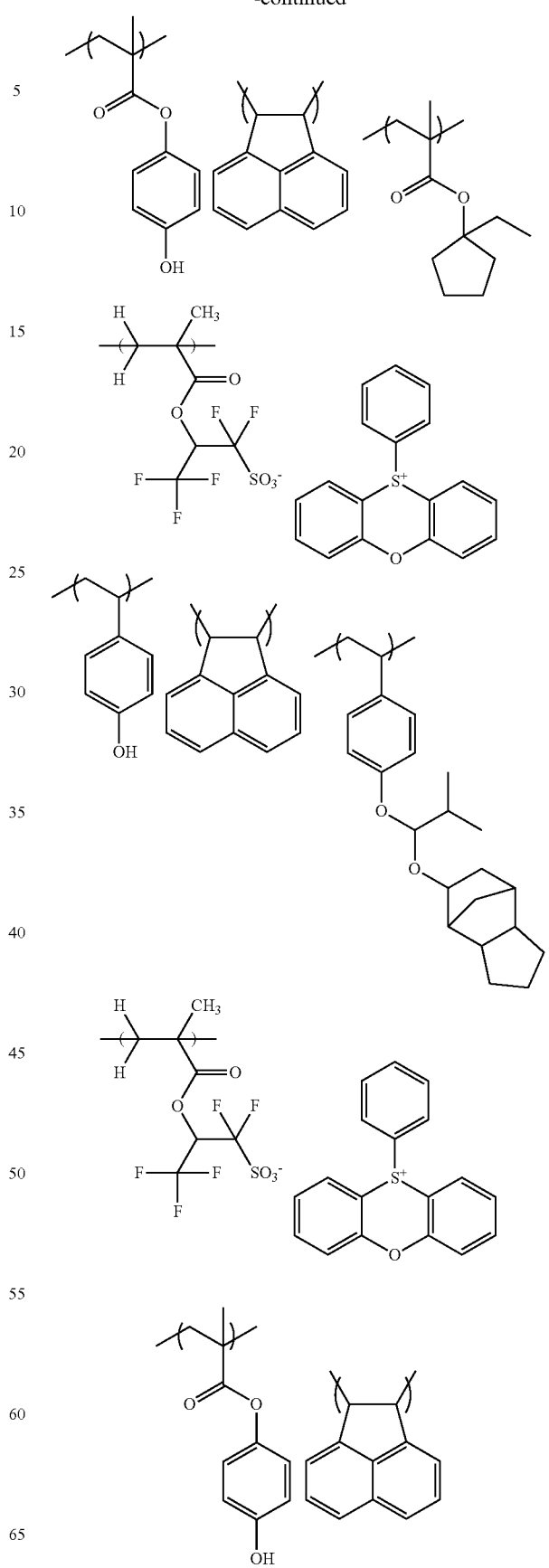

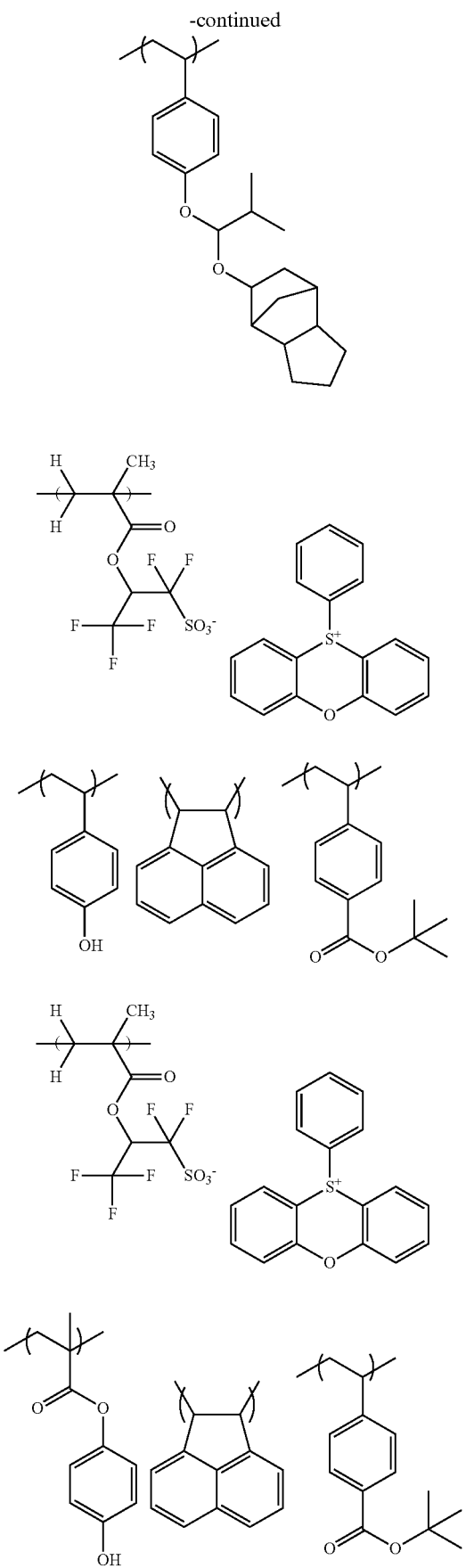
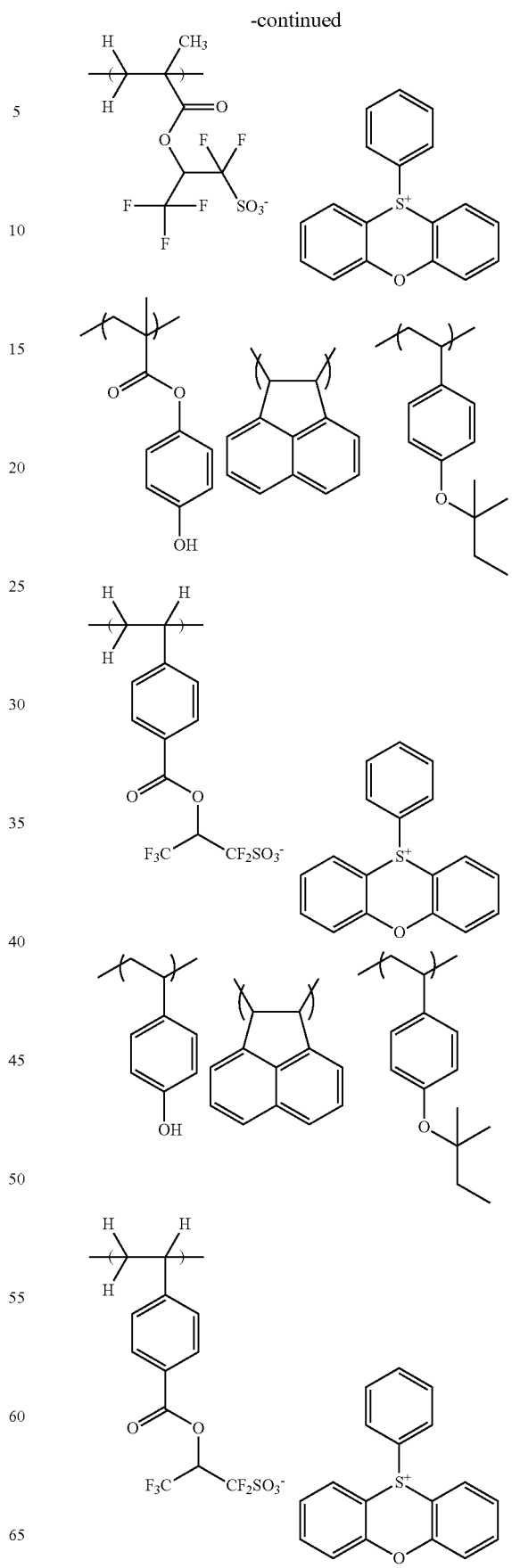

65
-continued
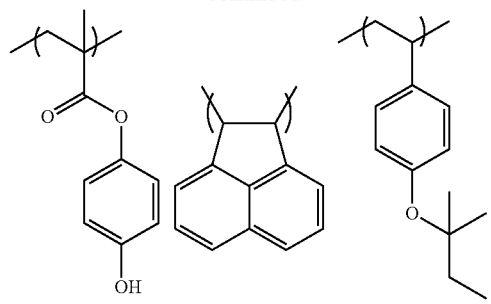
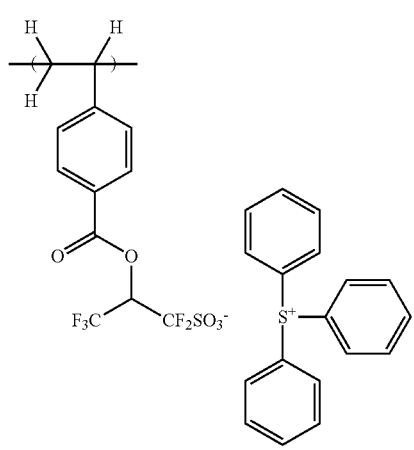
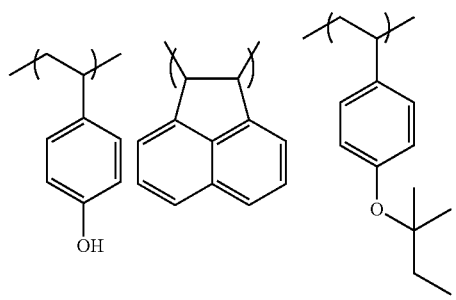
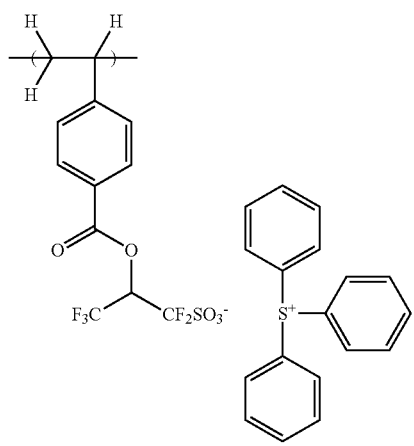
66
-continued
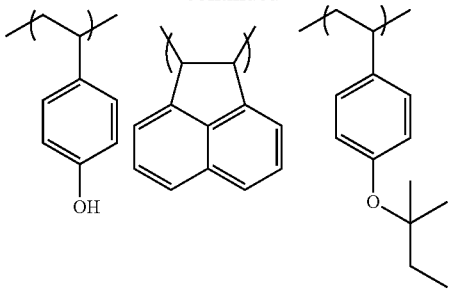
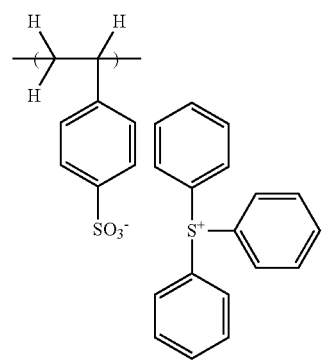
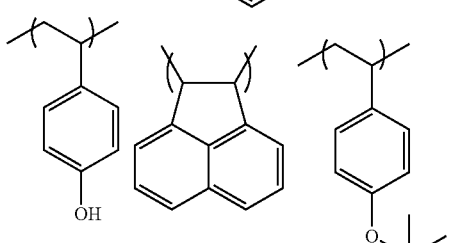
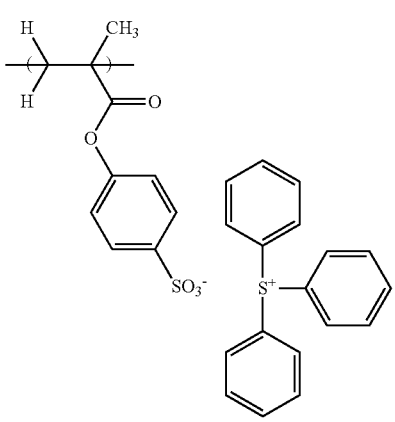
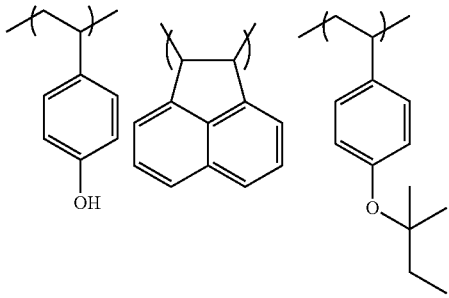

67
-continued
68
-continued
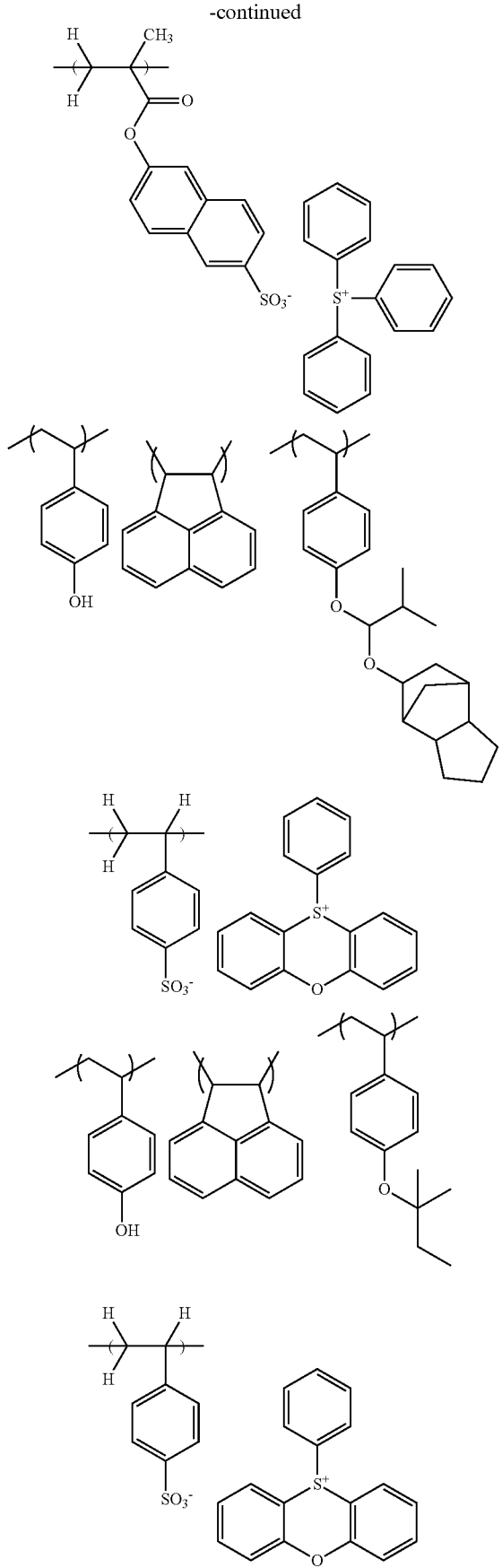
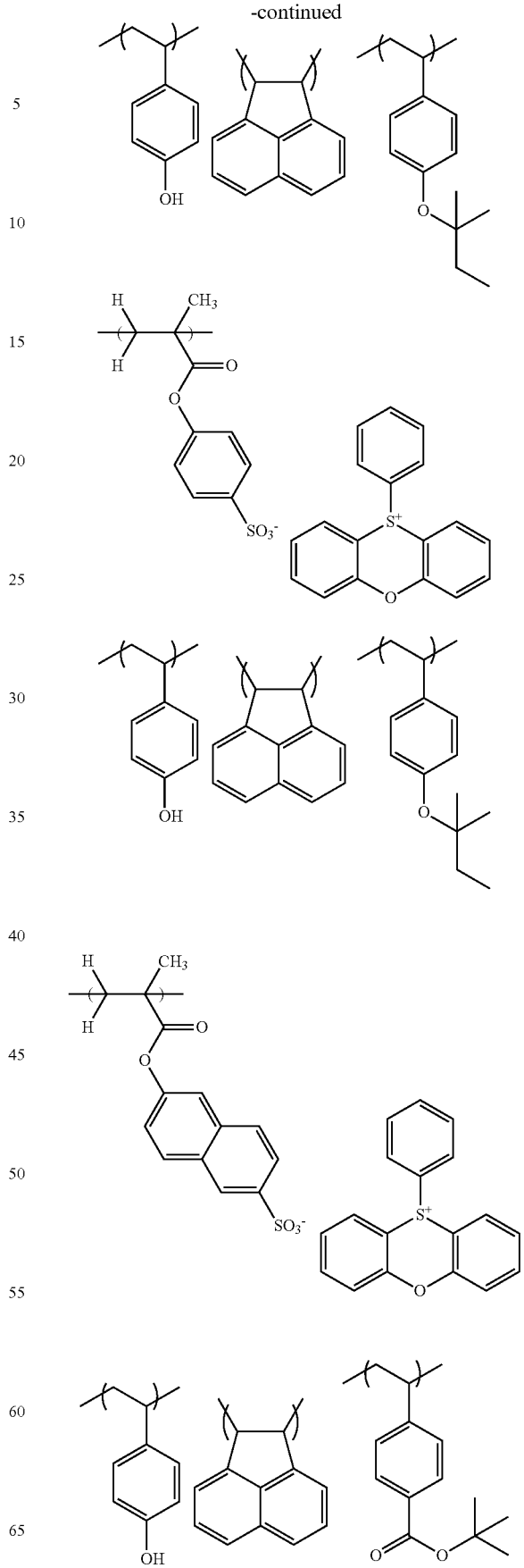

69
-continued
70
-continued
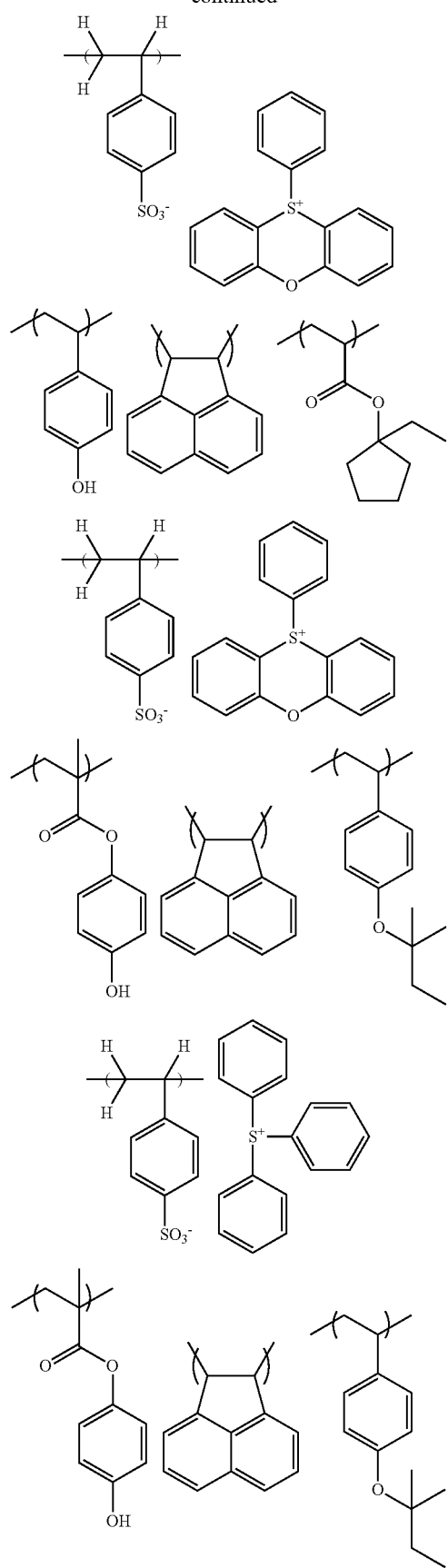
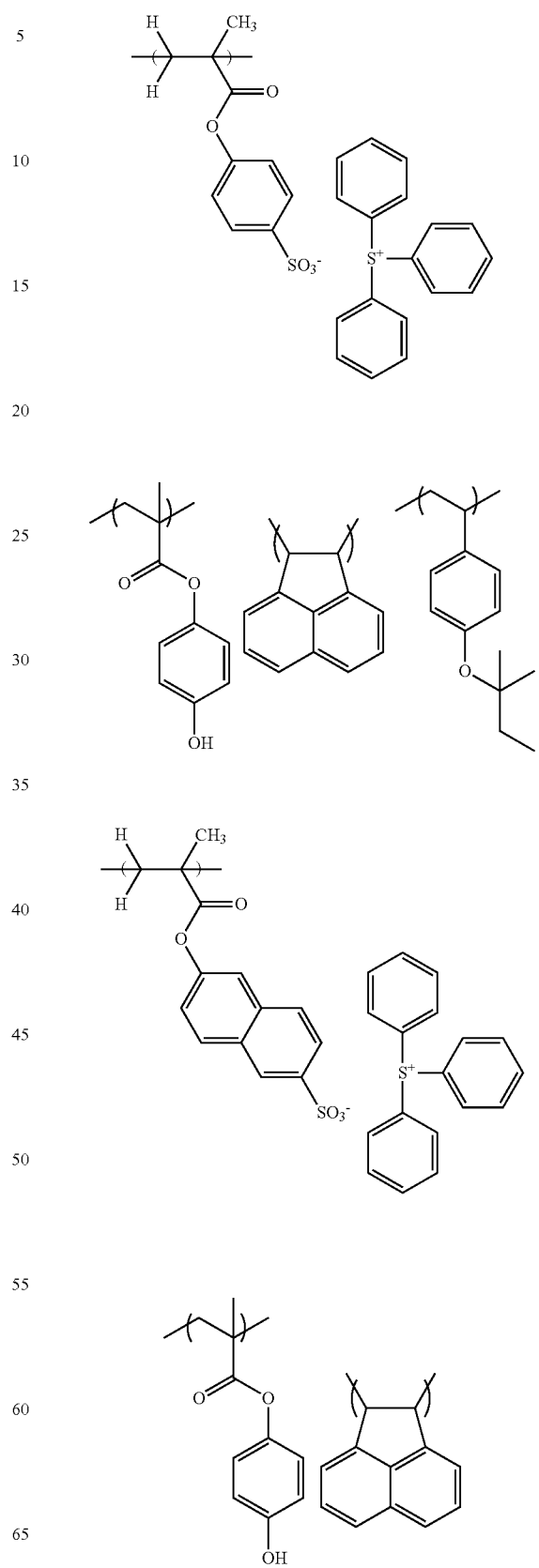

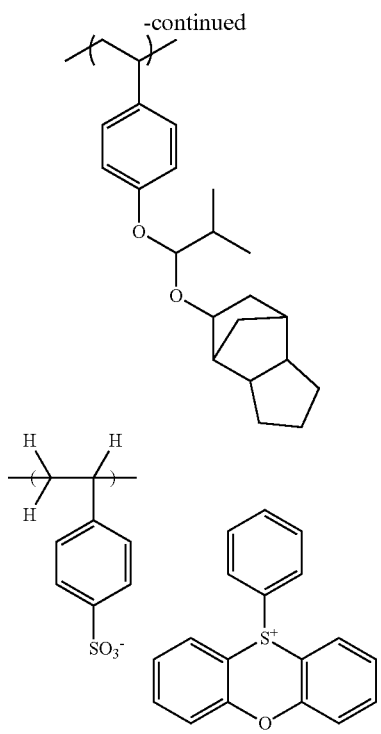

The polymer PB containing a basic component and the polymer PA having an acid generating moiety on a side chain are separately compounded in most embodiments although a single polymer meeting both the functions at the same time may be used in a certain embodiment. Preferably polymer PA and polymer PB are blended in a ratio PA/PB between 99.5/0.5 and 0.5/99.5, more preferably between 99/1 and 1/99 while the polymer design is made such that the contents of constituent units having different function may meet the preferred compositional ratio relative to the overall polymers. The above range of blend ratio provides a balance of base and acid diffusion control to form a pattern of satisfactory profile with a reduced LER.

In addition to the polymer PB containing a basic component and the polymer PA having an acid generating moiety on a side chain, the resist composition may further comprise a polymer comprising neither recurring units of formula (2) nor recurring units of formula (3). A resist composition wherein polymer PA and polymer PB are separately compounded and optionally a polymer not belonging to polymers PA and PB is compounded may suffer from increased roughness because of a microscopic localization of units having a basic function. To exert the maximum effect in theory, it is desirable to use a polymer comprising recurring units of formula (2) and recurring units of formula (3) at the same time and to omit any polymer not belonging to polymers PA and PB. However, it is believed that the undesired diffusion phenomenon of a basic substance which occurs due to solvent evaporation upon resist film formation and the surface energy of substrate and resist film when a basic substance having a low molecular weight of up to 1,000 is used is prevented by converting the basic substance to a high molecular weight form. In fact, even when a certain amount of a polymer not belonging to polymer PB is added to a resist composition, a resist pattern resulting from a resist film of the resist composition is observed to exert the roughness reducing effect. This is also true for polymer PA.

Then, when another polymer not belonging to polymers PA and PB is blended, the content of polymer PA is at least 0.5 wt %, preferably at least 1 wt % and the content of polymer PB is at least 0.5 wt %, preferably at least 1 wt %, based on the overall polymers (100 wt %). If recurring units of formula (2) and recurring units of formula (3) are localized in more amounts, the resist may suffer a loss of resolution and an increase of roughness.

When another polymer comprising neither recurring units of formula (2) nor recurring units of formula (3), i.e., another polymer not belonging to polymers PA and PB is used in addition to the polymer PB containing a basic component and the polymer PA having an acid generating moiety on a side chain, the other polymer should be fully compatible with polymers PA and PB. The other polymer may comprise, in combination, suitable constituent units selected from the recurring units described above as the recurring units to constitute polymers PA and PB excluding recurring units of formulae (2) and (3). It is preferred to use another polymer comprising recurring units (1), recurring units (4) and optionally recurring units (5) and/or (6) in a combination to account for at least 70 mol % based on the entire constituent units so that the other polymer may meet the desired dissolution properties.

It is noted that the polymer in the resist composition may be a single polymer meeting both the functions of polymer PA and polymer PB at the same time, a blend of polymer PA and polymer PB, or a blend of polymer PA, polymer PB, and another polymer not belonging to polymers PA and PB. In any case, the polymer is designed as a whole to comprise respective recurring units in a proper compositional ratio so as to provide a change of solubility in alkaline developer and substrate adhesion as required for the polymer to be formulated in chemically amplified positive resist compositions. While the preferred compositional ratios of recurring units (2) and (3) are as defined above, the whole polymer in the resist composition which is composed mainly of recurring units (1) to (7) is designed such that the content of recurring units (1) is preferably 30 to 90 mol %, more preferably 40 to 80 mol % based on the total recurring units of the polymer(s), the total content of recurring units (4) and (7) is preferably 5 to 50 mol %, more preferably 10 to 45 mol % based on the total recurring units of the polymer(s), and the total content of recurring units (1), (3) and (7) is preferably at least 40 mol % based on the total recurring units of the polymer(s). Where the functional group represented by $R^9$ in recurring units (5) and (6) is neither a hydroxyl group nor a hydroxyl group protected with an acid labile group, the total content of recurring units (5) and (6) is preferably up to 30 mol %. Where the functional group represented by $R^9$ is a hydroxyl group or a hydroxyl group protected with an acid labile group, the content of recurring units (5) and (6) is added to the content of recurring units (1) or (3) so that the sum may fall in the preferred range of recurring units (1) or (3) defined above.

Apart from polymer PA, an acid generator (low molecular weight acid generator) which is not incorporated in recurring units of a polymer may be added to the resist composition. While many acid generators are described, for example, in Patent Documents 1 to 5, any suitable one may be selected from well-known acid generators in accordance with the desired properties to be adjusted. Although a low molecular weight acid generator need not be added in general, it may be used for fine adjustment of pattern profile, for example, a slight improvement in roughness. The low molecular weight acid generator may preferably be added in an amount of less than 5 parts, more preferably up to 3 parts by weight per 100 parts by weight of the overall polymers because addition of at least 5 parts of the low molecular weight acid generator mat detract from the effect of the acid generator bound to polymer PA. In particular, the acid generator capable of generating a low molecular weight sulfonic acid, typically a sulfonic acid of no more than 6 carbon atoms is preferably added in an amount of up to 2 parts by weight on the same basis. Where the low molecular weight acid generator is used for the above purpose, it may be added in an amount of at least 0.1 part by weight to exert a significant effect on the pattern profile.

Generally a basic compound is an essential component in a chemically amplified resist composition comprising a polymer having no acid generating units bound thereto. In the resist composition of the invention, a basic compound need not be positively added because a basic component has been incorporated in the polymer. Nevertheless, it is acceptable to add a basic compound for adjustment to an optimum sensitivity or for providing a high resolution. The basic compound may preferably be added in an amount of 0.01 to 3 parts, more preferably 0.03 to 1 part by weight per 100 parts by weight of the polymers. A number of basic compounds which can be used herein are known, for example, from Patent Documents 1 to 5. Examples include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, carbamate derivatives, and ammonium salts. Numerous examples of these basic compounds are described in Patent Document 2. Generally any of these basic compounds may be used. Two or more may be selected from these basic compounds and used in admixture.

Examples of the basic compound which is preferably compounded herein include tris(2-(methoxymethoxy)ethyl) amine N-oxide, morpholine derivatives, and imidazole derivatives.

An amine is effective when a resist pattern is formed on a substrate, typically a substrate having a surface layer of chromium compound, which is susceptible to a phenomenon that the resist film becomes substantially insoluble at the substrate interface during pattern formation, known as a footing phenomenon. Specifically, an amine compound or amine oxide compound having a carboxyl group, but free of hydrogen in covalent bond with nitrogen serving as basic center (exclusive of those amine and amine oxide compounds whose nitrogen atom is contained in the cyclic structure of aromatic ring) is effectively used for improving the pattern profile.

Preferred examples of the amine or amine oxide compound having a carboxyl group, but free of hydrogen in covalent bond with nitrogen serving as basic center include compounds of the general formulae (10) to (12), but are not limited thereto.

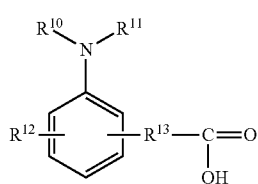
(10)

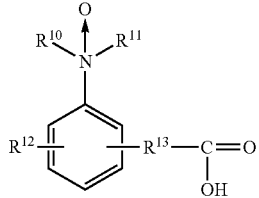
(11)

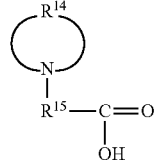
(12)

Herein $R^{10}$ and $R^{11}$ are each independently a straight, branched or cyclic $C_1$-$C_{20}$ alkyl group, $C_6$-$C_{20}$ aryl group, $C_7$-$C_{20}$ aralkyl group, $C_1$-$C_{10}$ hydroxyalkyl group, $C_2$-$C_{10}$ alkoxyalkyl group, $C_2$-$C_{10}$ acyloxyalkyl group, or $C_2$-$C_{10}$ alkylthioalkyl group. $R^{10}$ and $R^{11}$ may bond together to form a ring with the nitrogen atom to which they are attached. $R^{12}$ is hydrogen, a straight, branched or cyclic $C_1$-$C_{20}$ alkyl group, $C_6$-$C_{20}$ aryl group, $C_7$-$C_{20}$ aralkyl group, $C_1$-$C_{10}$ hydroxyalkyl group, $C_2$-$C_{10}$ alkoxyalkyl group, $C_2$-$C_{10}$ acyloxyalkyl group, $C_2$-$C_{10}$ alkylthioalkyl group, or halogen. $R^{13}$ is a single bond, a straight, branched or cyclic $C_1$-$C_{20}$ alkylene group, or $C_6$-$C_{20}$ arylene group. $R^{14}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group. $R^{15}$ is a straight, branched or cyclic $C_1$-$C_{20}$ alkylene group or $C_6$-$C_{20}$ arylene group.

Exemplary groups in these structural formulae are given below, but not limited thereto. Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_1$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and isomers of their alkyl moiety. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_2$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl.

Preferred examples of the amine compound of formula (10) include, but are not limited thereto, o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalenic acid, 3-diethylamino-2-naphthalenic acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllacetic acid, 2-(4-dimethylaminophenyl)benzoic acid, and 2-(4-(dibutylamino)-2-hydroxybenzoyl)benzoic acid.

Preferred examples of the amine oxide compound of formula (11) include oxidized forms of exemplary amine compounds of formula (10), but are not limited thereto.

Preferred examples of the amine compound of formula (12) include, but are not limited thereto, 1-piperidinepropionic acid, 1-piperidinebutyric acid, 1-piperidinemalic acid, 1-piperidinepyruvic acid, and 1-piperidinelactic acid.

Some of the compounds having an amine oxide structure represented by formula (11) are existing and some are novel compounds. They may be prepared by selecting an optimum method in accordance with a particular structure. Exemplary non-limiting methods include oxidizing reaction of a nitrogen-containing compound using an oxidizing agent and oxidizing reaction of a nitrogen-containing compound in a hydrogen peroxide water diluted solution. These methods are described below in detail.

One exemplary method for preparing a nitrogen-containing alcohol compound through esterifying reaction is shown below. This method is applicable to the synthesis of a compound of formula (11).

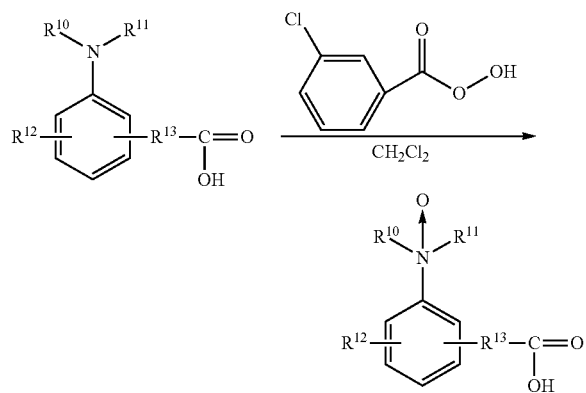

Herein $R^{10}$ to $R^{13}$ are as defined above.

This reaction is an oxidizing reaction of an amine using an oxidizing agent, m-chloroperbenzoic acid. The reaction may be performed using other oxidizing agents commonly employed in standard oxidizing reaction. Following the reaction, the reaction mixture may be purified by standard techniques such as distillation, chromatography and recrystallization. Reference is made to Patent Document 5.

To the resist composition, any of surfactants commonly used for improving coating characteristics may be added. While a number of surfactants are well known and described in Patent Documents 1 to 5, any suitable one may be selected therefrom.

In the resist composition, the surfactant is preferably formulated in an amount of up to 2 parts, and more preferably up to 1 part by weight, per 100 parts by weight of the overall polymers. When used, the surfactant is preferably added in an amount of at least 0.01 part by weight.

An organic solvent may be used in the preparation of the resist composition. It may be any of organic solvents in which the polymers, acid generator and other additives are dissolvable. Suitable organic solvents include, but are not limited to, ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in admixture. Of these solvents, ethyl lactate, propylene glycol monomethyl ether, PGMEA, and mixtures thereof are preferred because the acid generator is most soluble therein.

In the resist composition, the organic solvent is preferably used in an amount of 1,000 to 10,000 parts by weight, more preferably 2,000 to 9,700 parts by weight per 100 parts by weight of the overall polymers. When adjusted to such a concentration, the resist composition is applicable by a spin coating technique to form a resist film having a thickness of 10 to 200 nm and an improved flatness in a consistent manner.

Process

Pattern formation using the resist composition of the invention may be performed by well-known lithography processes. The process generally involves coating, prebaking, exposure, PEB, and development with alkaline developer. The resist composition is first applied onto a substrate for IC fabrication (silicon wafer having a surface layer of Si, $SiO_2$, SiN, SiON, TiN, WSi, BPSG, SOG, organic antireflective coating or the like) or a substrate for mask circuit fabrication (quartz substrate having a surface layer of Cr, CrO, CrON, MoSi or the like) by a suitable coating technique such as spin coating. The coating is prebaked on a hot plate at a temperature of 60 to 150° C. for 1 to 10 minutes, preferably 80 to 140° C. for 1 to 5 minutes to form a resist film of 0.05 to 2.0 μm thick.

Then the resist film is exposed to high-energy radiation, typically deep-UV, EUV, excimer laser or x-ray through a mask having a desired pattern. Alternatively, a pattern is written on the resist film directly with EB. The exposure dose is preferably 1 to 200 mJ/cm², more preferably 10 to 100 mJ/cm². The exposure may be performed by conventional lithography whereas the immersion lithography of holding a liquid between the mask and the resist film may be employed if desired. In this case, a protective film which is insoluble in water may be applied on the resist film. The resist film is then baked (PEB) on a hot plate at 60 to 150° C. for 1 to 5 minutes, preferably 80 to 140° C. for 1 to 3 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

One advantage is that the resist film has high etch resistance. Also the resist composition is effective when it is required that the pattern experience a minimal change of line width even when the duration between exposure and PEB is prolonged. Because of these advantages, the resist composition is effective in processing a photomask blank by EB lithography process which requires a long time for patternwise exposure.

Example

Synthesis Examples, Examples, and Comparative Examples are given below by way of illustration and not by way of limitation. The average molecular weights including weight average molecular weight (Mw) and number average molecular weight (Mn) are determined by gel permeation chromatography (GPC) versus polystyrene standards, from which a dispersity (Mw/Mn) is computed. Me stands for methyl. The compositional ratio of a copolymer is on a molar basis.

Polymer Synthesis Example 1

In a 200-mL dropping funnel under nitrogen blanket, a solution was prepared by dissolving 22.3 g of 4-hydroquinone monomethacrylate, 5.7 g of acenaphthylene, 21.4 g of 4-amyloxystyrene, 0.55 g of a monomer Z-1 of the structure shown below, and 5.1 g of dimethyl 2,2'-azobis(2-methyl-propionate) (V601, Wako Pure Chemical Industries, Ltd.) in 64 g of methyl ethyl ketone (MEK) as a solvent. A 300-mL polymerization flask was purged with nitrogen, charged with 53 g of MEK, and heated at 80° C., after which the solution was added dropwise to the flask over 4 hours. After the completion of dropwise addition, stirring was continued for 16 hours while maintaining the polymerization temperature of 80° C. The polymerization solution was then cooled down to room temperature and added dropwise to 1,000 g of hexane for precipitation. The copolymer precipitate was collected by filtration and washed twice with 200 g of hexane. The mass collected by filtration was dissolved in 120 g of MEK. The MEK solution was passed through a nylon filter with a pore size of 0.02 μm and added dropwise to 1,000 g of hexane for precipitation. The copolymer precipitate was collected by filtration, washed twice with 200 g of hexane, and dried, yielding 48 g of a white copolymer, designated Polymer 1, having Mw=3,730 and Mw/Mn=1.62.

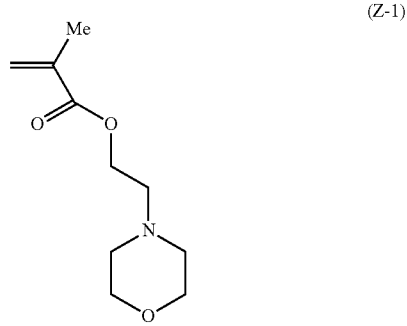

(Z-1)

Polymer Synthesis Example 2

In a 200-mL dropping funnel under nitrogen blanket, a solution was prepared by dissolving 25.6 g of 4-(1-ethoxyethoxy)styrene, 4.1 g of acenaphthylene, 19.8 g of 4-amyloxystyrene, 0.53 g of monomer Z-1 of the above structure, and 4.9 g of dimethyl 2,2'-azobis(2-methyl-propionate) (V601, Wako Pure Chemical Industries, Ltd.) in 64 g of propylene glycol monomethyl ether (PGME) as a solvent. A 300-mL polymerization flask was purged with nitrogen, charged with 53 g of PGME, and heated at 80° C., after which the solution was added dropwise to the flask over 4 hours. After the completion of dropwise addition, stirring was continued for 20 hours while maintaining the polymerization temperature of 80° C. Thereafter, the polymerization solution was cooled down to room temperature, combined with 18 g of methanol and 0.85 g of oxalic acid dihydrate, and stirred at 50° C. for 3 hours. The reaction solution was added dropwise to a mixture of 1,620 g of water and 30 g of methanol for precipitation. The copolymer precipitate was collected by filtration, washed twice with a mixture of 490 g of water and 10 g of methanol, and dried, yielding 36.0 g of a white hydroxystyrene copolymer, designated Polymer 2, having Mw=5,470 and Mw/Mn=1.64.

Polymer Synthesis Example 3

A polymer was obtained by introducing hydroxystyrene units according to the same procedure as Polymer Synthesis Example 2 except that the type and amount of monomers were changed. The polymer was further reacted with 1-chloro-1-methoxy-2-methylpropane under basic conditions to produce an acetal-modified polymer, designated Polymer 3, having Mw=5,860 and Mw/Mn=1.65.

With respect to the deprotection and protection of polyhydroxystyrene derivative, reference may be made to Patent Documents 6 and 7.

Polymer Synthesis Example 4

In a 200-mL dropping funnel under nitrogen blanket, a solution was prepared by dissolving 21.2 g of 4-hydroquinone monomethacrylate, 5.6 g of acenaphthylene, 18.9 g of 4-amyloxystyrene, 0.53 g of monomer Z-1 of the above structure, 3.7 g of a monomer Z-2 of the structure shown below, and 4.9 g of dimethyl 2,2'-azobis(2-methylpropionate) (V601, Wako Pure Chemical Industries, Ltd.) in 64 g of methyl ethyl ketone (MEK) as a solvent. A 300-mL polymerization flask was purged with nitrogen, charged with 53 g of MEK, and heated at 80° C., after which the solution was added dropwise to the flask over 4 hours. After the completion of dropwise addition, stirring was continued for 16 hours while maintaining the polymerization temperature of 80° C. The polymerization solution was then cooled down to room temperature and added dropwise to 1,000 g of hexane for precipitation. The copolymer precipitate was collected by filtration and washed twice with 200 g of hexane. The mass collected by filtration was dissolved in 120 g of MEK. The MEK solution was passed through a nylon filter with a pore size of 0.02 μm and added dropwise to 1,000 g of hexane for precipitation. The copolymer precipitate was collected by filtration, washed twice with 200 g of hexane, and dried, yielding 48 g of a white copolymer, designated Polymer 4, having Mw=4,400 and Mw/Mn=1.61.

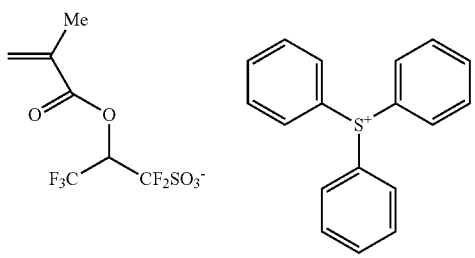
(Z-2)

Polymer Synthesis Examples 5 to 34

Resins (Polymers 5 to 34) shown in Table 1 were synthesized by the same procedure as Polymer Synthesis Example 1, 2 or 3 except that the type and amount of monomers were changed. The units 1 to 5 in Table 1 have the structure shown in Table 2. In Table 1, a ratio of each unit incorporated is on a molar basis.

TABLE 1

| Resin | Unit 1 (ratio) | Unit 2 (ratio) | Unit 3 (ratio) | Unit 4 (ratio) | Unit 5 (ratio) |
|---|---|---|---|---|---|
| Polymer 1 | A-1(0.45) | B-1(0.40) | D-2(0.14) | Z-1(0.01) | — |
| Polymer 2 | A-2(0.50) | B-1(0.39) | D-2(0.10) | Z-1(0.01) | — |
| Polymer 3 | A-2(0.51) | C-1(0.38) | D-2(0.10) | Z-1(0.01) | — |
| Polymer 4 | A-1(0.45) | B-1(0.37) | D-2(0.14) | Z-1(0.01) | Z-2(0.03) |
| Polymer 5 | A-1(0.45) | B-1(0.41) | D-1(0.13) | Z-1(0.01) | — |
| Polymer 6 | A-3(0.55) | B-1(0.34) | D-2(0.10) | Z-1(0.01) | — |
| Polymer 7 | A-1(0.45) | B-2(0.41) | D-2(0.13) | Z-1(0.01) | — |
| Polymer 8 | A-1(0.45) | B-3(0.41) | D-2(0.13) | Z-1(0.01) | — |
| Polymer 9 | A-2(0.50) | B-3(0.39) | D-2(0.10) | Z-1(0.01) | — |
| Polymer 10 | A-1(0.45) | C-2(0.40) | D-2(0.13) | Z-1(0.01) | — |
| Polymer 11 | A-1(0.45) | C-4(0.40) | D-2(0.13) | Z-1(0.01) | — |
| Polymer 12 | A-1(0.46) | C-5(0.40) | D-2(0.13) | Z-1(0.01) | — |
| Polymer 13 | A-2(0.50) | B-2(0.39) | D-2(0.10) | Z-1(0.01) | — |
| Polymer 14 | A-2(0.50) | C-2(0.39) | D-2(0.10) | Z-1(0.01) | — |
| Polymer 15 | A-2(0.50) | C-3(0.39) | D-2(0.10) | Z-1(0.01) | — |
| Polymer 16 | A-1(0.45) | B-1(0.35) | D-2(0.15) | Z-1(0.05) | — |
| Polymer 17 | A-2(0.45) | B-1(0.35) | D-2(0.15) | Z-1(0.05) | — |
| Polymer 18 | A-1(0.45) | B-1(0.32) | D-2(0.13) | Z-1(0.10) | — |
| Polymer 19 | A-2(0.50) | B-1(0.30) | D-2(0.10) | Z-1(0.10) | — |
| Polymer 20 | A-1(0.45) | B-3(0.32) | D-2(0.13) | Z-1(0.10) | — |
| Polymer 21 | A-2(0.50) | B-3(0.30) | D-2(0.10) | Z-1(0.10) | — |
| Polymer 22 | A-2(0.51) | C-1(0.29) | D-1(0.10) | Z-1(0.10) | — |
| Polymer 23 | A-1(0.45) | B-1(0.32) | D-1(0.13) | Z-1(0.10) | — |
| Polymer 24 | A-1(0.45) | B-2(0.32) | D-2(0.13) | Z-1(0.10) | — |
| Polymer 25 | A-1(0.45) | C-2(0.31) | D-2(0.13) | Z-1(0.10) | — |
| Polymer 26 | A-1(0.45) | C-4(0.31) | D-2(0.13) | Z-1(0.10) | — |
| Polymer 27 | A-1(0.46) | C-5(0.31) | D-2(0.13) | Z-1(0.10) | — |
| Polymer 28 | A-2(0.50) | B-2(0.30) | D-2(0.10) | Z-1(0.10) | — |
| Polymer 29 | A-2(0.50) | C-2(0.30) | D-2(0.10) | Z-1(0.10) | — |
| Polymer 30 | A-2(0.50) | C-3(0.30) | D-2(0.10) | Z-1(0.10) | — |
| Polymer 31 | A-1(0.80) | Z-1(0.20) | — | — | — |
| Polymer 32 | A-2(0.80) | Z-1(0.20) | — | — | — |
| Polymer 33 | A-1(0.60) | Z-1(0.40) | — | — | — |
| Polymer 34 | A-2(0.60) | Z-1(0.40) | — | — | — |

TABLE 2

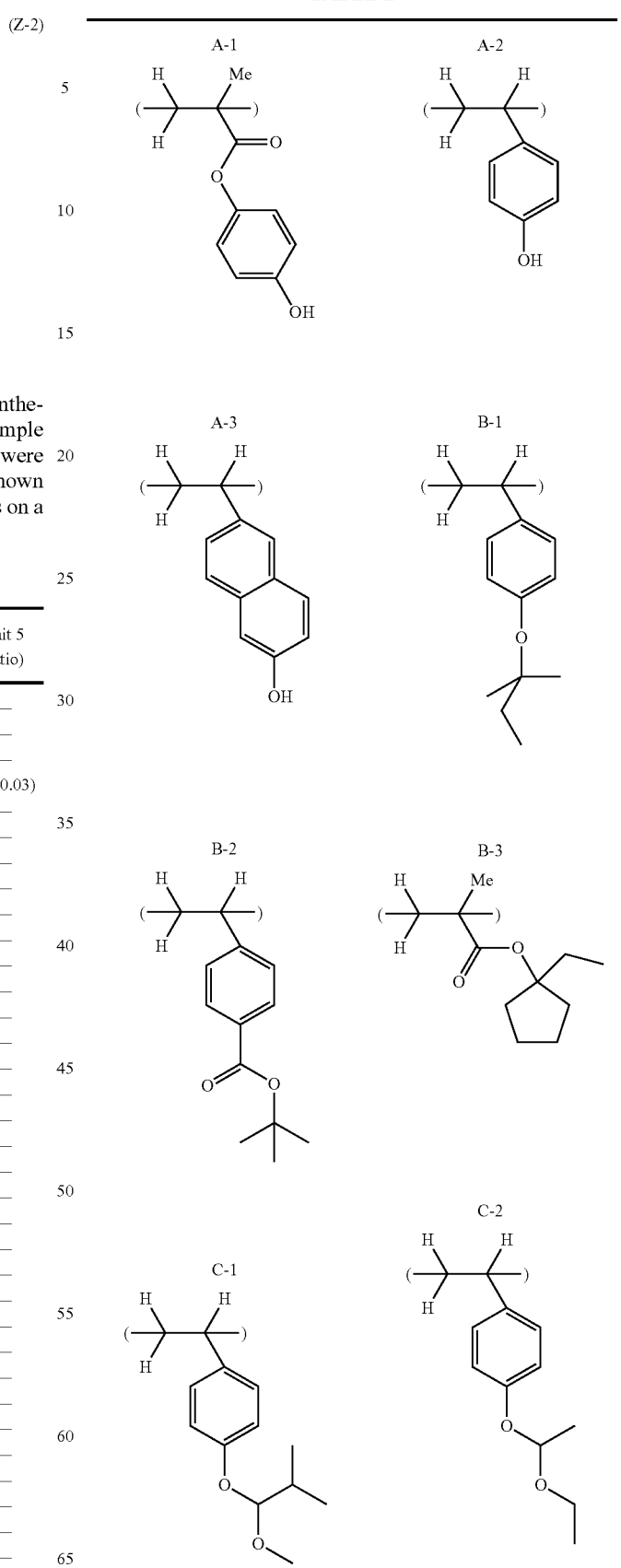

TABLE 2-continued

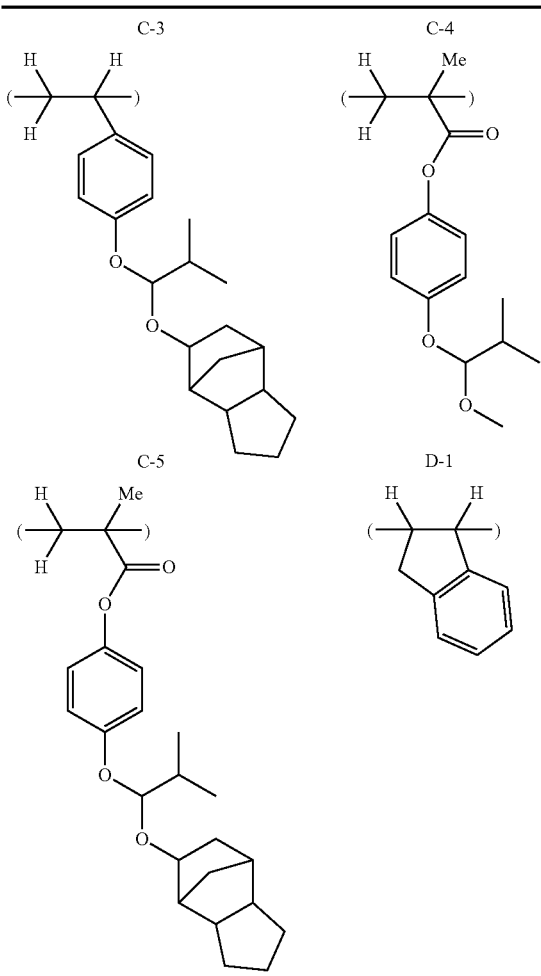

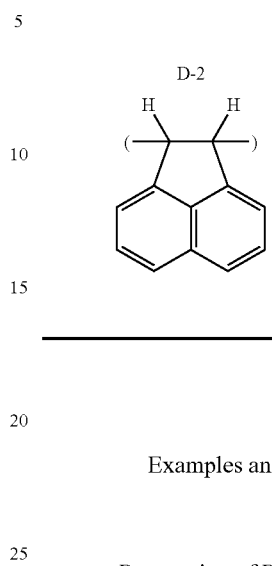

Examples and Comparative Examples

Preparation of Positive Resist Compositions

Resist compositions were prepared by using resins (Polymers 1 to 34) and other resins (Polymers M, N, P and Q), and dissolving the polymers, an acid generator (PAG-A), and a basic compound (Base-1) in an organic solvent mixture in accordance with the recipe shown in Tables 3 to 5. These compositions were each filtered through a nylon or UPE filter having a pore size of 0.02 μm, thereby giving positive resist composition solutions.

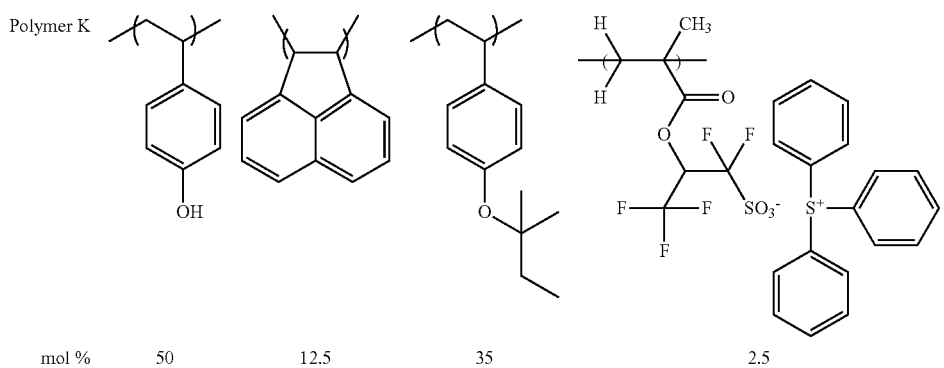

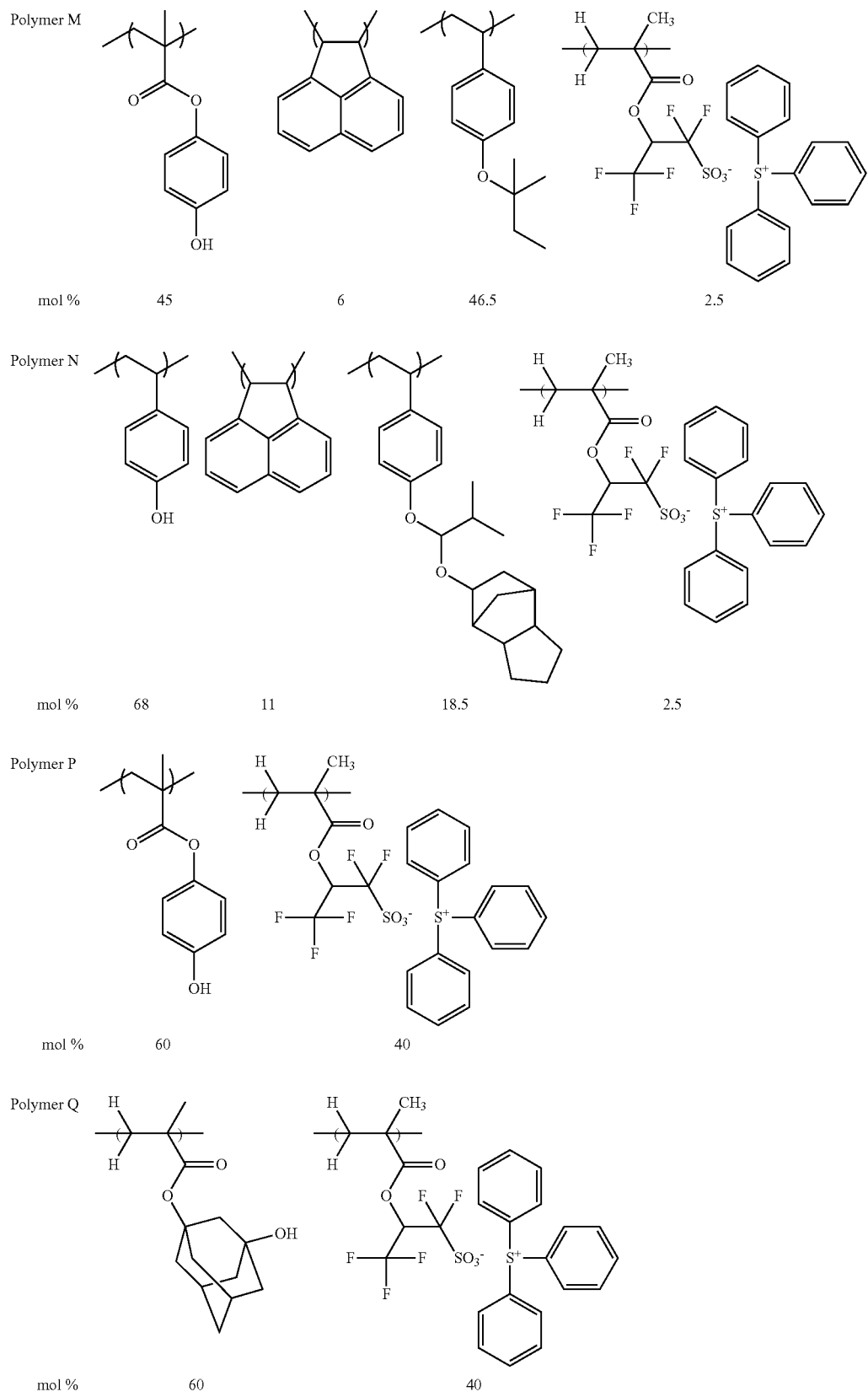

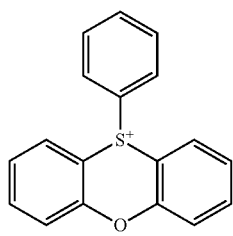

PAG-A

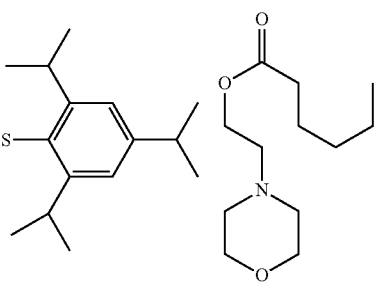

Base-1

Polymer N was synthesized as follows.
Synthesis of Polymer N

In a 1000-mL dropping funnel under nitrogen blanket, a solution was prepared by dissolving 170.39 g of 4-(1-ethoxyethoxy)styrene, 15.42 g of acenaphthylene, 14.19 g of triphenylsulfonium 1,1,3,3,3-pentafluoro-2-methacryloyl-oxypropane-1-sulfonate, and 18.66 g of dimethyl 2,2'-azobis(2-methylpropionate) (V601, Wako Pure Chemical Industries, Ltd.) in 180 g of methyl ethyl ketone (MEK) as a solvent. A 2000-mL polymerization flask was purged with nitrogen, charged with 120 g of MEK, and heated at 80° C., after which the solution was added dropwise to the flask over 4 hours. After the completion of dropwise addition, stirring was continued for 20 hours while maintaining the polymerization temperature of 80° C. The polymerization solution was then cooled down to room temperature. The solution was combined with 200 g of methanol and 4.00 g of oxalic acid dihydrate and stirred for 5 hours at 50° C. The solution was cooled down to room temperature and 4 g of pyridine was added for neutralization. The reaction solution was concentrated, after which washing/separating operation of dissolving the concentrate in 500 g of ethyl acetate, adding 200 g of water, washing and separation was repeated 6 times. After the completion of separatory operation, the organic layer or ethyl acetate solution was concentrated, the concentrate was dissolved in 350 g of acetone, and the acetone solution was added dropwise to 8 L of water for precipitation. The copolymer precipitate was collected by filtration, washed twice with 2 L of water, and dried at 50° C. over 24 hours, yielding 140 g of a copolymer, designated Base Polymer 1, having Mw=4,848 and Mw/Mn=1.46.

Base polymer 1

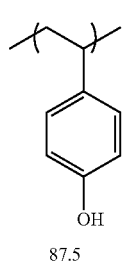

87.5

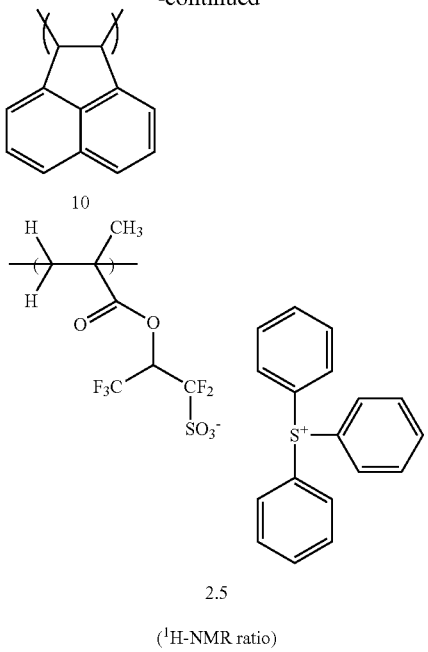

($^1$H-NMR ratio)

In a nitrogen atmosphere, a 100-mL reactor was charged with 10 g of Base Polymer 1 and 40 g of THF, which solution was concentrated. The concentrate was again dissolved in 30 g of THF, to which a catalytic amount (0.6 g) of methanesulfonic acid was added. From a dropping funnel to the reactor in a nitrogen atmosphere at a controlled temperature of 0-5° C., 4.76 g of 8-(2'-methylpropenyloxy)-tricyclo[5.2.1.0$^{2,6}$]decane of the formula:

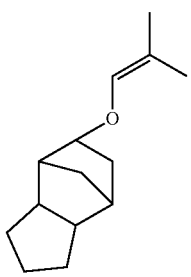

was added dropwise under acidic conditions. After the completion of dropwise addition, the solution was aged for 6 hours. Thereafter, 0.66 g of triethylamine was added to the reaction solution for neutralization. The reaction solution was added dropwise to 240 g of hexane for precipitation. The polymer precipitate was collected by filtration, and washed twice with 50 g of hexane, after which washing/separating operation of dissolving the polymer in 35 g of ethyl acetate, adding 20 g of water, washing and separating was repeated 6 times. After the completion of separatory operation, the organic layer or ethyl acetate solution was concentrated, the concentrate was dissolved in 20 g of acetone, and the acetone solution was added dropwise to 400 g of water for precipitation. The acetal-modified polymer precipitate was collected by filtration, washed twice with 2 L of water, and dried at 40° C. over 24 hours, yielding 9 g of an acetal-modified polymer, designated Polymer N, having Mw=5,010 and Mw/Mn=1.40.

The organic solvents used in Tables 3 to 5 were propylene glycol monomethyl ether acetate (PGMEA), ethyl lactate (EL), and propylene glycol monomethyl ether (PGME). Each composition further contained 0.075 pbw of a surfactant PF-636 (Omnova Solutions, Inc.) relative to 80 pbw of the polymers.

TABLE 3

|  | Resin (pbw) | PAG (pbw) | Base (pbw) | Additive (pbw) | Solvent 1 (pbw) | Solvent 2 (pbw) | Solvent 3 (pbw) |
|---|---|---|---|---|---|---|---|
| Example 1 | Polymer K (80) | — | Polymer 1 (50) | — | PGMEA (1584) | EL (1584) | PGME (2112) |
| Example 2 | Polymer M (80) | — | Polymer 1 (50) | — | PGMEA (1584) | EL (1584) | PGME (2112) |
| Example 3 | Polymer M (80) | — | Polymer 1 (50) | Base-1 (0.1) | PGMEA (1584) | EL (1584) | PGME (2112) |
| Example 4 | Polymer M (80) | PAG-A (2) | Polymer 1 (50) | — | PGMEA (1584) | EL (1584) | PGME (2112) |
| Example 5 | Polymer M (80) | — | Polymer 2 (50) | — | PGMEA (1584) | EL (1584) | PGME (2112) |
| Example 6 | Polymer M (80) | — | Polymer 3 (50) | — | PGMEA (1584) | EL (1584) | PGME (2112) |
| Example 7 | Polymer N (80) | — | Polymer 1 (50) | — | PGMEA (1584) | EL (1584) | PGME (2112) |
| Example 8 | Polymer 4 (80) | — | — | — | PGMEA (1584) | EL (1584) | PGME (2112) |
| Example 9 | Polymer M (80) | — | Polymer 5 (50) | — | PGMEA (1584) | EL (1584) | PGME (2112) |
| Example 10 | Polymer M (80) | — | Polymer 6 (50) | — | PGMEA (1584) | EL (1584) | PGME (2112) |
| Example 11 | Polymer M (80) | — | Polymer 7 (50) | — | PGMEA (1584) | EL (1584) | PGME (2112) |
| Example 12 | Polymer M (80) | — | Polymer 8 (50) | — | PGMEA (1584) | EL (1584) | PGME (2112) |
| Example 13 | Polymer M (80) | — | Polymer 9 (50) | — | PGMEA (1584) | EL (1584) | PGME (2112) |
| Example 14 | Polymer M (80) | — | Polymer 10 (50) | — | PGMEA (1584) | EL (1584) | PGME (2112) |
| Example 15 | Polymer M (80) | — | Polymer 11 (50) | — | PGMEA (1584) | EL (1584) | PGME (2112) |
| Example 16 | Polymer M (80) | — | Polymer 12 (50) | — | PGMEA (1584) | EL (1584) | PGME (2112) |
| Example 17 | Polymer M (80) | — | Polymer 13 (50) | — | PGMEA (1584) | EL (1584) | PGME (2112) |
| Example 18 | Polymer M (80) | — | Polymer 14 (50) | — | PGMEA (1584) | EL (1584) | PGME (2112) |
| Example 19 | Polymer M (80) | — | Polymer 15 (50) | — | PGMEA (1584) | EL (1584) | PGME (2112) |
| Example 20 | Polymer K (80) | — | Polymer 16 (15) | — | PGMEA (1584) | EL (1584) | PGME (2112) |
| Example 21 | Polymer M (80) | — | Polymer 16 (15) | — | PGMEA (1584) | EL (1584) | PGME (2112) |
| Example 22 | Polymer N (80) | — | Polymer 16 (15) | — | PGMEA (1584) | EL (1584) | PGME (2112) |
| Example 23 | Polymer K (80) | — | Polymer 17 (7) | — | PGMEA (1584) | EL (1584) | PGME (2112) |
| Example 24 | Polymer M (80) | — | Polymer 17 (7) | — | PGMEA (1584) | EL (1584) | PGME (2112) |
| Example 25 | Polymer N (80) | — | Polymer 17 (7) | — | PGMEA (1584) | EL (1584) | PGME (2112) |

*pbw: parts by weight

TABLE 4

|  | Resin (pbw) | PAG (pbw) | Base (pbw) | Additive (pbw) | Solvent 1 (pbw) | Solvent 2 (pbw) | Solvent 3 (pbw) |
|---|---|---|---|---|---|---|---|
| Example 26 | Polymer K (80) | — | Polymer 18 (7) | — | PGMEA (1584) | EL (1584) | PGME (2112) |
| Example 27 | Polymer M (80) | — | Polymer 18 (7) | — | PGMEA (1584) | EL (1584) | PGME (2112) |

TABLE 4-continued

| | Resin (pbw) | PAG (pbw) | Base (pbw) | Additive (pbw) | Solvent 1 (pbw) | Solvent 2 (pbw) | Solvent 3 (pbw) |
|---|---|---|---|---|---|---|---|
| Example 28 | Polymer N (80) | — | Polymer 18 (7) | — | PGMEA (1584) | EL (1584) | PGME (2112) |
| Example 29 | Polymer K (80) | — | Polymer 19 (7) | — | PGMEA (1584) | EL (1584) | PGME (2112) |
| Example 30 | Polymer M (80) | — | Polymer 19 (7) | — | PGMEA (1584) | EL (1584) | PGME (2112) |
| Example 31 | Polymer N (80) | — | Polymer 19 (7) | — | PGMEA (1584) | EL (1584) | PGME (2112) |
| Example 32 | Polymer M (80) | — | Polymer 20 (7) | — | PGMEA (1584) | EL (1584) | PGME (2112) |
| Example 33 | Polymer M (80) | — | Polymer 21 (7) | — | PGMEA (1584) | EL (1584) | PGME (2112) |
| Example 34 | Polymer M (80) | — | Polymer 22 (7) | — | PGMEA (1584) | EL (1584) | PGME (2112) |
| Example 35 | Polymer M (80) | — | Polymer 23 (7) | — | PGMEA (1584) | EL (1584) | PGME (2112) |
| Example 36 | Polymer M (80) | — | Polymer 24 (7) | — | PGMEA (1584) | EL (1584) | PGME (2112) |
| Example 37 | Polymer M (80) | — | Polymer 25 (7)) | — | PGMEA (1584) | EL (1584) | PGME (2112) |
| Example 38 | Polymer M (80) | — | Polymer 26 (7) | — | PGMEA (1584) | EL (1584) | PGME (2112) |
| Example 39 | Polymer M (80) | — | Polymer 27 (7) | — | PGMEA (1584) | EL (1584) | PGME (2112) |
| Example 40 | Polymer M (80) | — | Polymer 28 (7) | — | PGMEA (1584) | EL (1584) | PGME (2112) |
| Example 41 | Polymer M (80) | — | Polymer 29 (7) | — | PGMEA (1584) | EL (1584) | PGME (2112) |
| Example 42 | Polymer M (80) | — | Polymer 30 (3) | — | PGMEA (1584) | EL (1584) | PGME (2112) |
| Example 43 | Polymer N (80) | — | Polymer 30 (3) | — | PGMEA (1584) | EL (1584) | PGME (2112) |
| Example 44 | Polymer K (80) | — | Polymer 31 (3) | — | PGMEA (1584) | EL (1584) | PGME (2112) |
| Example 45 | Polymer M (80) | — | Polymer 31 (3) | — | PGMEA (1584) | EL (1584) | PGME (2112) |
| Example 46 | Polymer N (80) | — | Polymer 31 (3) | — | PGMEA (1584) | EL (1584) | PGME (2112) |
| Example 47 | Polymer K (80) | — | Polymer 32 (1.5) | — | PGMEA (1584) | EL (1584) | PGME (2112) |
| Example 48 | Polymer M (80) | — | Polymer 32 (1.5) | — | PGMEA (1584) | EL (1584) | PGME (2112) |
| Example 49 | Polymer N (80) | — | Polymer 32 (1.5) | — | PGMEA (1584) | EL (1584) | PGME (2112) |
| Example 50 | Polymer K (80) | — | Polymer 33 (1.5) | — | PGMEA (1584) | EL (1584) | PGME (2112) |
| Example 51 | Polymer M (80) | — | Polymer 33 (1.5) | — | PGMEA (1584) | EL (1584) | PGME (2112) |

*pbw: parts by weight

TABLE 5

| | Resin (pbw) | PAG (pbw) | Base (pbw) | Additive (pbw) | Solvent 1 (pbw) | Solvent 2 (pbw) | Solvent 3 (pbw) |
|---|---|---|---|---|---|---|---|
| Example 52 | Polymer N (80) | | Polymer 33 (1.5) | — | PGMEA (1584) | EL (1584) | PGME (2112) |
| Example 53 | Polymer K (80) | | Polymer 34 (1.5) | — | PGMEA (1584) | EL (1584) | PGME (2112) |
| Example 54 | Polymer M (80) | | Polymer 34 (1.5) | — | PGMEA (1584) | EL (1584) | PGME (2112) |
| Example 55 | Polymer N (80) | | Polymer 34 (1.5) | — | PGMEA (1584) | EL (1584) | PGME (2112) |
| Example 56 | Polymer 1 (80) | Polymer P (8) | — | — | PGMEA (1584) | EL (1584) | PGME (2112) |
| Example 57 | Polymer 2 (80) | Polymer P (8) | — | — | PGMEA (1584) | EL (1584) | PGME (2112) |
| Example 58 | Polymer 1 (80) | Polymer Q (8) | — | — | PGMEA (1584) | EL (1584) | PGME (2112) |
| Example 59 | Polymer 2 (80) | Polymer Q (8) | — | — | PGMEA (1584) | EL (1584) | PGME (2112) |

TABLE 5-continued

| | Resin (pbw) | PAG (pbw) | Base (pbw) | Additive (pbw) | Solvent 1 (pbw) | Solvent 2 (pbw) | Solvent 3 (pbw) |
|---|---|---|---|---|---|---|---|
| Comparative Example 1 | Polymer K (80) | PAG-A (8) | Base-1 (0.54) | — | PGMEA (1584) | EL (1584) | PGME (2112) |
| Comparative Example 2 | Polymer M (80) | PAG-A (8) | Base-1 (0.54) | — | PGMEA (1584) | EL (1584) | PGME (2112) |

*pbw: parts by weight

Evaluation of EB Image Writing

Using a coater/developer system Clean Track ACT-M (Tokyo Electron Ltd.), each of the positive resist compositions was spin-coated onto a 152-mm square mask blank having a chromium oxynitride film at the outermost surface and pre-baked on a hot plate at 110° C. for 600 seconds to form a resist film of 60 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 110° C. for 600 seconds, and developed with a 2.38 wt % tetramethylammonium hydroxide aqueous solution, thereby yielding positive patterns.

The patterned wafer was observed under a top-down scanning electron microscope (TDSEM). The optimum exposure (Eop) was defined as the exposure dose ($\mu C/cm^2$) which provided a 1:1 resolution at the top and bottom of a 200-nm 1:1 line-and-space pattern. The maximum resolution of the resist was defined as the minimum line width of a line-and-space pattern that could be resolved and separated at the optimum exposure. The LER of a 100-nm line-and-space pattern was measured under SEM. On observation in cross section of the resist pattern under SEM, it was visually judged whether or not the pattern profile was rectangular. Tables 6 to 8 tabulate the test results of the inventive and comparative resist compositions on EB image writing.

TABLE 6

| | Eop ($\mu C/cm^2$) | Maximum resolution (nm) | LER (nm) | Pattern profile |
|---|---|---|---|---|
| Example 1 | 23 | 40 | 4.4 | rectangular |
| Example 2 | 23 | 40 | 4.5 | rectangular |
| Example 3 | 26 | 45 | 4.7 | rectangular |
| Example 4 | 20 | 40 | 4.2 | rectangular |
| Example 5 | 23 | 45 | 4.6 | rectangular |
| Example 6 | 25 | 40 | 4.5 | rectangular |
| Example 7 | 20 | 40 | 4.5 | rectangular |
| Example 8 | 24 | 40 | 4.7 | rectangular |
| Example 9 | 23 | 40 | 4.9 | rectangular |
| Example 10 | 22 | 45 | 4.2 | rectangular |
| Example 11 | 23 | 40 | 4.2 | rectangular |
| Example 12 | 23 | 40 | 4.2 | rectangular |
| Example 13 | 22 | 45 | 4.8 | rectangular |
| Example 14 | 23 | 40 | 4.6 | rectangular |
| Example 15 | 21 | 40 | 4.4 | rectangular |
| Example 16 | 23 | 40 | 4.7 | rectangular |
| Example 17 | 24 | 45 | 4.9 | rectangular |
| Example 18 | 22 | 40 | 4.7 | rectangular |
| Example 19 | 23 | 40 | 4.6 | rectangular |
| Example 20 | 22 | 40 | 4.4 | rectangular |
| Example 21 | 22 | 45 | 4.6 | rectangular |
| Example 22 | 20 | 40 | 4.5 | rectangular |
| Example 23 | 23 | 40 | 4.7 | rectangular |
| Example 24 | 24 | 40 | 4.5 | rectangular |
| Example 25 | 20 | 40 | 4.5 | rectangular |

TABLE 7

| | Eop ($\mu C/cm^2$) | Maximum resolution (nm) | LER (nm) | Pattern profile |
|---|---|---|---|---|
| Example 26 | 23 | 40 | 4.7 | rectangular |
| Example 27 | 22 | 45 | 4.8 | rectangular |
| Example 28 | 20 | 40 | 4.5 | rectangular |
| Example 29 | 22 | 40 | 4.6 | rectangular |
| Example 30 | 22 | 40 | 4.6 | rectangular |
| Example 31 | 20 | 40 | 4.5 | rectangular |
| Example 32 | 23 | 40 | 4.4 | rectangular |
| Example 33 | 23 | 45 | 4.6 | rectangular |
| Example 34 | 24 | 45 | 4.3 | rectangular |
| Example 35 | 23 | 40 | 4.6 | rectangular |
| Example 36 | 23 | 40 | 4.8 | rectangular |
| Example 37 | 22 | 40 | 4.6 | rectangular |
| Example 38 | 21 | 40 | 4.7 | rectangular |
| Example 39 | 22 | 45 | 4.7 | rectangular |
| Example 40 | 24 | 45 | 4.6 | rectangular |
| Example 41 | 22 | 40 | 4.4 | rectangular |
| Example 42 | 22 | 40 | 4.3 | rectangular |
| Example 43 | 20 | 40 | 4.5 | rectangular |
| Example 44 | 21 | 40 | 4.6 | rectangular |
| Example 45 | 23 | 45 | 4.4 | rectangular |
| Example 46 | 20 | 40 | 4.5 | rectangular |
| Example 47 | 23 | 40 | 4.6 | rectangular |
| Example 48 | 21 | 40 | 4.5 | rectangular |
| Example 49 | 20 | 40 | 4.5 | rectangular |
| Example 50 | 23 | 45 | 4.6 | rectangular |
| Example 51 | 25 | 45 | 4.6 | rectangular |

TABLE 8

| | Eop ($\mu C/cm^2$) | Maximum resolution (nm) | LER (nm) | Pattern profile |
|---|---|---|---|---|
| Example 52 | 20 | 40 | 4.5 | rectangular |
| Example 53 | 24 | 40 | 4.4 | rectangular |
| Example 54 | 25 | 40 | 4.5 | rectangular |
| Example 55 | 20 | 40 | 4.5 | rectangular |
| Example 56 | 23 | 45 | 4.5 | rectangular |
| Example 57 | 25 | 45 | 4.7 | rectangular |
| Example 58 | 24 | 40 | 4.6 | rectangular |
| Example 59 | 23 | 40 | 4.4 | rectangular |
| Comparative Example 1 | 25 | 60 | 5.8 | rounded top |
| Comparative Example 2 | 24 | 60 | 5.7 | rounded top |

It is evident from Tables 6 to 8 that the resist compositions of Examples are improved in resolution and LER over those of Comparative Examples 1 and 2 when processed by EB lithography. The chemically amplified positive resist composition of the invention is suited as ultrafine pattern-forming material for VLSI fabrication and mask pattern-forming material by EB lithography.

Japanese Patent Application No. 2010-031034 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising a polymer PB and a polymer PA, said polymer PB comprising recurring units of the general formulae (1) and (2):

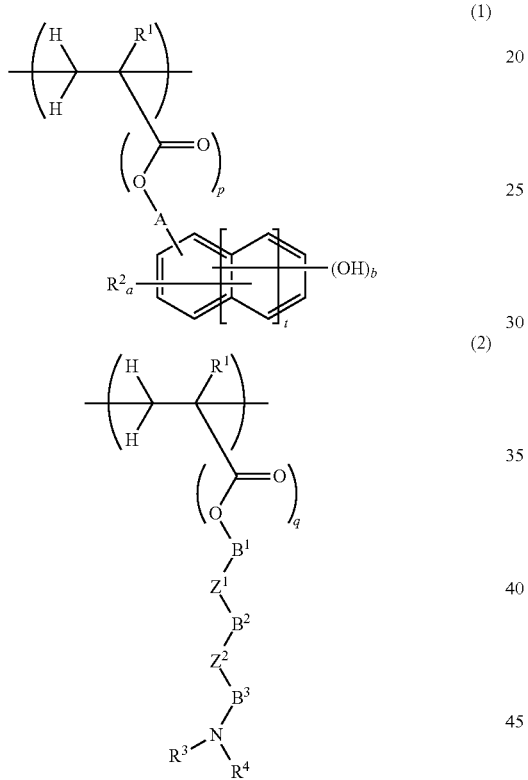

wherein A is a single bond or a $C_1$-$C_{10}$ alkylene group which may be separated by an ethereal oxygen atom, $R^1$ is each independently hydrogen or methyl, $R^2$ is each independently a $C_1$-$C_6$ alkyl group, $B^1$, $B^2$, and $B^3$ are each independently a single bond, or a linkage selected from the group consisting of a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing, $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—, $R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring, $B^3$ may bond with $R^3$ or $R^4$ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring, a is an integer of 0 to 4, b is a positive integer of 1 to 5, p and q are each independently 0 or 1, t is an integer of 0 to 2, with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group, said polymer PA comprising recurring units having an acidic side chain protected with an acid labile protective group and recurring units of the general formula (3):

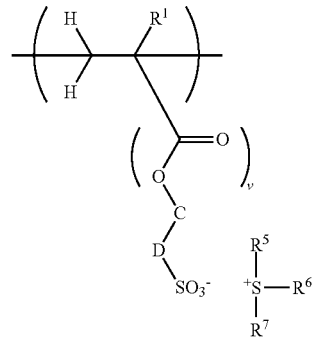

wherein C is a single bond or a substituted or unsubstituted $C_6$-$C_{18}$ arylene group, D is a single bond or a divalent $C_1$-$C_{15}$ hydrocarbon group in which some or all hydrogen atoms may be substituted by fluorine atoms or any methylene moiety may be substituted by an ethereal oxygen atom or carbonyloxy radical, $R^1$ is as defined above, $R^5$, $R^6$ and $R^7$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, any two of $R^5$, $R^6$ and $R^7$ may bond together to form a ring with the sulfur atom, and v is 0 or 1, with the proviso that when v=0, C and D are not single bonds at the same time, said polymer PB further comprising units of at least one type selected from the general formulae (5) and (6):

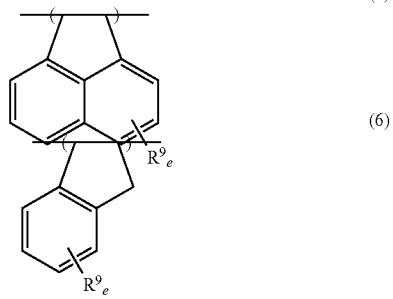

wherein e is an integer of 0 to 4, and $R^9$ is each independently a hydroxyl group, a hydroxyl group protected with an acid labile group, halogen atom, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group.

2. The resist composition of claim 1 wherein said polymer PB further comprises units having the general formula (4):

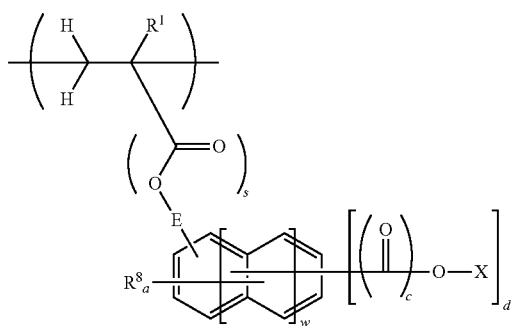

(4)

wherein E is a single bond or a $C_1$-$C_{10}$ alkylene group which may contain an ethereal oxygen atom, $R^1$ is hydrogen or methyl, $R^8$ is each independently a $C_1$-$C_6$ alkyl group, X is an acid labile group when d is 1, and X is hydrogen or an acid labile group when d is 2 or 3, with at least one X being an acid labile group, a is an integer of 0 to 4, c is 0 or 1, d is an integer of 1 to 3, s is 0 or 1, and w is an integer of 0 to 2.

3. A pattern forming process comprising the steps of:
applying the positive resist composition of claim 1 onto a processable substrate to form a resist film,
exposing the film patternwise to high-energy radiation, and
developing the exposed film with an alkaline developer to form a resist pattern.

4. The process of claim 3 wherein the high-energy radiation is EUV or electron beam.

5. The process of claim 3 wherein the processable substrate is a photomask blank.

* * * * *